United States Patent
Chai et al.

(10) Patent No.: US 12,217,686 B2
(45) Date of Patent: Feb. 4, 2025

(54) PIXEL AND ORGANIC LIGHT EMITTING DISPLAY DEVICE HAVING THE PIXEL

(71) Applicant: Samsung Display Co., Ltd., Yongin-si (KR)

(72) Inventors: Chong Chul Chai, Yongin-si (KR); Dong Woo Kim, Yongin-si (KR); Kyoung Ju Shin, Yongin-si (KR); Bo Yong Chung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/473,549

(22) Filed: Sep. 25, 2023

(65) Prior Publication Data

US 2024/0013722 A1  Jan. 11, 2024

Related U.S. Application Data

(60) Continuation of application No. 17/318,564, filed on May 12, 2021, now Pat. No. 11,769,451, which is a
(Continued)

(30) Foreign Application Priority Data

Dec. 1, 2016  (KR) .................. 10-2016-0162995

(51) Int. Cl.
*G09G 3/3233* (2016.01)
*G09G 3/3258* (2016.01)
(Continued)

(52) U.S. Cl.
CPC ......... *G09G 3/3233* (2013.01); *G09G 3/3258* (2013.01); *G09G 3/3266* (2013.01);
(Continued)

(58) Field of Classification Search
CPC .. G09G 3/3233; G09G 3/3225; G09G 3/3648; G09G 3/3258; G09G 3/3266;
(Continued)

(56) References Cited

U.S. PATENT DOCUMENTS 9,384,692 B2  7/2016  Choi
9,490,276 B2  11/2016  Kim et al.
(Continued)

FOREIGN PATENT DOCUMENTS

CN  102346999  2/2012
CN  105679247  6/2016
(Continued)

OTHER PUBLICATIONS

Chinese Office Action for Chinese Patent Application or Patent No. 201711193768.5 mailed Jul. 20, 2021.
(Continued)

*Primary Examiner* — Xuemei Zheng
(74) *Attorney, Agent, or Firm* — KILE PARK REED & HOUTTEMAN PLLC

(57) ABSTRACT

A pixel includes a plurality of transistors, a storage capacitor, and an organic light emitting diode. A first transistor controls the amount of current from a first driving power source to the organic light emitting diode based on a data voltage. A second transistor is connected to a data line and is turned on based on a scan signal. A third transistor coupled to the first transistor and is turned on based on the scan signal. A first stabilizing transistor is coupled to the third transistor or between the first and third transistors and is turned off when the third transistor is turned off.

18 Claims, 48 Drawing Sheets

Related U.S. Application Data continuation of application No. 16/709,234, filed on Dec. 10, 2019, now Pat. No. 11,024,227, which is a division of application No. 15/811,922, filed on Nov. 14, 2017, now Pat. No. 10,529,283.

(51) Int. Cl.

| | | |
|---|---|---|
| *H01L 27/12* | (2006.01) | |
| *H01L 29/786* | (2006.01) | |
| *G09G 3/3266* | (2016.01) | |
| *G09G 3/3275* | (2016.01) | |
| *G09G 3/36* | (2006.01) | |

(52) U.S. Cl.
CPC ......... *G09G 3/3275* (2013.01); *G09G 3/3648* (2013.01); *G09G 2300/0426* (2013.01); *G09G 2300/0819* (2013.01); *G09G 2300/0852* (2013.01); *G09G 2310/0216* (2013.01); *G09G 2310/08* (2013.01); *G09G 2320/0214* (2013.01); *G09G 2320/045* (2013.01); *G09G 2320/0626* (2013.01); *G09G 2330/023* (2013.01); *H01L 27/1225* (2013.01); *H01L 29/78672* (2013.01); *H01L 29/7869* (2013.01)

(58) Field of Classification Search
CPC ......... G09G 3/3275; G09G 2300/0852; G09G 2320/0214; G09G 2320/045; G09G 2320/0626; G09G 2310/0216; H01L 29/78672; H01L 29/7869; H01L 27/1225
See application file for complete search history.

(56) References Cited

U.S. PATENT DOCUMENTS

| | | |
|---|---|---|
| 10,453,385 B2 | 10/2019 | Yang et al. |
| 2010/0182223 A1 | 7/2010 | Choi et al. |
| 2011/0141160 A1 | 6/2011 | Nathan et al. |
| 2012/0105420 A1 | 5/2012 | Choi |
| 2014/0118232 A1 | 5/2014 | Kim |
| 2014/0210867 A1* | 7/2014 | Kwon .................. G09G 3/3233 257/40 |
| 2014/0232623 A1 | 8/2014 | Nathan et al. |
| 2015/0154941 A1 | 6/2015 | Kanda et al. |
| 2016/0351122 A1* | 12/2016 | Jung .................... G09G 3/3233 |
| 2016/0351124 A1 | 12/2016 | Kim et al. |
| 2017/0140724 A1* | 5/2017 | Lin ...................... G09G 3/3233 |
| 2017/0162113 A1 | 6/2017 | Lin et al. |
| 2018/0166516 A1 | 6/2018 | Chai et al. |

FOREIGN PATENT DOCUMENTS

| | | |
|---|---|---|
| KR | 10-2014-0028921 | 3/2014 |
| KR | 10-2014-0081262 | 7/2014 |
| KR | 10-2015-0100516 | 9/2015 |
| WO | 2015/196730 | 12/2015 |
| WO | 2016/045590 | 3/2016 |

OTHER PUBLICATIONS

Notice of Allowance with English translation for Korean Patent Application No. 10- 2016-0162995, dated Mar. 22, 2023.

\* cited by examiner

PIXEL AND ORGANIC LIGHT EMITTING DISPLAY DEVICE HAVING THE PIXEL

CROSS-REFERENCE TO RELATED APPLICATION(S)

This is a continuation application of U.S. patent application Ser. No. 17/318,564, filed May 12, 2021, now U.S. Pat. No. 11,769,451, the disclosure of which is incorporated herein by reference in its entirety. U.S. patent application Ser. No. 17/318,564 is a continuation application of U.S. patent application Ser. No. 16/709,234, filed Dec. 10, 2019, now U.S. Pat. No. 11,024,227, issued Jun. 1, 2021, the disclosure of which is incorporated herein by reference in its entirety. U.S. patent application Ser. No. 16/709,234 is a divisional application of U.S. patent application Ser. No. 15/811,922, filed Nov. 14, 2017, now U.S. Pat. No. 10,529,283, issued Jan. 7, 2020, the disclosure of which is incorporated herein by reference in its entirety. U.S. patent application Ser. No. 15/811,922 claims priority benefit of Korean Patent Application No. 10-2016-0162995, filed Dec. 1, 2016, in the Korean Intellectual Property Office, the disclosure of which is incorporated herein by reference in its entirety for all purposes.

BACKGROUND

1. Field

One or more embodiments described herein relate to organic light emitting display device and pixel in such a device.

2. Description of the Related Art

A variety of displays have been developed. Examples include liquid crystal displays and organic light emitting displays. An organic light emitting display generates images based on light emitted from pixels that include organic light emitting diodes. Organic light emitting displays have high response speed and low power consumption.

In an organic light emitting display, data lines and scan lines carry signals for driving the pixels. The pixels have driving transistors that control the amounts of current flowing through corresponding organic light emitting diodes. Specifically, each driving transistor controls the amount of current flowing from a first driving power source to a second driving power source, via the organic light emitting diode, based on a data signal. Light is emitted with a predetermined luminance corresponding to the amount of current from the driving transistor.

Various methods have been proposed to control luminance in an organic light-emitting display. One method involves setting the second driving power source to a low voltage. Another method involves reducing power consumption by driving the display at a low frequency. However, these methods have drawbacks, e.g., predetermined leakage current may be generated from the gate electrodes of the pixel driving transistors. As a result, voltages of the data signals are not maintained during one frame period, which, in turn, adversely affects luminance.

SUMMARY

In accordance with one or more embodiments, a pixel includes an organic light emitting diode; a first transistor coupled between a first driving power source coupled to a first node and an anode electrode of the organic light emitting diode, the first transistor to control the amount of current from the first driving power source to the organic light emitting diode based on a voltage of a second node; a second transistor coupled between a data line and the first node, the second transistor to be turned on when a first scan signal is supplied to an ith (i is a natural number) first scan line; a third transistor coupled between a second electrode of the first transistor and the second node, the third transistor to be turned on when the first scan signal is supplied; a storage capacitor coupled between the first driving power source and the second node; and a first stabilizing transistor coupled between the third transistor and the second node or between the second electrode of the first transistor and the third transistor, the first stabilizing transistor to be set to a turn-off state during a portion of a period in which the third transistor is turned off. The first transistor, second transistor, and third transistor may be P-type poly-silicon semiconductor transistors. The first stabilizing transistor may be an N-type oxide semiconductor transistor.

A gate electrode of the first stabilizing transistor may be coupled to a control power source, the control power source may be set to a gate-on voltage during a period in which the pixel is driven at a first driving frequency and to a gate-off voltage during a portion of a period in which the pixel is driven at a second driving frequency lower than the first driving frequency. When the pixel is driven at the second driving frequency, the control power source may be set to the gate-off voltage after a voltage of a data signal is stored in the storage capacitor.

The pixel may include a sixth transistor coupled between the first node and the first driving power source, the sixth transistor to be turned off when a light emitting control signal is supplied to an ith light emitting control line and turned on at a time when the light emitting control signal is not supplied to the ith light emitting control line; and a seventh transistor coupled between the second electrode of the first transistor and the anode electrode of the organic light emitting diode, the seventh transistor to be turned on or turned off simultaneously with the sixth transistor, wherein the light emitting control signal supplied to the ith light emitting control line is set to a wider width than the first scan signal and is supplied to overlap the first scan signal. The gate electrode of the first stabilizing transistor may be coupled to the ith light emitting control line.

The pixel may include a fourth transistor coupled between the second node and a first power source, the fourth transistor to be turned on when a second scan signal is supplied to an ith second scan line; and a second stabilizing transistor coupled between the second node and the fourth transistor or between the fourth transistor and the first power source, the second stabilizing transistor to be set to the turn-off state during a portion of a period in which the fourth transistor is turned off. The first power source may be set to a lower voltage than the data signal supplied to the data line. The second stabilizing transistor may be an N-type oxide semiconductor transistor.

A gate electrode of the second stabilizing transistor may be coupled to a control power source, and the control power source may be set to a gate-on voltage during a period in which the pixel is driven at a first driving frequency and set to a gate-off voltage during a portion of a period in which the pixel is driven at a second driving frequency lower than the first driving frequency. When the pixel is driven at the second driving frequency, the control power source may be set to the gate-off voltage after a voltage of a data signal is stored in the storage capacitor.

The pixel may include a sixth transistor coupled between the first node and the first driving power source, the sixth transistor to be turned off when a light emitting control signal is supplied to an ith light emitting control line and turned on otherwise; and a seventh transistor coupled between the second electrode of the first transistor and the anode electrode of the organic light emitting diode, the seventh transistor to be turned on or turned off simultaneously with the sixth transistor, wherein the light emitting control signal supplied to the ith light emitting control line is set to a wider width than the first scan signal and is supplied to overlap the first scan signal. The gate electrode of the second stabilizing transistor may be coupled to the ith light emitting control line. The ith second scan line may be set as an (i−1)th first scan line.

The pixel may include a fifth transistor coupled between the anode electrode of the organic light emitting diode and a first power source, the fifth transistor to be turned on when a third scan signal is supplied to an ith third scan line; and a third stabilizing transistor coupled between the anode electrode of the organic light emitting diode and the fifth transistor or between the fifth transistor and the first power source, the third stabilizing transistor to be set to a turn-off state during a portion of a period in which the fifth transistor is turned off. The third stabilizing transistor may be an N-type oxide semiconductor transistor.

A gate electrode of the third stabilizing transistor may be coupled to a control power source, the control power source may be set to a gate-on voltage during a period in which the pixel is driven at a first driving frequency and to a gate-off voltage during a portion of a period in which the pixel is driven at a second driving frequency lower than the first driving frequency. When the pixel is driven at the second driving frequency, the control power source may be set to the gate-off voltage after a voltage of a data signal is stored in the storage capacitor.

The pixel may include a sixth transistor coupled between the first node and the first driving power source, the sixth transistor to be turned off when a light emitting control signal is supplied to an ith light emitting control line and turned on otherwise; and a seventh transistor coupled between the second electrode of the first transistor and the anode electrode of the organic light emitting diode, the seventh transistor to be turned on or turned off simultaneously with the sixth transistor, wherein the light emitting control signal supplied to the ith light emitting control line is set to a wider width than the first scan signal and is supplied to overlap the first scan signal. The gate electrode of the third stabilizing transistor may be coupled to the ith light emitting control line. The ith third scan line may be set as the ith first scan line.

In accordance with one or more other embodiments, a pixel includes an organic light emitting diode; a first transistor to control an amount of current flowing from a first driving power source to a second driving power source, via the organic light emitting diode, based on a voltage of a first node; a second transistor coupled between a data line and the first node, the second transistor to be turned on when a scan signal is supplied to a scan line; a storage capacitor coupled between the first node and a second electrode of the first transistor; and a stabilizing transistor coupled between the data line and the second transistor or between the second transistor and the first node, wherein the first transistor and the second transistor are N-type poly-silicon semiconductor transistors and the stabilizing transistor is an N-type oxide semiconductor transistor.

A gate electrode of the stabilizing transistor may be coupled to a control power source, the control power source may be set to a gate-on voltage during a period in which the pixel is driven at a first driving frequency and set to a gate-off voltage during a portion of a period in which the pixel is driven at a second driving frequency lower than the first driving frequency.

When the pixel is driven at the second driving frequency, the control power source may be set to the gate-off voltage after a voltage of a data signal is stored in the storage capacitor. The gate electrode of the stabilizing transistor may be coupled to the scan line. The pixel may include a third transistor coupled between the first driving power source and a first electrode of the first transistor, the third transistor having a turn-on period not overlapping the second transistor.

In accordance with one or more other embodiments, a pixel includes an organic light emitting diode; a first transistor to control an amount of current flowing from a first driving power source to a second driving power source, via the organic light emitting diode, based on a voltage of a first node; a second transistor coupled between a data line and a second node, the second transistor to be turned on when a scan signal is supplied to a scan line; a third transistor coupled between the second node and a second electrode of the first transistor, the third transistor to be turned off when a light emitting control signal is supplied to an (i−1)th light emitting control line; a fourth transistor coupled between the first node and a first electrode of the first transistor, the fourth transistor to be turned on when the scan signal is supplied; a storage capacitor coupled between the first node and the second node; and a first stabilizing transistor coupled between the first node and the fourth transistor or between the fourth transistor and the first electrode of the first transistor, wherein the first to fourth transistors are N-type poly-silicon semiconductor transistors and the first stabilizing transistor is an N-type oxide semiconductor transistor.

A gate electrode of the first stabilizing transistor may be coupled to a control power source, and the control power source may be set to a gate-on voltage during a period in which the pixel is driven at a first driving frequency, and set to a gate-off voltage during a portion of a period in which the pixel is driven at a second driving frequency lower than the first driving frequency.

When the pixel is driven at the second driving frequency, the control power source may be set to the gate-off voltage after a voltage of the data signal is stored in the storage capacitor. The gate electrode of the first stabilizing transistor may be coupled to the scan line. The pixel may include a second stabilizing transistor coupled between the data line and the second transistor or between the second transistor and the second node. The second stabilizing transistor may be an N-type oxide semiconductor transistor.

A gate electrode of the second stabilizing transistor is coupled to a control power source, and the control power source is set to a gate-on voltage during a period in which the pixel is driven at a first driving frequency and set to a gate-off voltage during a portion of a period in which the pixel is driven at a second driving frequency lower than the first driving frequency. When the pixel is driven at the second driving frequency, the control power source may be set to the gate-off voltage after a voltage of a data signal is stored in the storage capacitor. The gate electrode of the second stabilizing transistor may be coupled to the scan line.

The pixel may include a fifth transistor coupled between a first power source and an anode electrode of the organic light emitting diode, the fifth transistor having a gate electrode coupled to the scan line; and a sixth transistor coupled between the first driving power source and the first electrode of the first transistor, the sixth transistor having a gate electrode coupled to an ith light emitting control line.

In accordance with one or more other embodiments, a pixel includes an organic light emitting diode; a first transistor to control an amount of current flowing from a first driving power source to a second driving power source, via the organic light emitting diode, based on a voltage of a first node; a second transistor coupled between a first power source and an anode electrode of the organic light emitting diode, the second transistor to be turned on when a second scan signal is supplied to a second scan line; a third transistor coupled between the first node and a second electrode of the first transistor, the third transistor to be turned on when a first scan signal is supplied to a first scan line; a storage capacitor coupled between the first power source and the first node; and a first stabilizing transistor coupled between the first node and the third transistor or between the third transistor and the second electrode of the—first transistor, wherein the first to third transistors are N-type poly-silicon semiconductor transistors and the first stabilizing transistor is an N-type oxide semiconductor transistor.

A gate electrode of the first stabilizing transistor is coupled to a control power source, and the control power source may be set to a gate-on voltage during a period in which the pixel is driven at a first driving frequency and set to a gate-off voltage during a portion of a period in which the pixel is driven at a second driving frequency lower than the first driving frequency.

When the pixel is driven at the second driving frequency, the control power source may be set to the gate-off voltage after a voltage of a data signal is stored in the storage capacitor. The gate electrode of the first stabilizing transistor may be coupled to the first scan line. The pixel may include an second stabilizing transistor coupled between the second transistor and the anode electrode of the organic light emitting diode or between the first power source and the second transistor. The second stabilizing transistor may be an N-type oxide semiconductor transistor.

A gate electrode of the second stabilizing transistor may be coupled to a control power source, and the control power source may be set to a gate-on voltage during a period in which the pixel is driven at a first driving frequency and set to a gate-off voltage during a portion of a period in which the pixel is driven at a second driving frequency lower than the first driving frequency.

When the pixel is driven at the second driving frequency, the control power source may be set to the gate-off voltage after a voltage of a data signal is stored in the storage capacitor. The gate electrode of the second stabilizing transistor may be coupled to the second scan line. The pixel may include a first capacitor coupled between a data line and the second electrode of the first transistor.

In accordance with one or more other embodiments, a pixel includes at least one first transistor on a current path along which current is to flow from a first driving power source to a second driving power source via an organic light emitting diode; and two or more second transistors on a current leakage path except the current path, wherein each of the second transistors includes: a poly-silicon semiconductor transistor coupled to a predetermined signal line, the poly-silicon semiconductor transistor to be turned on or turned off based on a signal of the signal line; and an oxide semiconductor transistor coupled to the poly-silicon semiconductor transistor. The oxide semiconductor transistor may be set to a turn-on state during a period in which the poly-silicon semiconductor transistor is turned on. The oxide semiconductor transistor may be set to a turn-off state during a portion of a period when the poly-silicon semiconductor transistor is turned off. The poly-silicon semiconductor transistor may be a P-type or N-type transistor, and the oxide semiconductor transistor may be an N-type transistor.

In accordance with one or more other embodiments, an organic light emitting display device includes a plurality of pixels coupled to scan lines and data lines, wherein each of the pixels includes: at least one first transistor on a current path along which current flows from a first driving power source to a second driving power source via an organic light emitting diode; and two or more second transistors on a current leakage path except the current path, wherein each of the second transistors includes: a poly-silicon semiconductor transistor coupled to a predetermined signal line, the poly-silicon semiconductor transistor to be turned on or turned off corresponding to a signal of the signal line; and an oxide semiconductor transistor coupled to the poly-silicon semiconductor transistor. The oxide semiconductor transistor may be set to a turn-on state during a period in which the poly-silicon semiconductor transistor is turned on.

The oxide semiconductor transistor may be set to a turn-off state during a portion of a period in which the poly-silicon semiconductor transistor is turned off. The poly-silicon semiconductor transistor may be a P-type or N-type transistor. The oxide semiconductor transistor may be an N-type transistor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
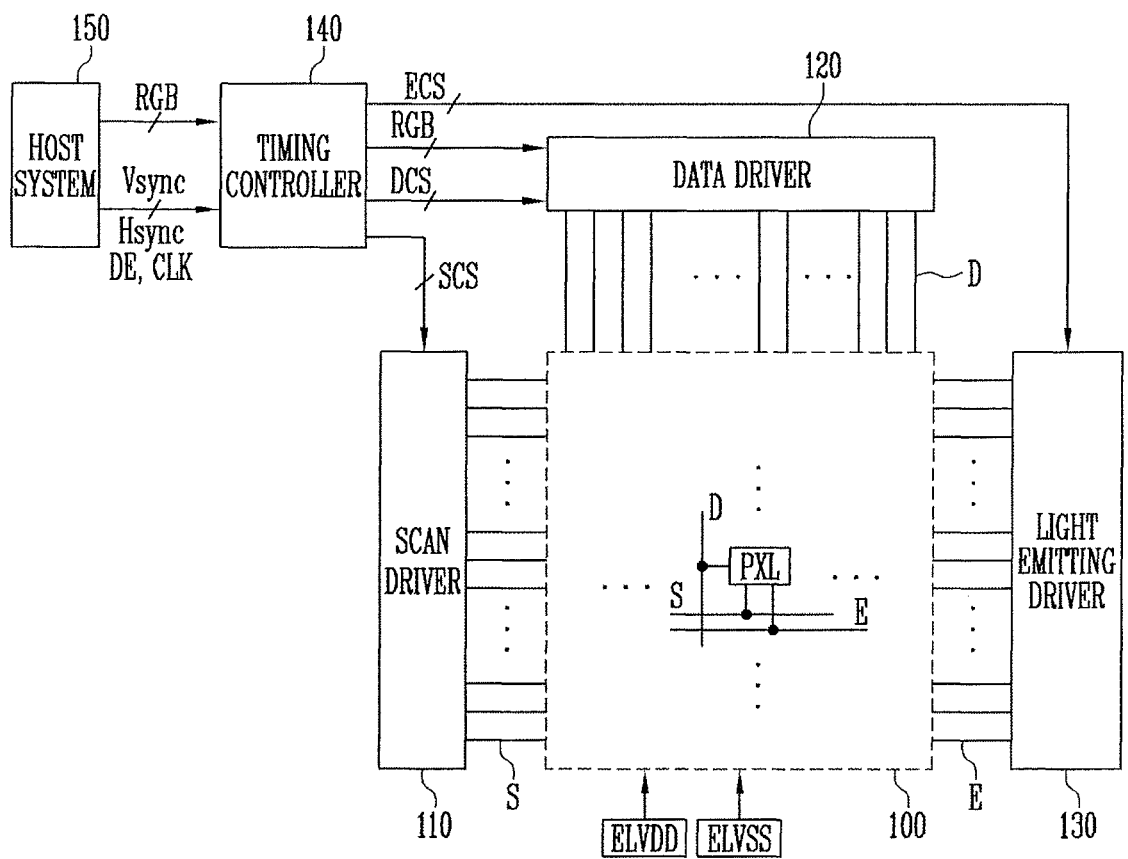
FIG. 1 illustrates an embodiment of an organic light emitting display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of an organic light emitting display device which includes a pixel unit 100, a scan driver 110, a data driver 120, a light emitting driver 130, a timing controller 140, and a host system 150. The host system 150 supplies image data RGB to the timing controller 140 through a predetermined interface, and may supply timing signals Vsync, Hsync, DE, and CLK to the timing controller 140.

The timing controller 140 generates a scan driving control signal SCS, a data driving control signal DCS, and a light emitting driving control signal ECS, based on the image data RGB and the timing signals such as a vertical synchronization signal Vsync, a horizontal synchronization signal Hsync, a data enable signal DE, and a clock signal CLK, which are supplied from the host system 150. The scan driving control signal SCS generated by the timing controller 140 is supplied to the scan driver 110, the data driving control signal DCS generated by the timing controller 140 is supplied to the data driver 120, and the light emitting driving control signal ECS generated by the timing controller 140 is supplied to the light emitting driver 130. In addition, the timing controller 140 realigns data RGB supplied from an external source and supplies the realigned data RGB to the data driver 120.

The scan driving control signal SCS includes a scan start pulse and clock signals. The scan start pulse controls a first timing of a scan signal. The clock signals are used to shift the scan start pulse.

The data driving control signal DCS includes a source start pulse and clock signals. The source start pulse controls a sampling start time of data. The clock signals are used to control a sampling operation.

The light emitting driving control signal ECS includes a light emitting start pulse and clock signals. The light emitting start pulse controls a first timing of a light emitting control signal. The clock signals are used to shift the light emitting start pulse.

The scan driver 110 supplies a scan signal to scan lines S based on the scan driving control signal SCS. For example, the scan driver 110 may sequentially supply the scan signal to the scan lines S. If the scan signal is sequentially supplied to the scan lines S, pixels PXL are selected in units of horizontal lines. The scan signal is set to a gate-on voltage such that transistors in the pixels PXL can be turned on.

The data driver 120 supplies a data signal to data lines D based on the data driving control signal DCS. The data signal supplied to the data lines D is supplied to the selected pixels PXL by the scan line. The data driver 120 may supply the data signal to the data lines D to be synchronized with the scan signal.

The light emitting driver 130 supplies a light emitting control signal to light emitting control lines E based on the light emitting driving control signal ECS. For example, the light emitting driver 130 may sequentially supply the light emitting control signal to the light emitting control lines E. If the light emitting control signal is sequentially supplied to the light emitting control lines E, the pixels PXL do not emit light in units of horizontal lines. The light emitting control signal is set to a gate-off voltage such that the transistors in the pixels PXL can be turned off.

Additionally, a light emitting control signal supplied to an ith (i is a natural number) light emitting control line Ei may overlap a scan signal supplied to an ith scan line Si. Then, pixels PXL on an ith horizontal line are set to a non-light emitting state during a period in which a data signal is supplied to pixels PXL on the ith horizontal line. Thus, undesired light may be prevented from being emitted from the pixels PXL.

In FIG. 1, the scan driver 110 and the light emitting driver 130 are illustrated as separate drivers. In one embodiment, the scan driver 100 and the light emitting driver 130 may be in one driver. In addition, the scan driver 110 and/or the light emitting driver 130 may be located at different sides with the pixel unit 100 therebetween.

The pixel unit 100 includes pixels PXL coupled to the data lines D, the scan lines S, and the light emitting control lines E. The pixels PXL are supplied with a first driving power source ELVDD and a second driving power source ELVSS from outside.

Each of the pixels PXL is selected, when a scan signal is supplied to a scan line S coupled thereto, in order to receive a data signal from a data line D. The pixel PXL supplied with the data signal controls an amount of current flowing from the first driving power source ELVDD to the second driving power source ELVSS, via an organic light emitting diode, based on the data signal. At this time, the organic light emitting diode generates light with a predetermined luminance corresponding to the amount of current.

In FIG. 1, each pixel PXL is coupled to one scan line S, one data line D, and one light emitting control line E. In one embodiment, the signal lines S, D, and E coupled to the pixel PXL may be variously set corresponding to pixel structures of the pixel PXL.

Figure 2A:
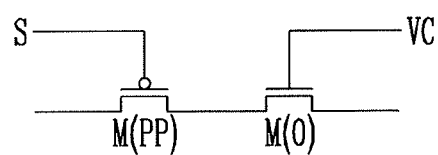
FIGS. 2A and 2B illustrate examples of a coupling between transistors.
Figure 2B:
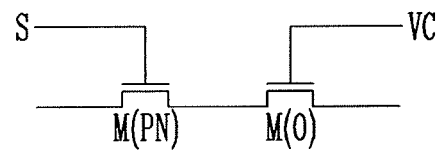

FIGS. 2A and 2B illustrates embodiments of coupling relationships between transistors for reducing or minimizing leakage current. Transistors in FIGS. 2A and 2B are in a pixel PXL and represent transistors located on a leakage path.

Referring to FIG. 2A, according to an embodiment, an oxide semiconductor transistor M(O) and a poly-silicon semiconductor transistor M(PP) are formed on a current leakage path of the pixel PXL. The oxide semiconductor transistor M(O) includes a gate electrode, a source electrode, and a drain electrode, and has an active layer formed of an oxide semiconductor. The oxide semiconductor may be set as an amorphous or crystalline semiconductor. The oxide semiconductor transistor M(O) may be formed as an N-type transistor. The oxide semiconductor transistor M(O) may be formed through a low temperature process and has a lower charge mobility than the poly-silicon semiconductor transistor M(PP). The oxide semiconductor transistor M(O) has excellent off-current characteristics.

The poly-silicon semiconductor transistor M(PP) includes a gate electrode, a source electrode, and a drain electrode, and has an active layer formed of poly-silicon. For example, the poly-silicon semiconductor transistor M(PP) may be set as a low temperature poly-silicon (LTPS) transistor. The poly-silicon semiconductor transistor M(PP) may be a P-type transistor. The poly-silicon semiconductor transistor M(PP) has a high electron mobility, and accordingly, has fast driving characteristics.

The poly-silicon semiconductor transistor M(PP) is one of leakage paths of the pixel PXL. In addition, the gate electrode of the poly-silicon semiconductor transistor M(PP) may be connected to any one of signal lines supplied to the pixel PXL, e.g., a scan line S. The poly-silicon semiconductor transistor M(PP) is turned on when a scan signal is supplied to the scan line S and performs a predetermined function corresponding to a coupled position thereof.

The oxide semiconductor transistor M(O) is coupled to the poly-silicon semiconductor transistor M(PP). In addition, the gate electrode of the oxide semiconductor transistor M(O) is coupled to a control power source VC. The oxide semiconductor transistor M(O) maintains a turn-on state during a period (i.e., a turn-on period) in which the poly-silicon semiconductor transistor M(PP) is driven. If the oxide semiconductor transistor M(O) maintains the turn-on state during the period in which the poly-silicon semiconductor transistor M(PP) is driven, it is possible to ensure fast driving characteristics of the poly-silicon semiconductor transistor M(PP).

Additionally, the oxide semiconductor transistor M(O) may be set to a turn-off state during at least a portion of a period in which the poly-silicon semiconductor transistor M(PP) is turned off. If the oxide semiconductor transistor M(O) is turned off, it is possible to reduce or minimize leakage current flowing in the leakage path.

In one embodiment, the oxide semiconductor transistor M(O) and the poly-silicon semiconductor transistor M(PP) may be on the leakage path of the pixel PXL, and leakage current flowing on the leakage path is reduced or minimized with the oxide semiconductor transistor M(O). When the leakage current flowing on the leakage current is reduced or minimized, an image with a desired luminance may be displayed in the pixel PXL. The oxide semiconductor transistor M(O) and the poly-silicon semiconductor transistor M(PP), which are shown in FIG. 2A, may be applied to various pixels PXL including P-type transistors.

Referring to FIG. 2B, according to an embodiment, an oxide semiconductor transistor M(O) and a poly-silicon semiconductor transistor M(PN) are on the current leakage path of the pixel PXL. The oxide semiconductor transistor M(O) includes a gate electrode, a source electrode, and a drain electrode, and has an active layer of an oxide semiconductor. The oxide semiconductor may be set as an amorphous or crystalline semiconductor. The oxide semiconductor transistor M(O) may be an N-type transistor.

The oxide semiconductor transistor M(O) may be formed through a low temperature process and has a lower charge mobility than the poly-silicon semiconductor transistor M(PP). The oxide semiconductor transistor M(O) has excellent off-current characteristics.

The poly-silicon semiconductor transistor M(PN) includes a gate electrode, a source electrode, and a drain electrode, and has an active layer formed of poly-silicon. For example, the poly-silicon semiconductor transistor M(PN) may be set as an LTPS transistor. The poly-silicon semiconductor transistor M(PN) may be formed as an N-type transistor. The poly-silicon semiconductor transistor M(PN) has a high electron mobility, and accordingly, has fast driving characteristics.

The poly-silicon semiconductor transistor M(PN) is on any one of leakage paths of the pixel PXL. In addition, the gate electrode of the poly-silicon semiconductor transistor M(PN) may be connected to any one of signal lines supplied to the pixel PXL, e.g., a scan line S. The poly-silicon semiconductor transistor M(PN) is turned on when a scan signal is supplied to the scan line S, and performs a predetermined function corresponding to a coupled position thereof.

The oxide semiconductor transistor M(O) is coupled to the poly-silicon semiconductor transistor M(PN). In addition, the gate electrode of the oxide semiconductor transistor M(O) is coupled to a control power source VC. The oxide semiconductor transistor M(O) maintains a turn-on state during a period (i.e., a turn-on period) in which the poly-silicon semiconductor transistor M(PN) is driven. If the oxide semiconductor transistor M(O) maintains the turn-on state during the period in which the poly-silicon semiconductor transistor M(PN) is driven, it is possible to ensure fast driving characteristics of the poly-silicon semiconductor transistor M(PN).

The oxide semiconductor transistor M(O) may be set to a turn-off state during at least a portion of a period in which the poly-silicon semiconductor transistor M(PN) is turned off. If the oxide semiconductor transistor M(O) is turned off, it is possible to reduce or minimize leakage current flowing in the leakage path.

In one embodiment, the oxide semiconductor transistor M(O) and the poly-silicon semiconductor transistor M(PN) may be on the leakage path of the pixel PXL, and leakage current flowing on the leakage path is reduced or minimized using the oxide semiconductor transistor M(O). When the leakage current flowing on the leakage current is reduced or minimized, an image with a desired luminance can be displayed in the pixel PXL. The oxide semiconductor transistor M(O) and the poly-silicon semiconductor transistor M(PN), which are shown in FIG. 2B, may be applied to various pixels PXL including N-type transistors.

Figure 3A:
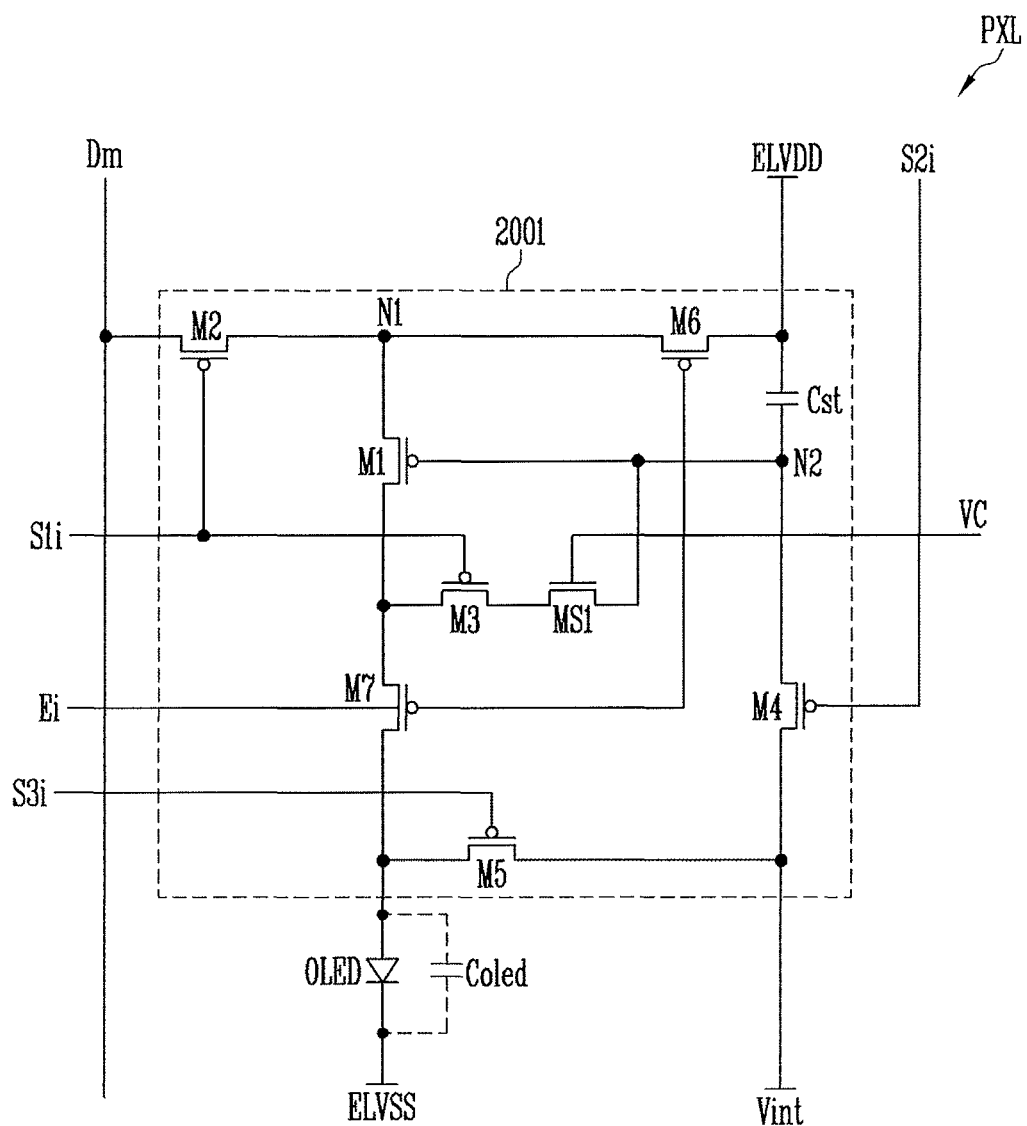
FIGS. 3A and 3B illustrate embodiments of a pixel.
Figure 3B:
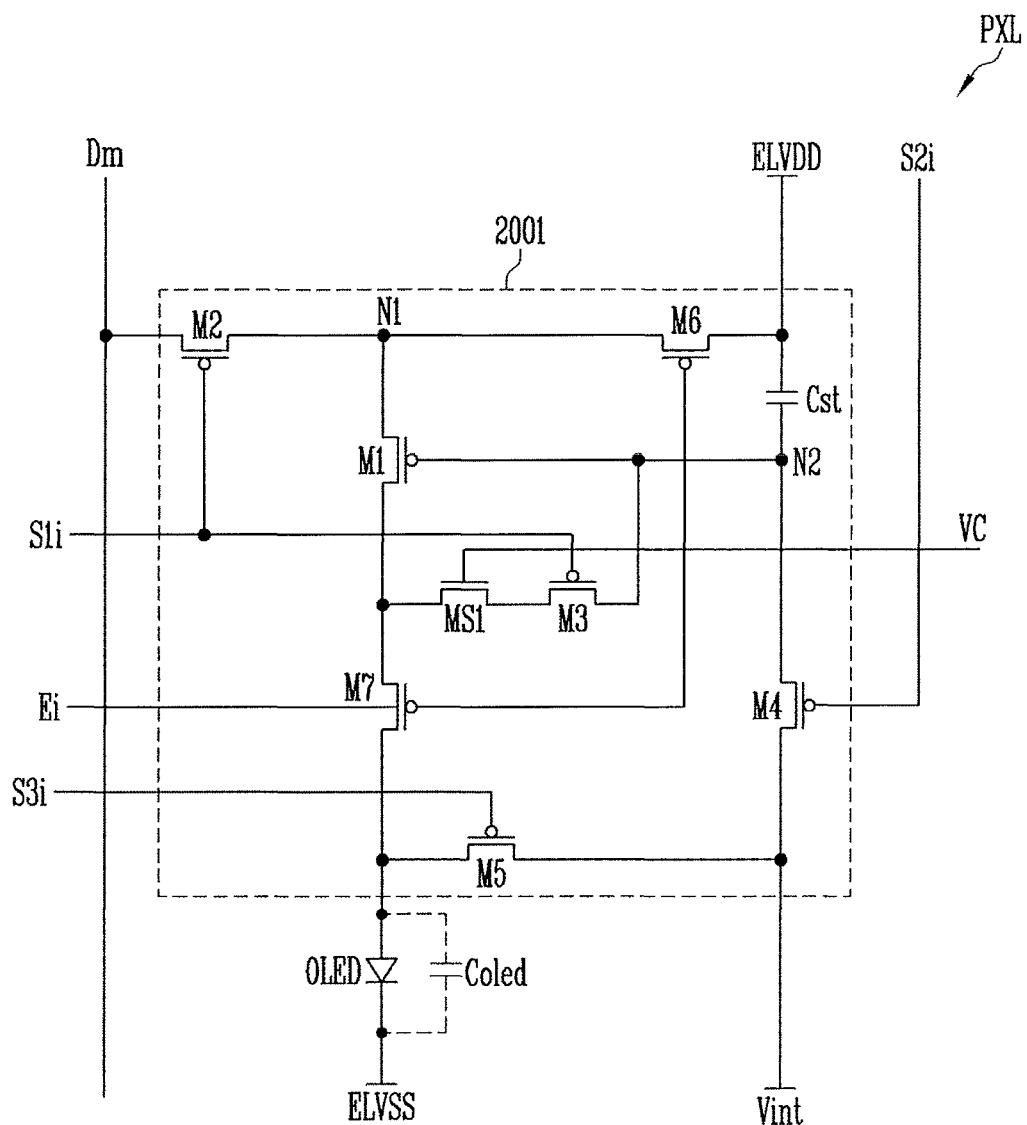

FIGS. 3A and 3B illustrates an embodiment of a pixel PXL on an ith horizontal line and coupled to an mth data line Dm. Referring to FIG. 3A, the pixel PXL includes an organic light emitting diode OLED and a pixel circuit 2001 for controlling the amount of current supplied to the organic light emitting diode OLED. An anode electrode of the organic light emitting diode OLED is coupled to the pixel circuit 2001, and a cathode electrode of the organic light emitting diode OLED is coupled to a second driving power source ELVSS. The organic light emitting diode OLED generates light with a predetermined luminance corresponding to the amount of current supplied from the pixel circuit 2001.

The pixel circuit 2001 controls the amount of current flowing from a first driving power source ELVDD to the second driving power source ELVSS via the organic light emitting diode OLED. To this end, the pixel circuit 2001 includes first to seventh transistors M1 to M7, a first stabilizing transistor MS1, and a storage capacitor Cst.

A first electrode of the first transistor (or driving transistor) M1 is coupled to a first node N1, and a second electrode of the first transistor M1 is coupled to the anode electrode of the organic light emitting diode OLED via the seventh transistor M7. In addition, a gate electrode of the first transistor M1 is coupled to a second node N2. The first transistor M1 controls the amount of current flowing from the first driving power source ELVDD to the second driving power source ELVSS via the organic light emitting diode OLED, corresponding to a voltage of the second node N2. To this end, the first driving power source ELVDD is set to a higher voltage than the second driving power source ELVSS.

The second transistor M2 is coupled between a data line Dm and the first node N1. In addition a gate electrode of the second transistor M2 is coupled to an ith first scan line S1*i*. The second transistor M2 is turned on when a first scan signal is supplied to the ith first scan line S1*i* in order to allow the data line Dm and the first node N1 to be electrically coupled to each other.

The third transistor M3 is coupled between the second electrode of the first transistor M1 and the second node N2. In addition, a gate electrode of the third transistor M3 is coupled to the ith first scan line S1*i* and is turned on when the first scan signal is supplied to the ith first scan line S1*i*.

The first stabilizing transistor MS1 is coupled between the third transistor M3 and the second node N2. In addition, a gate electrode of the first stabilizing transistor MS1 is coupled to a control power source VC. The first stabilizing transistor MS1 is turned on or turned off corresponding to a voltage of the control power source VC. The first stabilizing transistor MS1 is an oxide semiconductor transistor.

The control power source VC is set to a gate-on voltage such that the first stabilizing transistor MS1 is turned on when the pixel PXL is driven at a first driving frequency (e.g., a normal driving frequency). When the pixel PXL is driven at the first driving frequency, the first stabilizing transistor MS1 maintains a turn-on state.

The control power source VC is set to a gate-off voltage during a period in which the pixel PXL is driven at a second driving frequency lower than the first driving frequency (i.e., low frequency driving). The first stabilizing transistor MS1 maintains a turn-off state during a period in which the pixel PXL is driven at the second driving frequency. If the first stabilizing transistor MS1 is turned off, leakage current from the second node N2 is minimized, and accordingly, an image with a desired luminance can be implemented in the pixel PXL during the period in which the pixel PXL is driven at the second driving frequency.

In FIG. 3A, the first stabilizing transistor MS1 is coupled between the third transistor M3 and the second node N2. In one embodiment, as shown in FIG. 3B, the first stabilizing transistor MS1 may be coupled between the second electrode of the first transistor M1 and the third transistor M3.

The fourth transistor M4 is coupled between the second node N2 and a first power source Vint. A gate electrode of the fourth transistor M4 is coupled to an ith second scan line S2*i*. The fourth transistor M4 is turned on when a second scan signal is supplied to the ith second scan line S2*i* to supply a voltage of the first power source Vint to the second node N2. The first power source Vint is set to a lower voltage than a data signal supplied to the data line Dm. The second scan signal supplied to the ith second scan line S2*i* is supplied earlier than the first scan signal supplied to the ith first scan line S1*i*. Thus, the ith second scan line S2*i* may be set as an (i−1)th first scan line S1*i*−1.

The fifth transistor M5 is coupled between the anode electrode of the organic light emitting diode OLED and the first power source Vint. A gate electrode of the fifth transistor M5 is coupled to an ith third scan line S3*i*. The fifth transistor M5 is turned on when a third scan signal is supplied to the ith third scan line S3*i* to supply the voltage of the first power source Vint to the anode electrode of the organic light emitting diode OLED. The third scan signal supplied to the ith third scan line S3*i* overlaps a light emitting control signal supplied to a light emitting control line Ei. Accordingly, the ith third scan line S3*i* may be set as the ith first scan line S1*i* or the ith second scan line S2*i*.

If the voltage of the first power source Vint is supplied to the anode electrode of the organic light emitting diode OLED, a parasitic capacitor (organic capacitor Coled) of the organic light emitting diode OLED is discharged. If the organic capacitor Coled is discharged, the black expression ability of the pixel PXL is improved.

For example, a predetermined voltage is charged in the organic capacitor Coled, corresponding to a current supplied from the pixel circuit 2001, during a previous frame period. If the organic capacitor Coled is charged, the organic light emitting diode OLED may easily emit light even at a low current.

A black data signal may be supplied to the pixel circuit 2001 in a current frame period. When the black data signal is supplied, the pixel circuit 2001 is to ideally supply no current to the organic light emitting diode OLED. However, the pixel circuit 2001 formed with the transistors supplies a predetermined leakage current to the organic light emitting diode OLED even when the black data signal is supplied. At this time, if the organic capacitor Coled is in a charge-state, the organic light emitting diode OLED may minutely emit light. Thus, the black expression ability of the pixel PXL is deteriorated.

On the other hand, if the organic capacitor Coled is discharged by the first power source Vint, the organic light emitting diode OLED is set to a non-light emitting state by leakage current. That is, in one embodiment, the organic capacitor Coled is discharged using the first power source Vint. Thus, the black expression ability of the pixel PXL can be improved.

The sixth transistor M6 is coupled between the first driving power source ELVDD and the first node N1. In addition, a gate electrode of the sixth transistor M6 is coupled to an ith light emitting control line Ei. The sixth transistor M6 is turned off when a light emitting control signal is supplied to the ith light emitting control line Ei, and turned on when the light emitting control signal is not supplied.

The seventh transistor M7 is coupled between the first transistor M1 and the anode electrode of the organic light emitting diode OLED. In addition, a gate electrode of the seventh transistor M7 is coupled to the ith light emitting control line Ei. The seventh transistor M7 is turned off when the light emitting control signal is supplied to the ith light emitting control line Ei, and turned on when the light emitting control signal is not supplied.

The storage capacitor Cst is coupled between the first driving power source ELVDD and the second node N2. The storage capacitor Cst charges a voltage corresponding to a data signal and a threshold voltage of the first transistor M1.

In the pixel PXL of the present embodiment, the first to seventh transistors T1 to T7 are P-type poly-silicon semiconductor transistors. Particularly, transistors M1, M6, and M7 on a current supply path for supplying current to the organic light emitting diode OLED are P-type poly-silicon semiconductor transistors. If the transistors M1 to M7 are poly-silicon semiconductor transistors, fast driving characteristics can be ensured.

In addition, the first stabilizing transistor MS1 is an N-type oxide semiconductor transistor. If the first stabilizing transistor MS1 is an oxide semiconductor transistor, the leakage current from the second node can be reduced or minimized. Accordingly, an image with a desired luminance can be displayed in the pixel unit 100.

Figure 4:
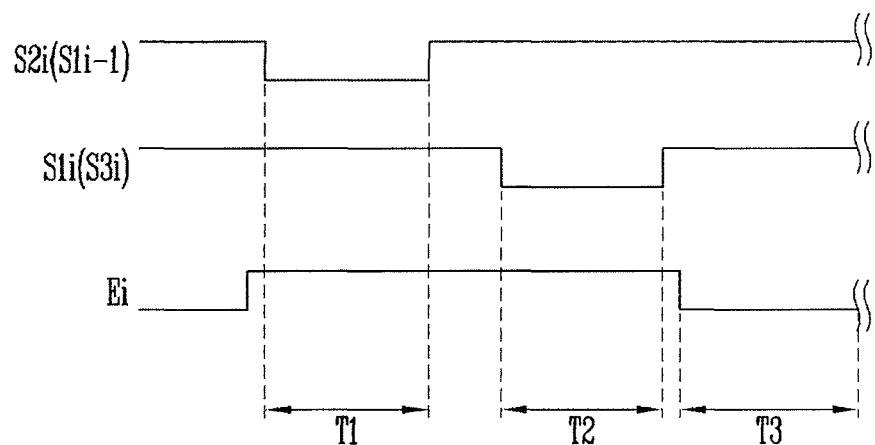
FIG. 4 illustrates an embodiment of a method for driving a pixel.

FIG. 4 illustrates an embodiment of a method for driving the pixel in FIGS. 3A and 3B. In FIG. 4, it is assumed that the ith second scan line S2i is set to the (i−1)th first scan line S1i−1 and the ith third scan line S3i is set to the ith first scan line S1i. In addition, the driving method of FIG. 4 corresponds to the first driving frequency, and it is assumed that the first stabilizing transistor MS1 is set to the turn-on state.

Referring to FIG. 4, during a first period T1, the light emitting control signal is supplied to the ith light emitting control line Ei, and the second scan signal is supplied to the ith second scan line S2i. If the light emitting control signal is supplied to the ith light emitting control line Ei, sixth transistor M6 and the seventh transistor M7 are turned off.

If the sixth transistor M6 is turned off, the first driving power source ELVDD and the first node are electrically interrupted. If the seventh transistor M7 is turned off, the first transistor M1 and the organic light emitting diode OLED are electrically interrupted. Therefore, the pixel PXL is set to the non-light emitting state during a period in which the light emitting control signal is supplied to the ith light emitting control line Ei, i.e., the first period T1 and a second period T2.

If the second scan signal is supplied to the ith second scan line S2i, the fourth transistor M4 is turned on. If the fourth transistor M4 is turned on, the voltage of the first power source Vint is supplied to the second node N2.

During the second period T2, the first scan signal is supplied to the ith first scan line S1i. If the first scan signal is supplied to the ith first scan line S1i, the second transistor M2, the third transistor M3, and the fifth transistor M5 are turned on.

If the fifth transistor M5 is turned on, the voltage of the first power source Vint is supplied to the anode electrode of the organic light emitting diode OLED. If the voltage of the first power source Vint is supplied to the anode electrode of the organic light emitting diode OLED, the organic capacitor Coled is discharged. Accordingly, the black expression ability of the pixel PXL is improved.

If the third transistor M3 is turned on, the second electrode of the first transistor M1 and the second node N2 are electrically coupled to each other. For example, the first transistor M1 is diode-coupled. Here, during the second period T2, the first stabilizing transistor MS1 is set to the turn-on state. Accordingly, the electrical coupling between the second electrode of the first transistor M1 and the second node N2 is controlled corresponding to turn-on and turn-off of the third transistor M3.

If the second transistor M2 is turned on, the data signal from the data line Dm is supplied to the first node N1. At this time, since the second node N2 is initialized to the voltage of the first power source Vint, which is lower than the data signal, the first transistor M1 is turned on.

If the first transistor M1 is turned on, the data signal supplied to the first node N1 is supplied to the second node N2 via the diode-coupled first transistor M1. At this time, the voltage corresponding to the data signal and the threshold voltage of the first transistor M1 is applied to the second node N2. During the second period T2, the storage capacitor Cst stores the voltage of the second node N2.

During a third period T3, the supply of the light emitting control signal to the ith light emitting control line Ei is stopped. If the supply of the light emitting control signal to the ith light emitting control line Ei is stopped, the sixth transistor M6 and the seventh transistor M7 are turned on.

If the sixth transistor M6 is turned on, the first driving power source ELVDD and the first node N1 are electrically coupled to each other. If the seventh transistor M7 is turned on, the second electrode of the first transistor M1 and the anode electrode of the organic light emitting diode OLD are electrically coupled to each other. At this time, the first transistor M1 controls the amount of current flowing from the first driving power source ELVDD to the second driving power source ELVSS, via the organic light emitting diode OLED, based on the voltage applied to the second node N2.

As described above, the pixel PXL generates light with a predetermined luminance while repeating the first to third periods T1 to T3 during a period in which the pixel PXL is driven at the first driving frequency. In addition, the first stabilizing transistor MS1 maintains the turn-on state during the period in which the pixel PXL is driven at the first driving frequency. Accordingly, the pixel PXL can be stably driven.

Figure 5:
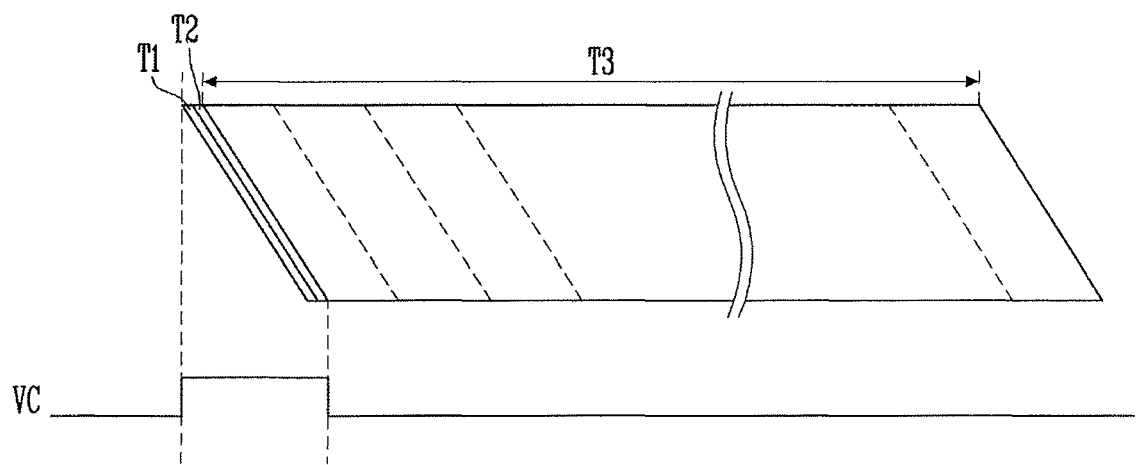
FIG. 5 illustrates an embodiment of a pixel driven at a second driving frequency.

FIG. 5 illustrates an embodiment when the pixel of FIGS. 3A and 3B is driven at the second driving frequency. Referring to FIG. 5, the low frequency driving means a driving method of maintaining light emission of the pixel PXL while maintaining a voltage of the data signal for a predetermined time, after the data signal is supplied to the pixel PXL. For example, when a still image is displayed in the pixel unit 100, a driving frequency of the organic light emitting display device may be changed from the first driving frequency to the second driving frequency. If the organic light emitting display device is driven at the second driving frequency, the number of times of supplying the data signal is decreased. Accordingly, power consumption is reduced.

An operating process of the pixel PXL will be described. During first and second periods T1 and T2 in which the data signal is supplied to the pixels PXL, the voltage of the control power source VC is set such that the first stabilizing transistor MS1 is turned on. Then, the voltage of the data signal is normally supplied to each of the pixels PXL.

After the data signal is supplied to each of the pixels PXL, the voltage of the control power source VC is set such that first stabilizing transistor MS1 is turned off. Accordingly, the first stabilizing transistor MS1 is turned off.

If the first stabilizing transistor MS1 is turned off, the leakage current from the second node N2 can be reduced or minimized during a period in which the pixel PXL emits light. Accordingly, light with a desired luminance can be generated from the pixel PXL. Particularly, the first stabilizing transistor MS1 is formed as an oxide semiconductor transistor having excellent off-current characteristics. Accordingly, the leakage current from the second node N2 can be reduced or minimized.

Figure 6A:
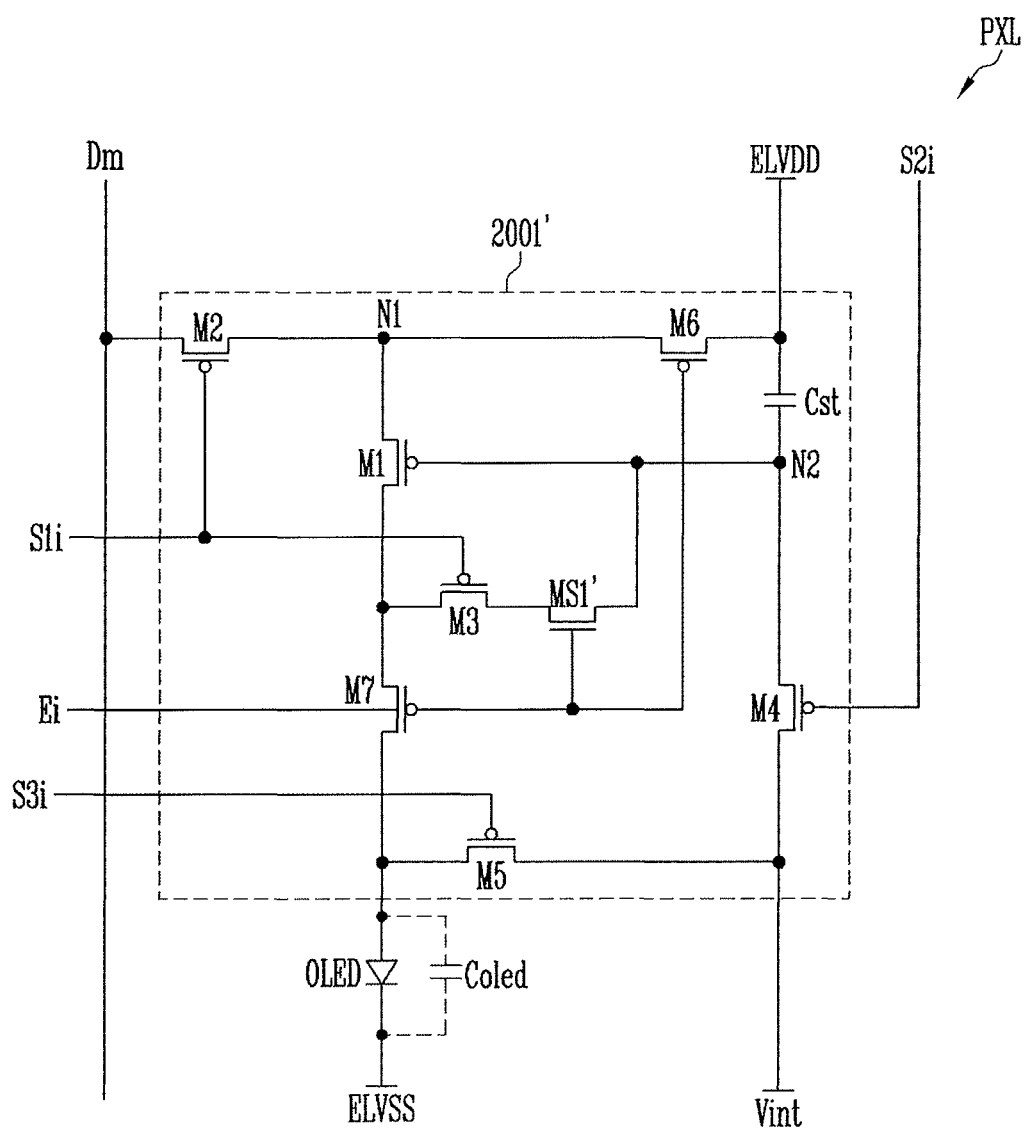
FIGS. 6A and 6B illustrate additional embodiments of a pixel.
Figure 6B:
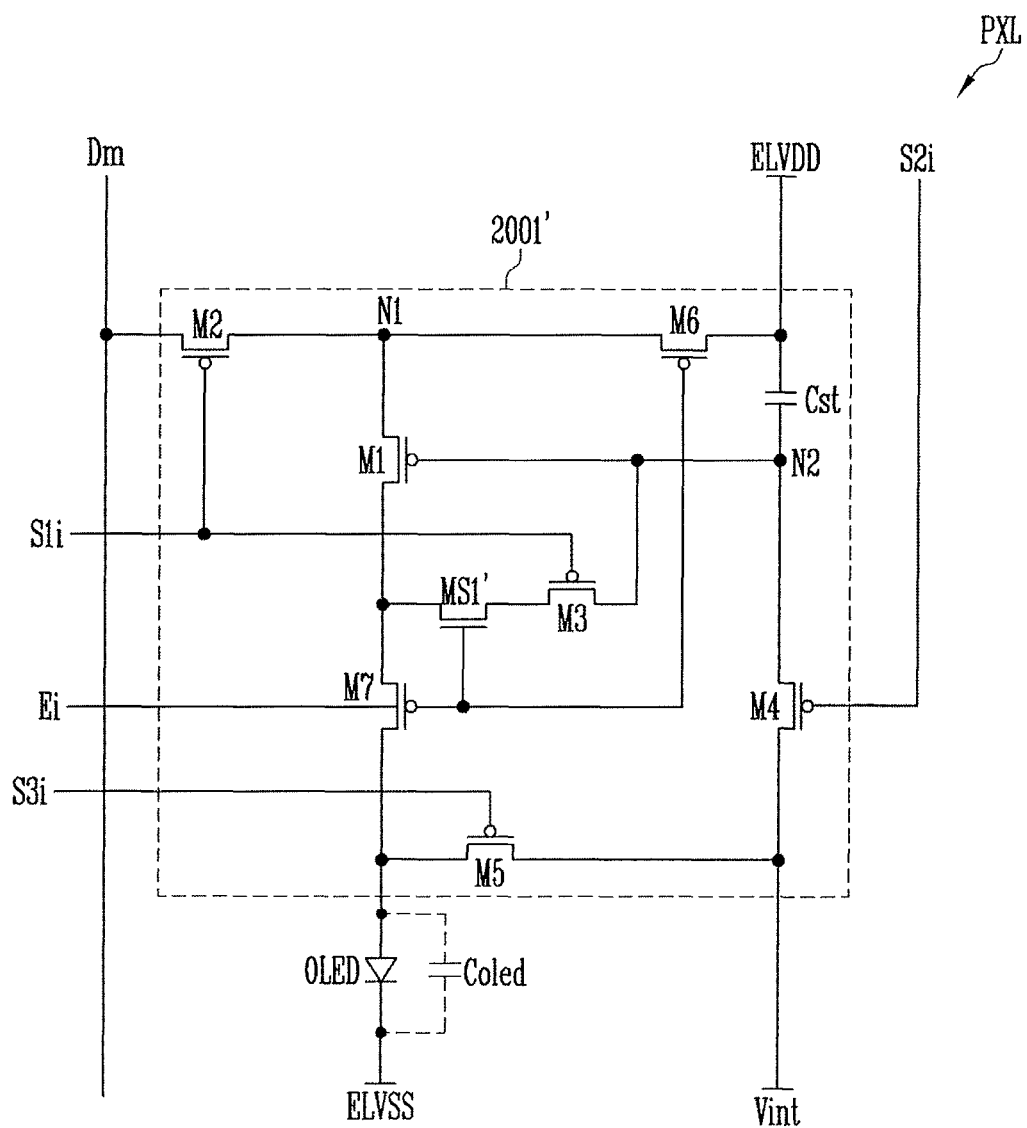

FIGS. 6A and 6B illustrate additional embodiments of a pixel PXL according to the another embodiment of the present disclosure includes a pixel circuit 2001' and an organic light emitting diode OLED. An anode electrode of the organic light emitting diode OLED is coupled to the pixel circuit 2001', and a cathode electrode of the organic light emitting diode OLED is coupled to the second driving power source ELVSS. The organic light emitting diode OLED generates light with a predetermined luminance corresponding to the amount of current supplied from the pixel circuit 2001'.

The pixel circuit 2001' controls the amount of current flowing from the first driving power source ELVDD to the second driving power source ELVSS, via the organic light emitting diode OLED, based on the data signal. The pixel circuit 2001' includes a first stabilizing transistor MS1' on a current path between the second node N2 and the first transistor M1. The first stabilizing transistor MS1' may be between the third transistor M3 and the second node N2 or between the second electrode of the first transistor M1 and the third transistor M3.

A gate electrode of the first stabilizing transistor MS1' is coupled to the ith light emitting control line Ei. The first stabilizing transistor MS1' is turned o when the light emitting control signal is supplied to the ith light emitting control line Ei, and turned off when the light emitting control signal is not supplied.

An operating process of the pixel PXL will be described with reference to FIGS. 4, 6A, and 6B. During the first period T1, the light emitting control signal is supplied to the ith light emitting control line Ei, and the second scan signal is supplied to the ith second scan line S2i.

If the light emitting control signal is supplied to the ith light emitting control line Ei, the sixth transistor M6 and the seventh transistor M7 are turned off. Accordingly, the pixel PXL is set to the non-light emitting state. If the second scan signal is supplied to the ith second scan line S2i, the fourth transistor M4 is turned on. Accordingly, the second node N2 is initialized to the voltage of the first power source Vint. In addition, if the light emitting control signal is supplied to the ith light emitting control line Ei, the first stabilizing transistor MS1' is turned on.

During the second period T2, the first scan signal is supplied to the ith first scan line S1i. If the first scan signal is supplied to the ith first scan line S1i, the second transistor M2, the third transistor M3, and the fifth transistor M5 are turned on.

If the fifth transistor M5 is turned on, the voltage of the first power source Vint is supplied to the anode electrode of the organic light emitting diode OLED. Accordingly, the organic capacitor Coled is discharged.

If the third transistor M3 is turned on, the second electrode of the first transistor M1 and the second node N2 are electrically coupled to each other. That is, the first transistor M1 is diode-coupled. The first stabilizing transistor MS1' is set to the turn-on state during the second period T2. Accordingly, the electrical coupling between the second electrode of the first transistor M1 and the second node N2 is controlled corresponding to turn-on and turn-off of the third transistor M3.

If the second transistor M2 is turned on, the data signal from the data line Dm is supplied to the first node N1. Then, the data signal supplied to the first node N1 is supplied to the second node N2 via the diode-coupled first transistor M1. At this time, the voltage corresponding to the data signal and the threshold voltage of the first transistor M1 is applied to the second node N2. During the second period T2, the voltage of the second node N2 is stored in the storage capacitor Cst.

During the third period T3, the supply of the light emitting control signal to the ith light emitting control line Ei is stopped. If the supply of the light emitting control signal to the ith light emitting control line Ei is stopped, the sixth transistor M6 and the seventh transistor M7 are turned on. If supply of the light emitting control signal to the ith light emitting control line Ei is stopped, first stabilizing transistor MS1' is turned off.

If the sixth transistor M6 and the seventh transistor M7 are turned on, there is formed a current path along which current flows from the first driving power source ELVDD to the second driving power source ELVSS via the sixth transistor M6, the first transistor M1, the seventh transistor M7, and the organic light emitting diode OLED. At this time, the first transistor M1 controls the amount of current flowing from the first driving power source ELVDD to the second driving power source ELVSS via the organic light emitting diode OLED, corresponding to the voltage applied to the second node N2.

Meanwhile, during the third period in which the pixel PXL emits light, the first stabilizing transistor MS1' maintains the turn-off state. If the first stabilizing transistor MS1' is turned off, the leakage current from the second node N2 can be reduced or minimized during the period in which the pixel PXL emits light, and accordingly, light with a desired luminance can be generated from the pixel PXL.

Figure 7A:
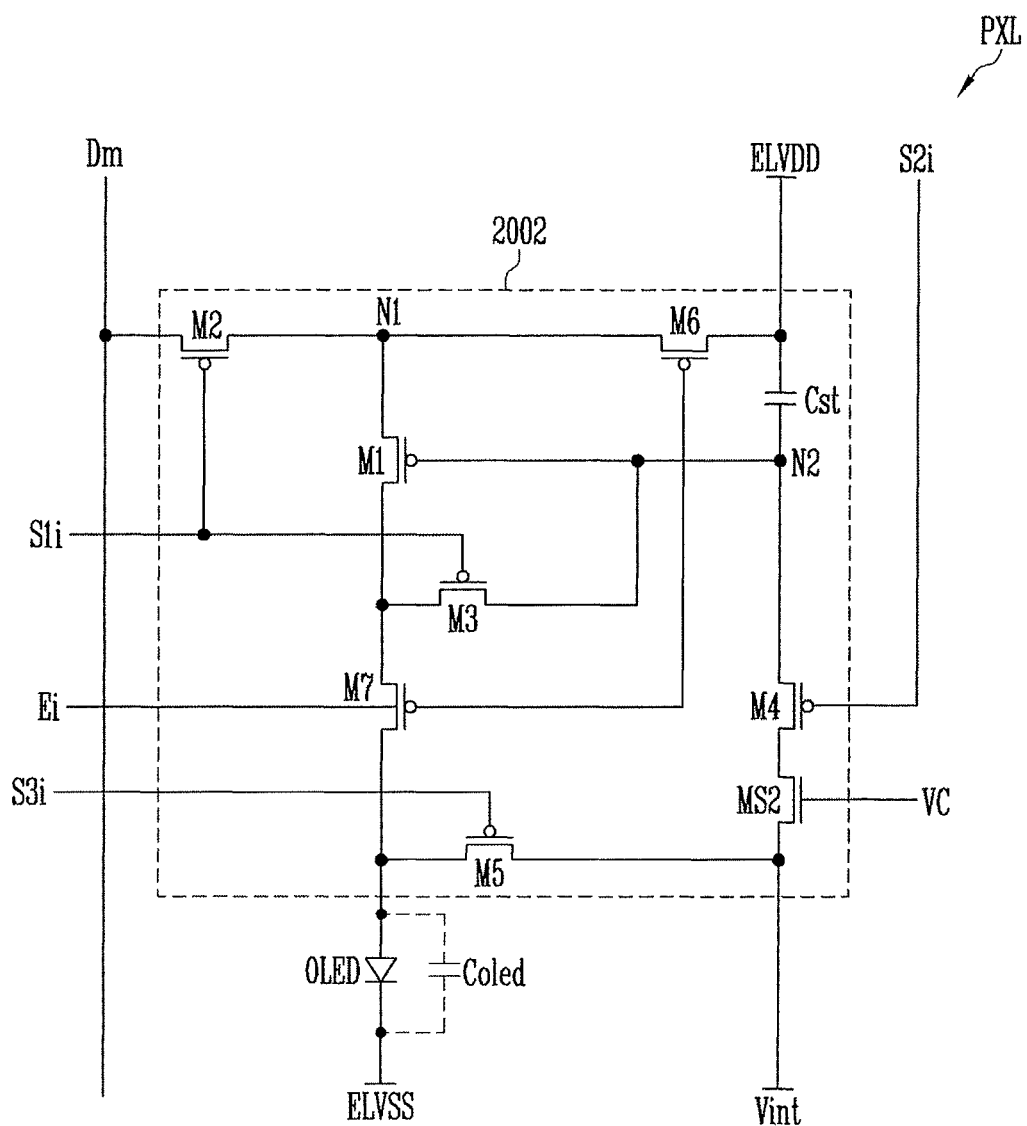
FIGS. 7A and 7B illustrate additional embodiments of a pixel.
Figure 7B:
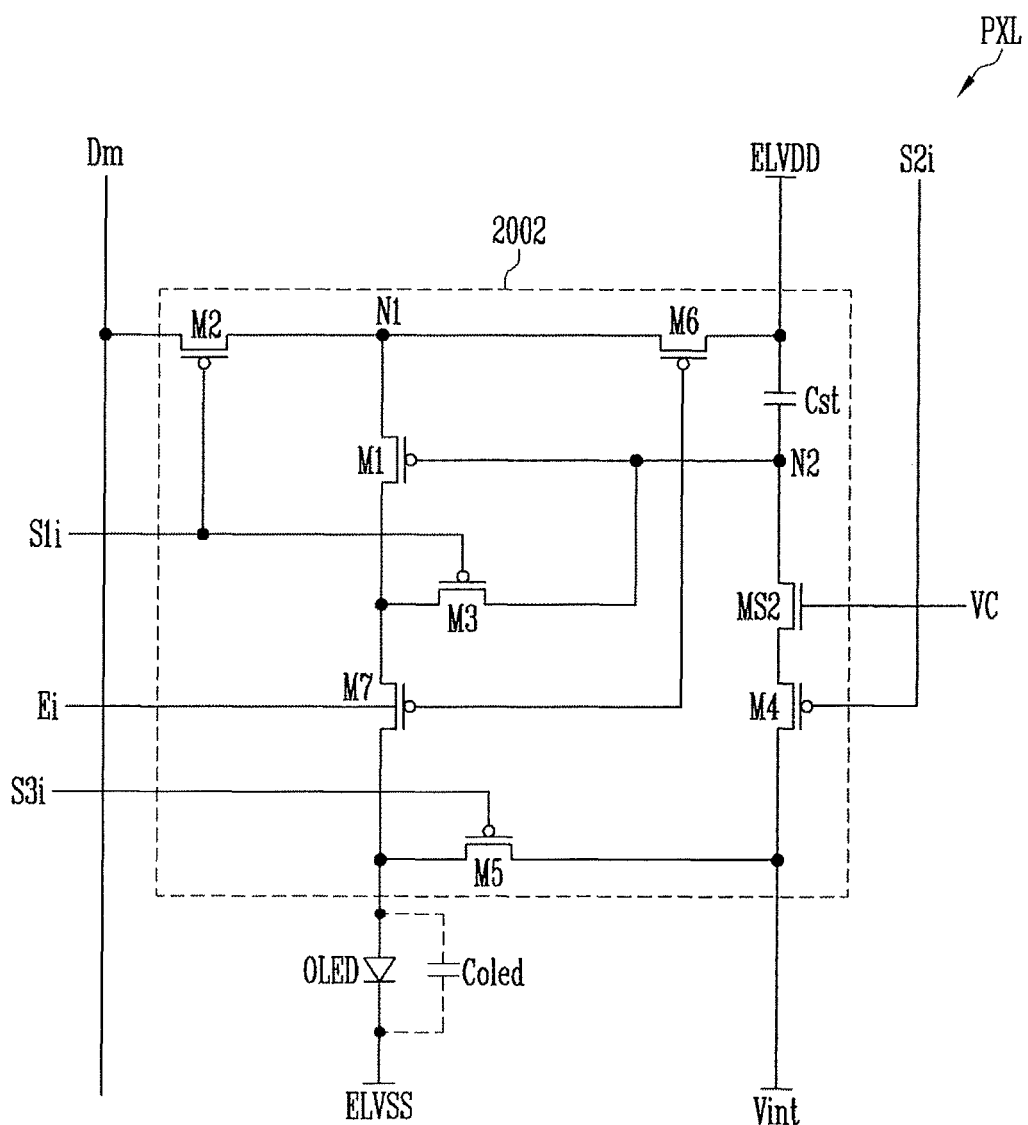

FIGS. 7A and 7B illustrate additional embodiments of a pixel PXL which includes a pixel circuit 2002 and an organic light emitting diode OLED. An anode electrode of the organic light emitting diode OLED is coupled to the pixel circuit 2002, and a cathode electrode of the organic light emitting diode OLED is coupled to the second driving power source ELVSS. The organic light emitting diode OLED generates light with a predetermined luminance corresponding to the amount of current supplied from the pixel circuit 2002.

The pixel circuit 2002 controls the amount of current flowing from the first driving power source ELVDD to the second driving power source ELVSS via the organic light emitting diode OLED, corresponding to the data signal.

The pixel circuit 2002 includes a second stabilizing transistor MS2 on a current path between the second node N2 and the first power source Vint. For example, the second stabilizing transistor MS2 may be between the second node N2 and the fourth transistor M4 or between the fourth transistor M4 and the first power source Vint.

A gate electrode of the second stabilizing transistor MS2 is coupled to the control power source VC. The second stabilizing transistor MS2 maintains the turn-on state when the organic light emitting display device is driven at the first driving frequency. An operating process of the pixel PXL may be the same as described with reference to FIGS. 3A to 4.

Meanwhile, the second stabilizing transistor MS2 is turned off during a period in which the organic light emitting display device is driven at the second driving frequency, i.e., a period in which the organic light emitting display device is driven at a low frequency. At this time, the voltage of the control power source VC is set such that the second stabilizing transistor MS2 is turned on during the first and second periods T1 and T2 in which the data signal is supplied to the pixels PXL as shown in FIG. 5. Then, the voltage of the data signal is normally supplied to each of the pixels PXL.

After the data signal is supplied to each of the pixels PXL, the voltage of the control power source VC is set such that the second stabilizing transistor MS2 is turned off. Accordingly, the second stabilizing transistor MS2 is turned off.

If the second stabilizing transistor MS2 is turned off, leakage current between the second node N2 and the first power source Vint is reduced or minimized. Accordingly, an image with a desired luminance can be displayed. In an embodiment of the present disclosure, the second stabilizing transistor MS2 is formed as an oxide semiconductor transistor. Accordingly, the leakage current can be reduced or minimized.

Meanwhile, in FIGS. 7A and 7B, it has been illustrated that the first stabilizing transistor MS1 or MS1' is removed as compared with FIGS. 3A, 3B, 6A, and 6B, but the present disclosure is not limited thereto. For example, the first stabilizing transistor MS1 or MS1' may be added to the pixel PXL of FIGS. 7A and 7B.

Figure 8A:
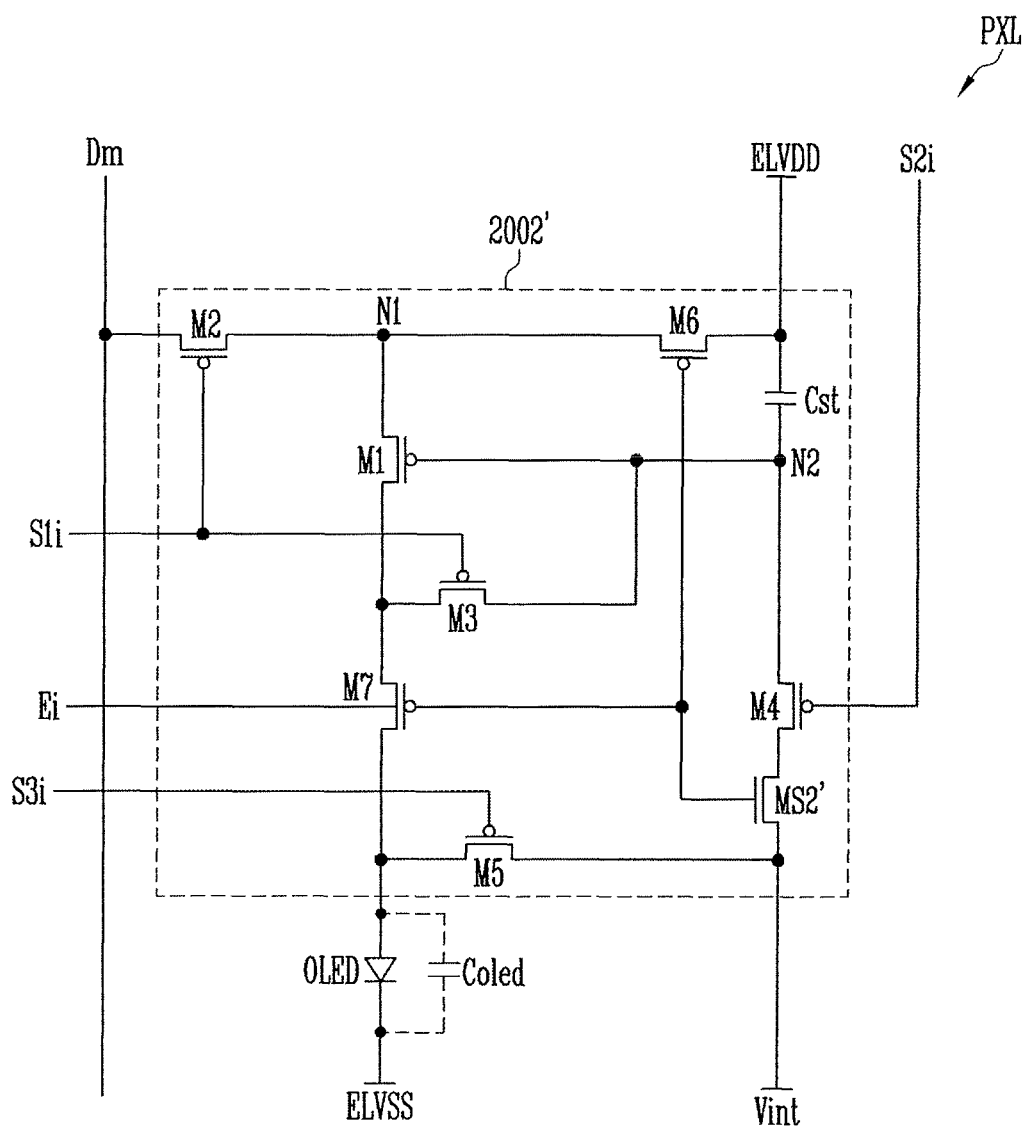
FIGS. 8A and 8B illustrate additional embodiments of a pixel.
Figure 8B:
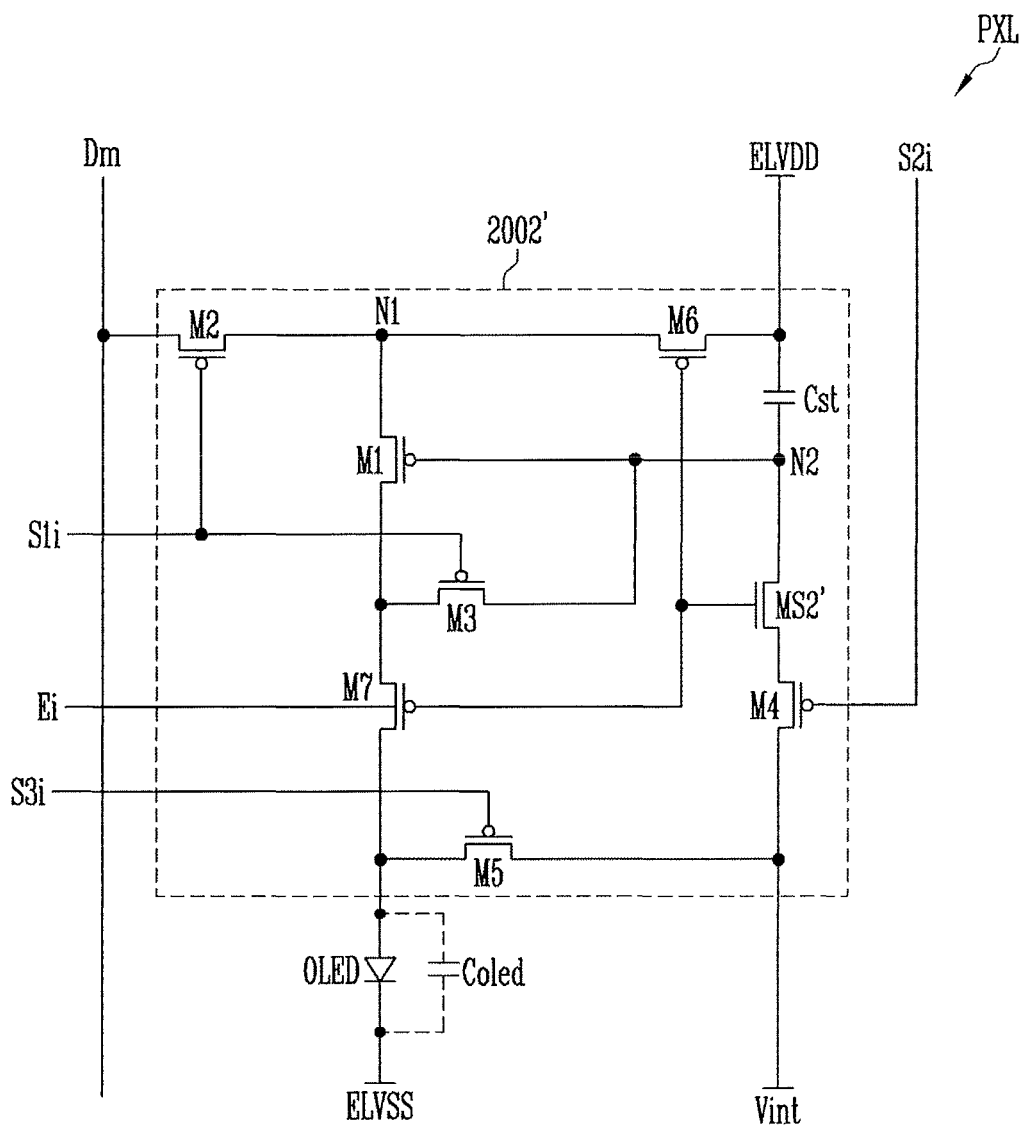

FIGS. 8A and 8B illustrate additional embodiments of a pixel PXL which includes a pixel circuit 2002' and an organic light emitting diode OLED. An anode electrode of the organic light emitting diode OLED is coupled to the pixel circuit 2002', and a cathode electrode of the organic light emitting diode OLED is coupled to the second driving power source ELVSS. The organic light emitting diode OLED generates light with a predetermined luminance corresponding to the amount of current supplied from the pixel circuit 2002'.

The pixel circuit 2002' controls the amount of current flowing from the first driving power source ELVDD to the second driving power source ELVSS via the organic light emitting diode OLED, corresponding to the data signal.

The pixel circuit 2002' includes a second stabilizing transistor MS2' on a current path between the second node N2 and the first power source Vint. For example, the second stabilizing transistor MS2' may be between the second node N2 and the fourth transistor M4 or between the fourth transistor M4 and the first power source Vint.

A gate electrode of the second stabilizing transistor MS2' is coupled to the ith light emitting control line Ei. The second stabilizing transistor MS2' is turned on when the light emitting control signal is supplied to the ith light emitting control line Ei, and turned off when the light emitting control signal is not supplied. An operating process of the pixel PXL may be the same as described with reference to FIGS. 4, 6A, and 6B.

If the second stabilizing transistor MS2' is turned off, leakage current between the second node N2 and the first power source Vint is reduced or minimized. Accordingly, an image with a desired luminance can be displayed. In the present embodiment, the second stabilizing transistor MS2' is an oxide semiconductor transistor, Accordingly, the leakage current can be minimized.

Meanwhile, in FIGS. 8A and 8B, it has been illustrated that the first stabilizing transistor MS1 is removed as compared with FIGS. 3A, 3B, 6A, and 6B, but the present disclosure is not limited thereto. For example, the first stabilizing transistor MS1 may be added to the pixel PXL of FIGS. 8A and 8B.

Figure 9A:
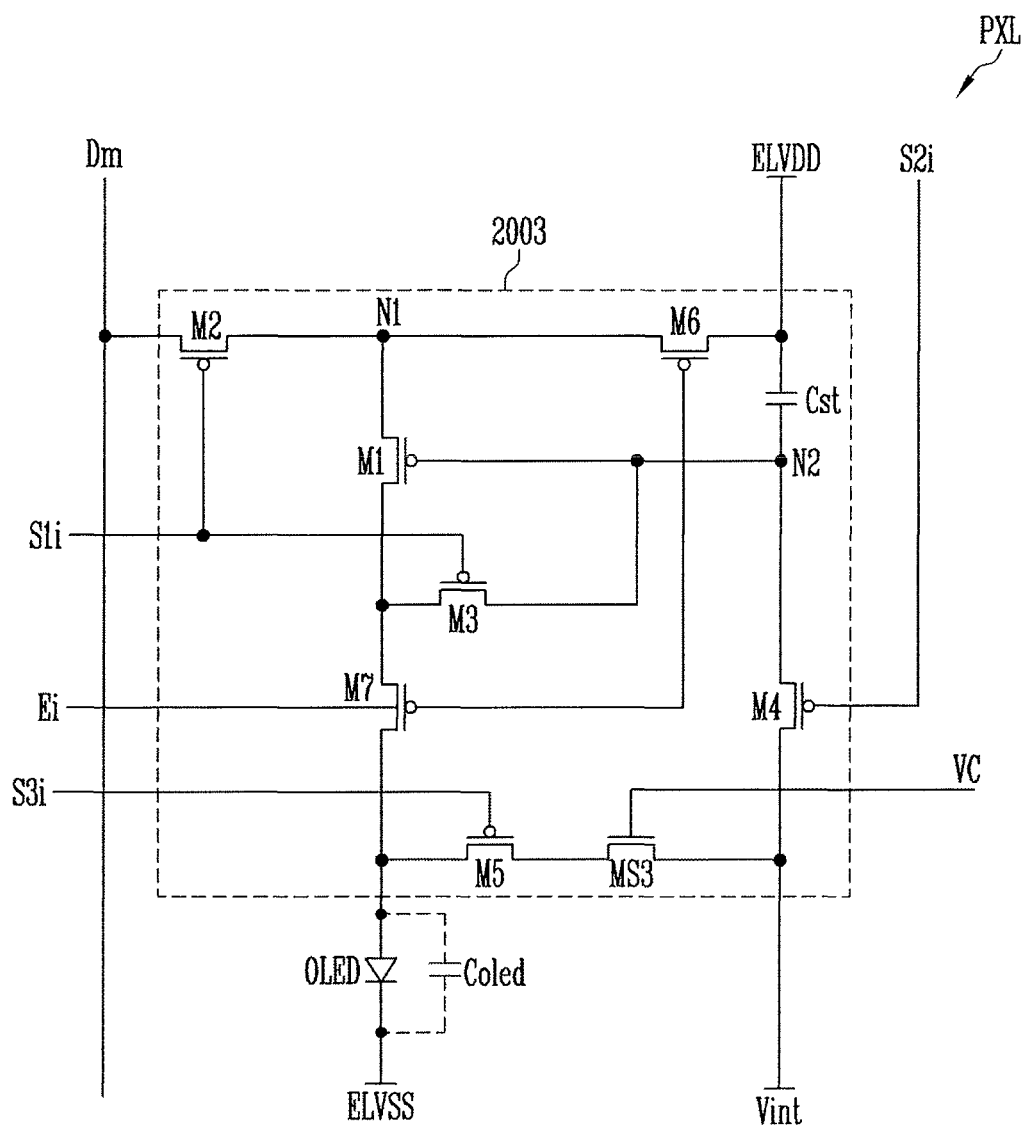
FIGS. 9A and 9B illustrate additional embodiments of a pixel.
Figure 9B:
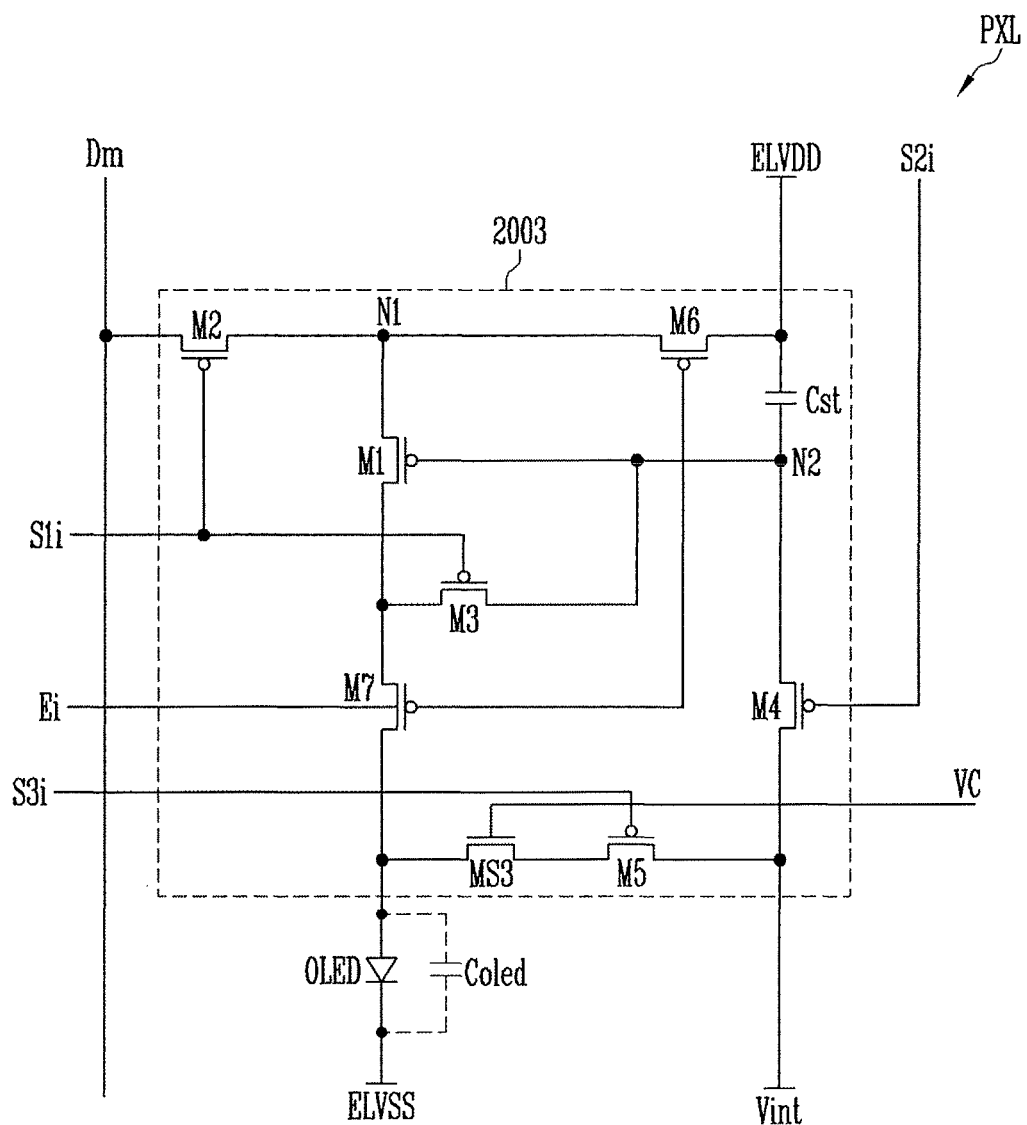

FIGS. 9A and 9B illustrate additional embodiments of a pixel PXL which includes a pixel circuit 2003 and an organic light emitting diode OLED. An anode electrode of the organic light emitting diode OLED is connected to the pixel circuit 2003, and a cathode electrode of the organic light emitting diode OLED is connected to the second driving power source ELVSS. The organic light emitting diode OLED generates light with a predetermined luminance corresponding to the amount of current supplied from the pixel circuit 2003.

The pixel circuit 2003 controls the amount of current flowing from the first driving power source ELVDD to the second driving power source ELVSS via the organic light emitting diode OLED, corresponding to the data signal.

The pixel circuit 2003 includes a third stabilizing transistor MS3 on a current path between the anode electrode of the organic light emitting diode OLED and the first power source Vint. For example, the third stabilizing transistor MS3 may be between the anode electrode of the organic light emitting diode OLED and the fifth transistor M5 or between the fifth transistor M5 and the first power source Vint.

A gate electrode of the third stabilizing transistor MS3 is coupled to the control power source VC. The third stabilizing transistor MS3 maintains the turn-on state when the organic light emitting display device is driven at the first driving frequency. An operating process of the pixel PXL may be the same as described with reference to FIGS. 3A to 4.

Meanwhile, the third stabilizing transistor MS3 is turned off during a period in which the organic light emitting display device is driven at the second driving frequency, i.e., a period in which the organic light emitting display device is driven at a low frequency. At this time, the voltage of the control power source VC is set such that the third stabilizing transistor is turned on during the first and second periods T1 and T2 in which the data signal is supplied to the pixels PXL. Then, the voltage of the data signal is normally supplied to each of the pixels PXL.

After the data signal is supplied to each of the pixels PXL, the voltage of the control power source VC is set such that the third stabilizing transistor MS3 is turned off. Accordingly, the third stabilizing transistor MS3 is turned off.

If the third stabilizing transistor MS3 is turned off, leakage current between the anode electrode of the organic light emitting diode OLED and the first power source Vint is reduced or minimized. Accordingly, an image with a desired luminance can be displayed. In the present embodiment, the third stabilizing transistor MS3 is an oxide semiconductor transistor. Accordingly, the leakage current can be reduced or minimized.

In FIGS. 9A and 9B, it has been illustrated that the first stabilizing transistor MS1 is removed as compared with FIGS. 3A, 3B, 6A, and 6B, but the present disclosure is not limited thereto. For example, the first stabilizing transistor MS1 may be added to the pixel PXL of FIGS. 9A and 9B.

Figure 10A:
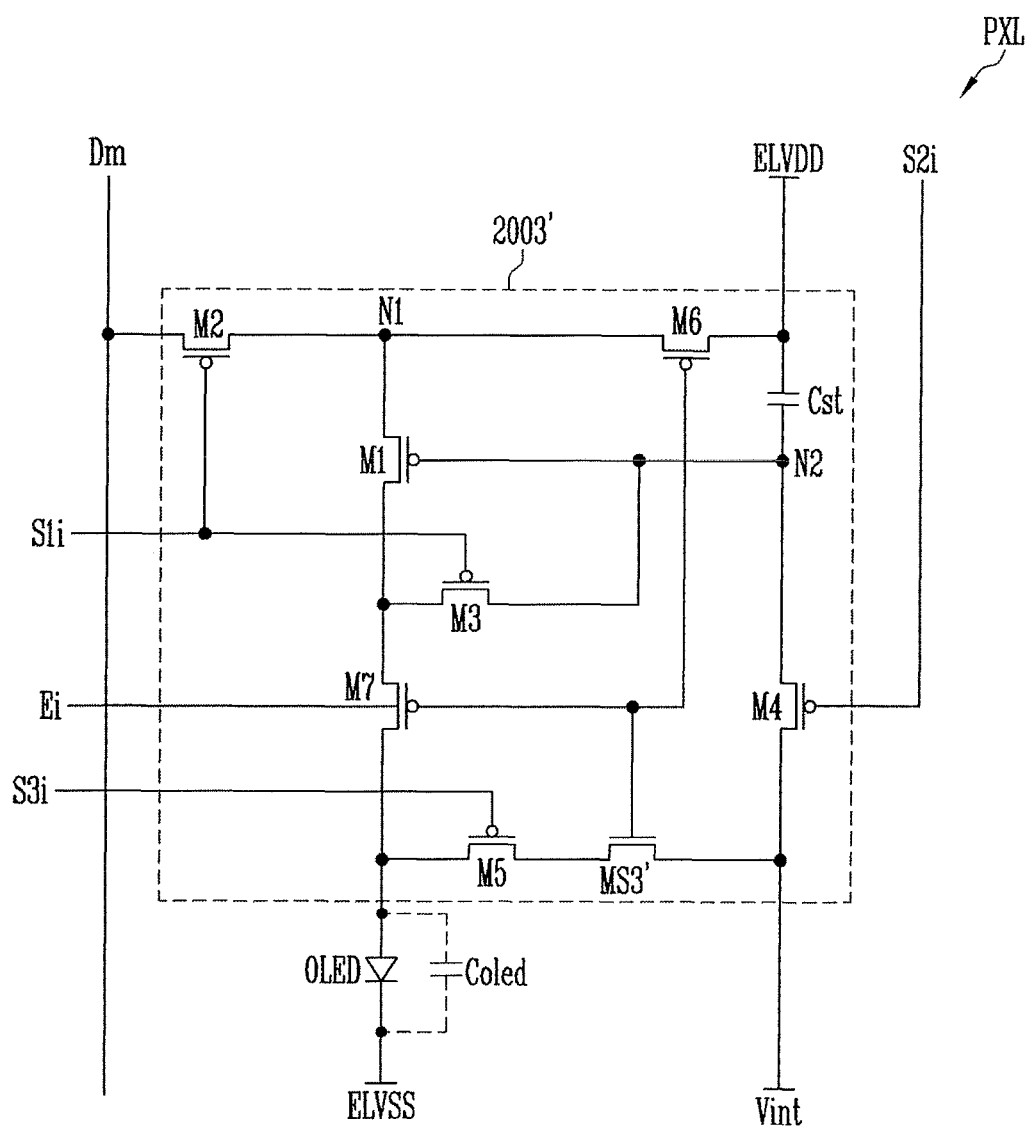
FIGS. 10A and 10B illustrate additional embodiments of a pixel.
Figure 10B:
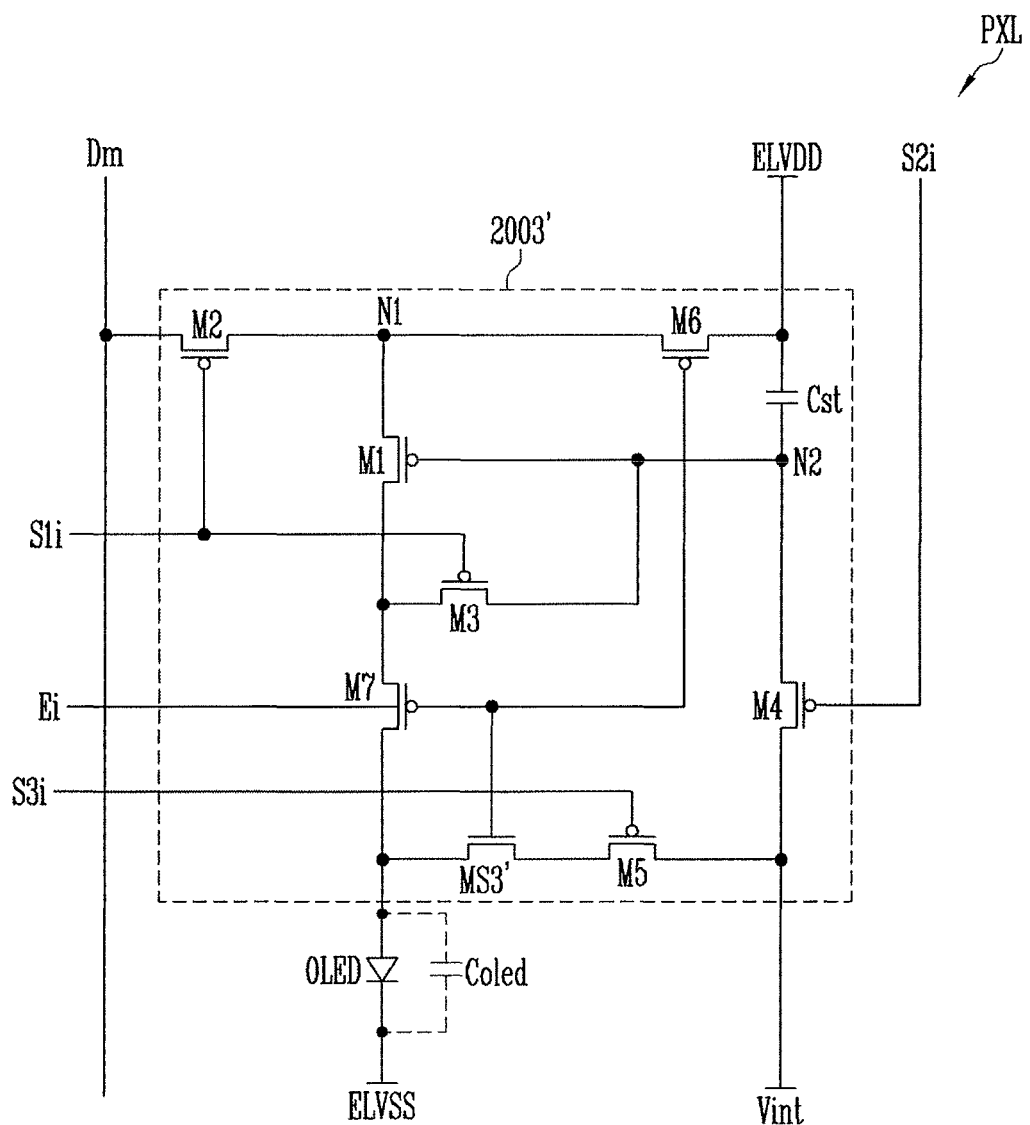
Figure 11A:
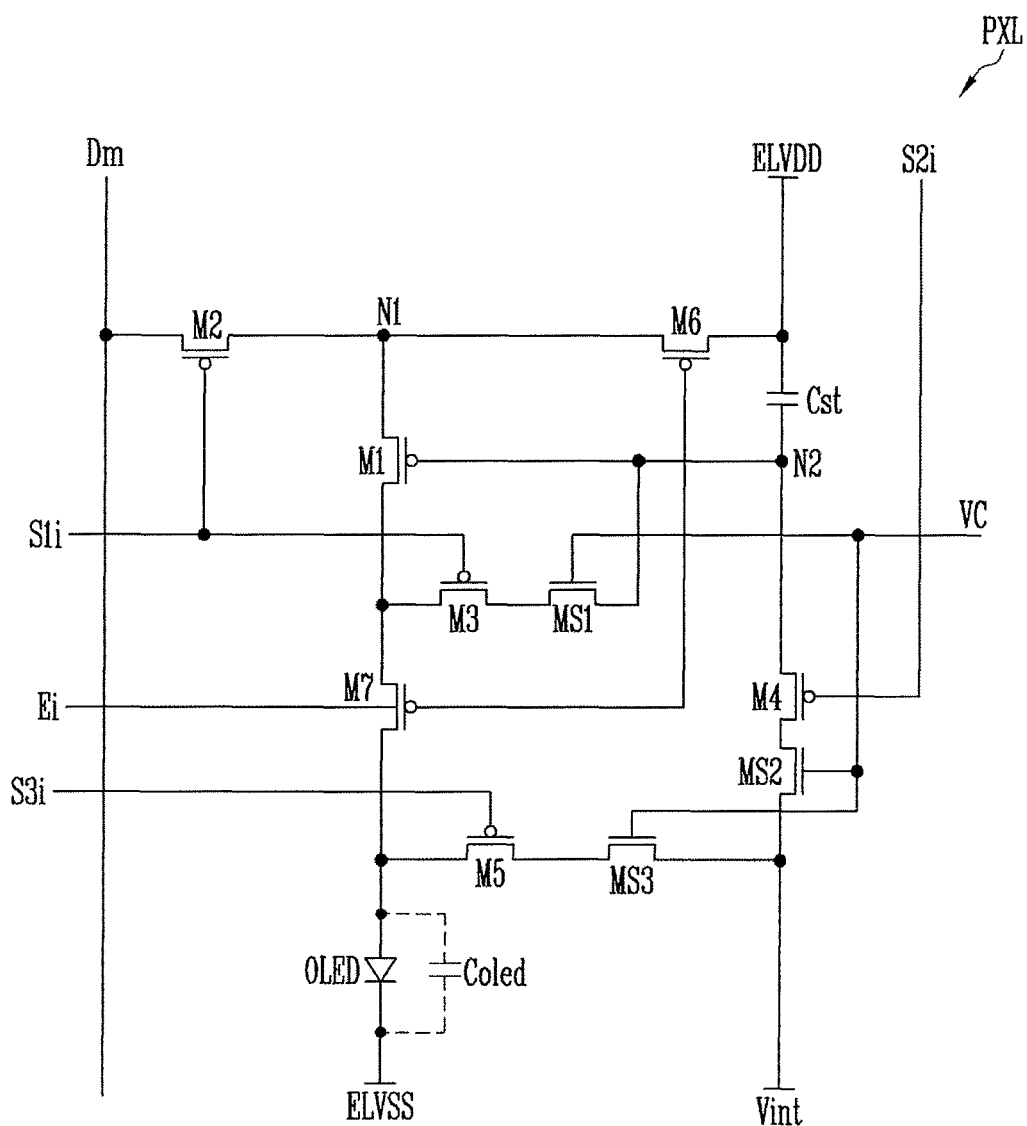
FIGS. 11A to 11D illustrate additional embodiments of a pixel.
Figure 11B:
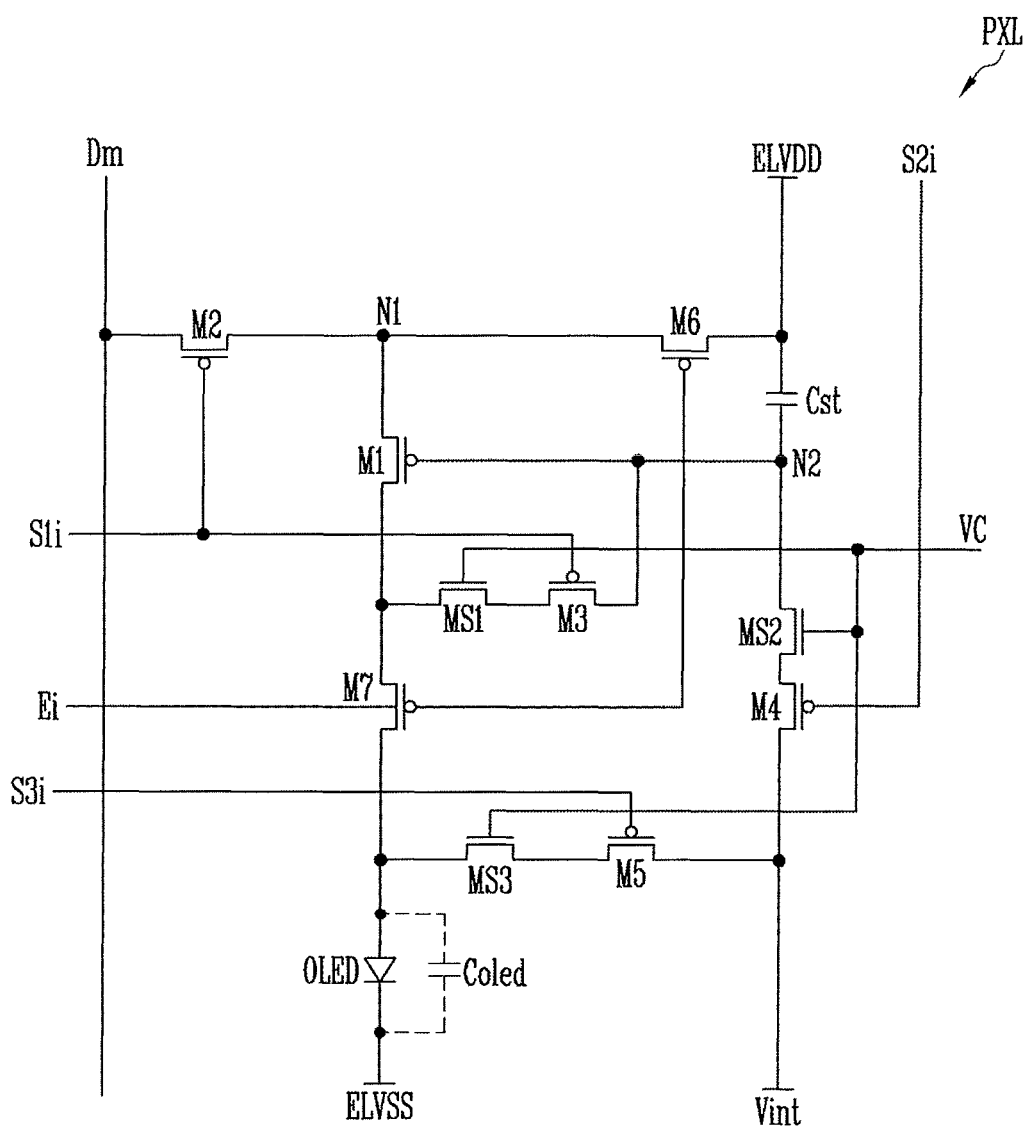
Figure 11C:
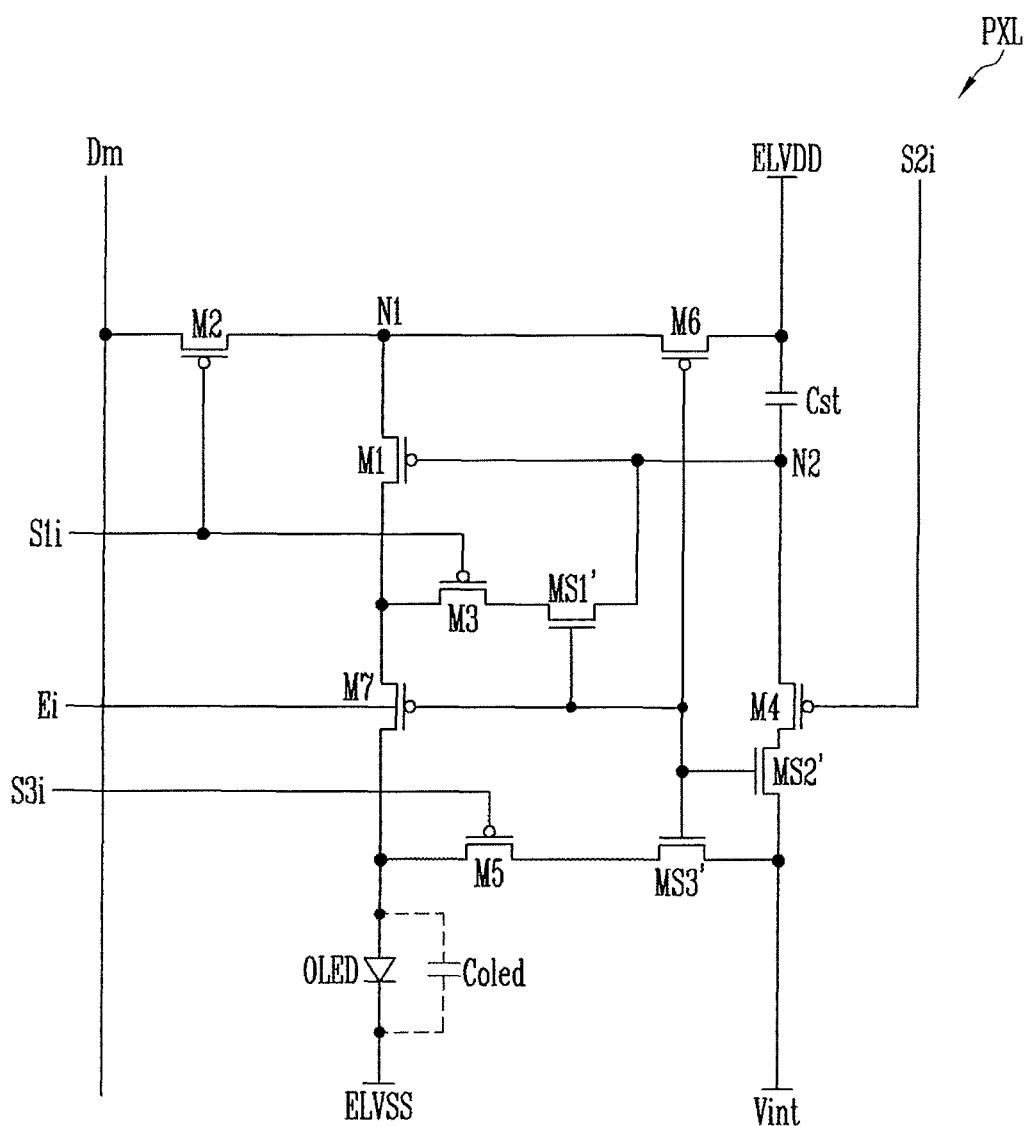
Figure 11D:
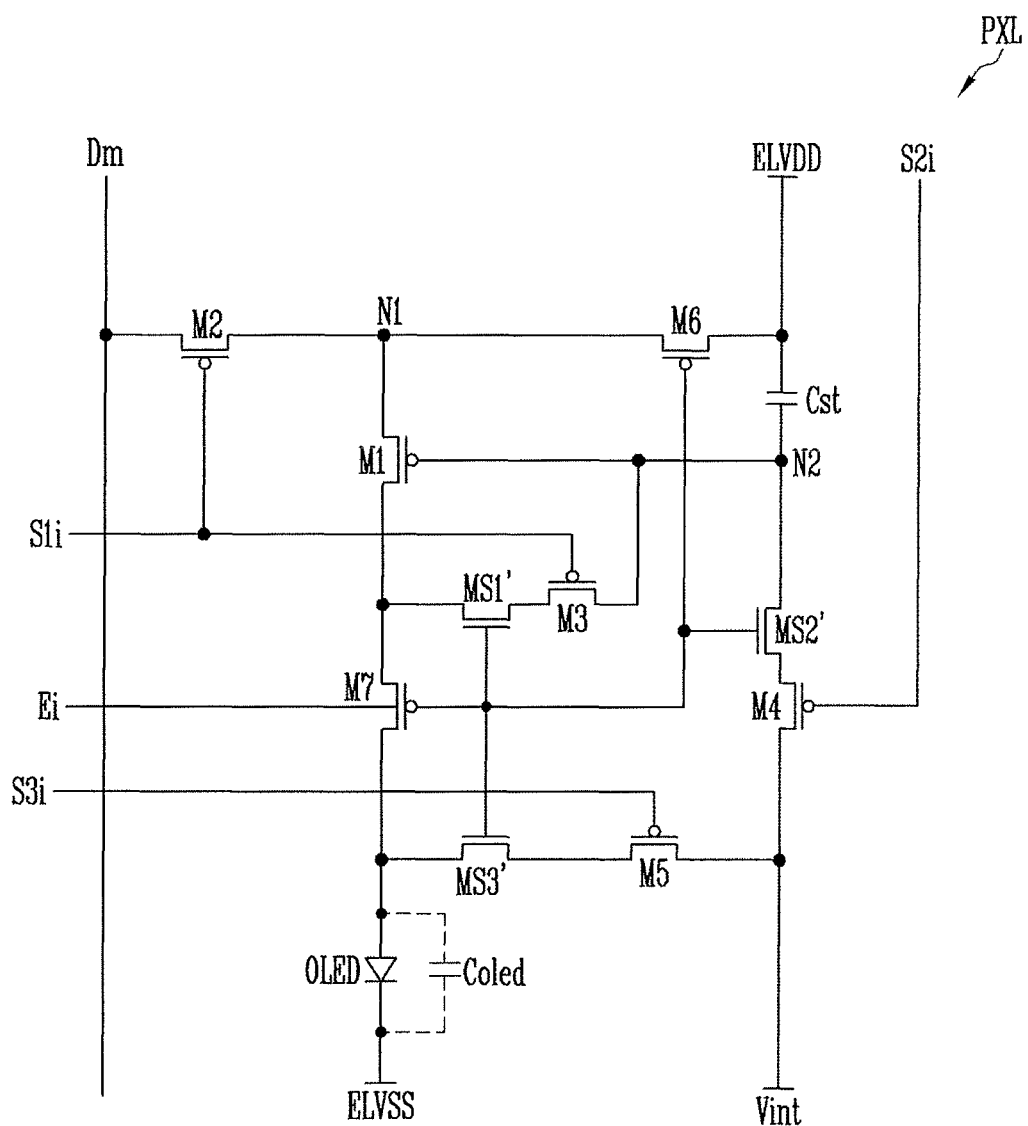

FIGS. 10A and 10B illustrate additional embodiments of a pixel PXL which includes a pixel circuit 2003' and an organic light emitting diode OLED. An anode electrode of the organic light emitting diode OLED is coupled to the pixel circuit 2003', and a cathode electrode of the organic light emitting diode OLED is coupled to the second driving power source ELVSS. The organic light emitting diode OLED generates light with a predetermined luminance corresponding to the amount of current supplied from the pixel circuit 2003'.

The pixel circuit 2003' includes a third stabilizing transistor MS3' on a current path between the anode electrode of the organic light emitting diode OLED and the first power source Vint. For example, the third stabilizing transistor MS3' may be between the anode electrode of the organic light emitting diode OLED and the fifth transistor M5 or between the fifth transistor M5 and the first power source Vint.

A gate electrode of the third stabilizing transistor MS3' is coupled to the ith light emitting control line Ei. The third stabilizing transistor MS3' is turned on when the light emitting control signal is supplied to the ith light emitting control line Ei, and turned off when the light emitting control signal is not supplied. An operating process of the pixel PXL is the same as described with reference to FIGS. 4, 6A, and 6B.

If the third stabilizing transistor MS3' is turned off, leakage current between the anode electrode of the organic light emitting diode OLED and the first power source Vint is reduced or minimized. Accordingly, an image with a desired luminance can be displayed. In the present embodiment, the third stabilizing transistor MS3' is an oxide semiconductor transistor. Thus, leakage current can be reduced or minimized.

Meanwhile, in FIGS. 10A and 10B, it has been illustrated that the first stabilizing transistor MS1 is removed as compared with FIGS. 3A, 3B, 6A, and 6B, but the present disclosure is not limited thereto. For example, the first stabilizing transistor MS1 may be added to the pixel PXL of FIGS. 10A and 10B.

In the present embodiment, at least one transistor among the first stabilizing transistor MS1 or MS1', the second stabilizing transistor MS2 or MS2', and the third stabilizing transistor MS3 or MS3' may be formed in the pixel PXL. For example, as shown in FIGS. 11A to 11D, the first stabilizing transistor MS1 or MS1', the second stabilizing transistor MS2 or MS2', and the third stabilizing transistor MS3 or MS3' may be formed in the pixel PXL.

If the first stabilizing transistor MS1 or MS1', the second stabilizing transistor MS2 or MS2', and the third stabilizing transistor MS3 or MS3' are formed in the pixel PXL, leakage current is reduced or minimized during the third period T3 in which the organic light emitting diode OLED emits light. Accordingly, an image with a desired luminance can be displayed. Particularly, the first stabilizing transistor MS1 or MS1', the second stabilizing transistor MS2 or MS2', and the third stabilizing transistor MS3 or MS3' are formed as oxide semiconductor transistors, an image with a desired luminance can be stably displayed even when the pixel PXL is driven at a low frequency.

Figure 12A:
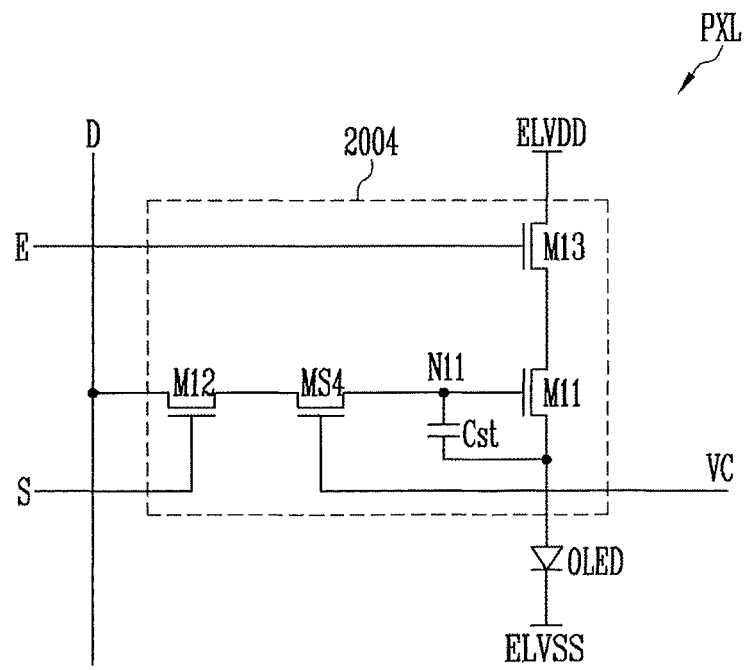
FIGS. 12A and 12B illustrate additional embodiments of a pixel.
Figure 12B:
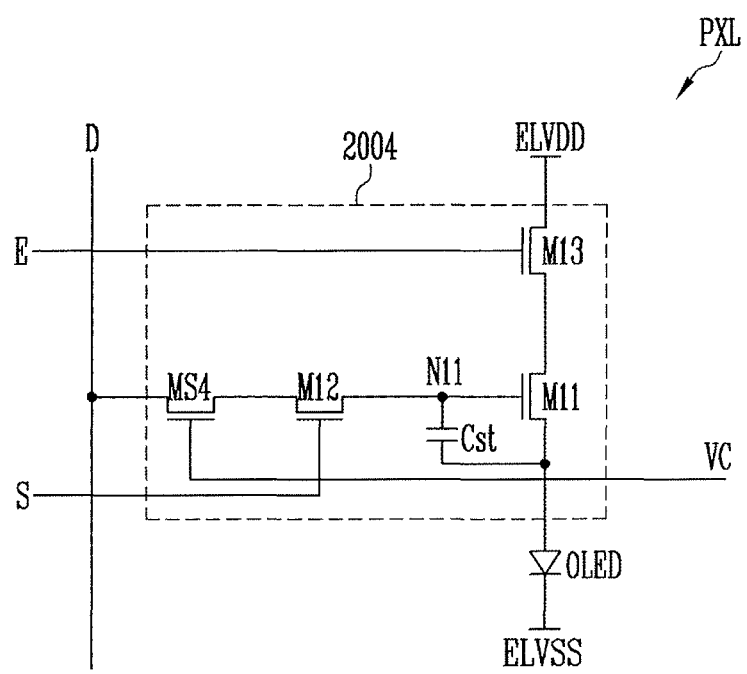

FIGS. 12A and 12B illustrate additional embodiments of a pixel PXL which includes an organic light emitting diode OLED and a pixel circuit 2004 for controlling the amount of current supplied to the organic light emitting diode OLED. An anode electrode of the organic light emitting diode OLED is coupled to the pixel circuit 2004, and a cathode electrode of the organic light emitting diode OLED is coupled to the second driving power source ELVSS. The organic light emitting diode OLED generates light with a predetermined luminance corresponding to the amount of current supplied from the pixel circuit 2004.

The pixel circuit 2004 controls the amount of current flowing from the first driving power source ELVDD to the second driving power source ELVSS via the organic light emitting diode OLED, corresponding to the data signal. To this end, the pixel circuit 2004 includes eleventh to thirteenth transistors M11 to M13, a fourth stabilizing transistor MS4, and a storage capacitor Cst.

A first electrode of the eleventh transistor (or driving transistor) M11 is coupled to the first driving power source ELVDD via the thirteenth transistor M13, and a second electrode of the eleventh transistor M11 is coupled to the anode electrode of the organic light emitting diode OLED. In addition, a gate electrode of the eleventh transistor M11 is coupled to an eleventh node N11. The eleventh transistor M11 controls the amount of current flowing the first driving power source ELVDD to the second driving power source ELVSS via the organic light emitting diode OLED, corresponding to a voltage of the eleventh node N11.

The twelfth transistor M12 is coupled between a data line D and the eleventh node N11. In addition, a gate electrode of the twelfth transistor M12 is coupled to a scan line S. The twelfth transistor M12 is turned on when a scan signal is supplied to the scan line S.

The thirteenth transistor M13 is coupled between the first driving power source ELVDD and the first electrode of the eleventh transistor M11. In addition, a gate electrode of the thirteenth transistor M13 is coupled to a light emitting control line E. The thirteenth transistor M13 is turned off when a light emitting control signal is supplied to the light emitting control line E, and turned on when the light emitting control signal is not supplied.

The fourth stabilizing transistor MS4 is located on a current path between the data line D and the eleventh node N11. For example, the fourth stabilizing transistor MS4 may be located between the twelfth transistor M12 and the eleventh node N11 or between the data line D and the twelfth transistor M12.

A gate electrode of the fourth stabilizing transistor MS4 is coupled to the control power source VC. The fourth stabilizing transistor MS4 maintains the turn-on state when the organic light emitting display device is driven at the first driving frequency. Also, the fourth stabilizing transistor MS4 is turned off after the organic light emitting display device is driven at the second driving frequency, and a voltage corresponding to a data signal is charged in the storage capacitor Cst.

Meanwhile, the fourth stabilizing transistor MS4 is an oxide semiconductor transistor. Thus, if the fourth stabilizing transistor MS4 is turned off, leakage current between the data line D and the eleventh node N11 is reduced or minimized. Accordingly, an image with a desired luminance can be implemented in the pixel PXL.

The storage capacitor Cst is coupled between the eleventh node N11 and the anode electrode of the organic light emitting diode OLED. The storage capacitor Cst stores a voltage corresponding to the data signal.

Meanwhile, in the above-described pixel PXL according to the present embodiment, the eleventh to thirteenth transistors M11 to M13 are N-type poly-silicon semiconductor transistors. As described above, if the transistors M11 to M13 are formed as poly-silicon semiconductor transistors, fast driving characteristics can be ensured.

Figure 13:
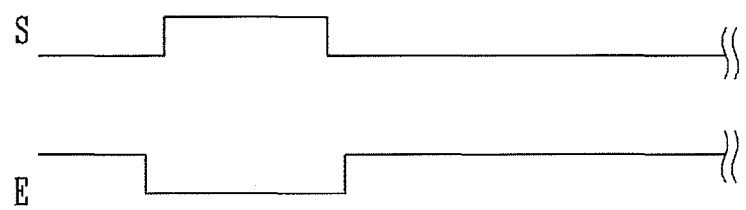
FIG. 13 illustrates another embodiment of a method for driving a pixel.

FIG. 13 illustrate another embodiment of a method for driving a pixel, which, for example may be the pixel PXL shown in FIGS. 12A and 12B. Referring to FIG. 13, first, the light emitting control signal is supplied to the light emitting control line E such that the thirteenth transistor M13 is turned off. If the thirteenth transistor M13 is turned off, the first driving power source ELVDD and eleventh transistor M11 are electrically interrupted, and accordingly, the pixel PXL is set to the non-light emitting state.

After that, the scan signal is supplied to the scan line S such that the twelfth transistor M12 is turned on. If the twelfth transistor M12 is turned on, the data line D and the eleventh node N11 are electrically coupled to each other. Then, the data signal from the data line D is supplied to the eleventh node N11. Accordingly, a voltage corresponding to the data signal is stored in the storage capacitor Cst.

The supply of the light emitting control signal to the light emitting control line E is stopped after the voltage corresponding to the data signal is stored in the storage capacitor Cst. If the supply of the light emitting control signal to the light emitting control line E is stopped, the thirteenth transistor M13 is turned on. If the thirteenth transistor M13 is turned on, the first driving power source ELVDD and the eleventh transistor M11 are electrically coupled to each other.

At this time, the eleventh transistor M11 controls the amount of current flowing from the first driving power source ELVDD to the second driving power source ELVSS, via the organic light emitting diode OLED, based on a voltage of the eleventh node N11.

As described above, the pixel of the present embodiment generates light with a predetermined luminance while repeating the above-described process during a period in which the organic light emitting display device is driven at the first driving frequency. In addition, the fourth stabilizing transistor MS4 maintains the turn-on state during the period in which the organic light emitting display device is driven at the first driving frequency. Accordingly, the pixel PXL can be stably driven.

Additionally, during the organic light emitting display device is driven at the second driving frequency, the voltage corresponding to the data signal is charged in the storage capacitor Cst of each of the pixels PXL, and the control power source VC is set to a gate-off voltage. Then, the fourth stabilizing transistor MS4 in each of the pixels PXL is turned off. Accordingly, leakage current between the data line D and the eleventh node N11 can be reduced or minimized. Thus, the pixel PXL can stably generate light with a desired luminance even when the organic light emitting display device is driven at the second driving frequency.

Meanwhile, in the present embodiment, the driving method of the pixel PXL of FIGS. 12A and 12B is not limited to that of FIG. 13. For example, the pixel PXL of FIGS. 12A and 12B may be driven with various types of driving waveforms currently known in the art.

Figure 14A:
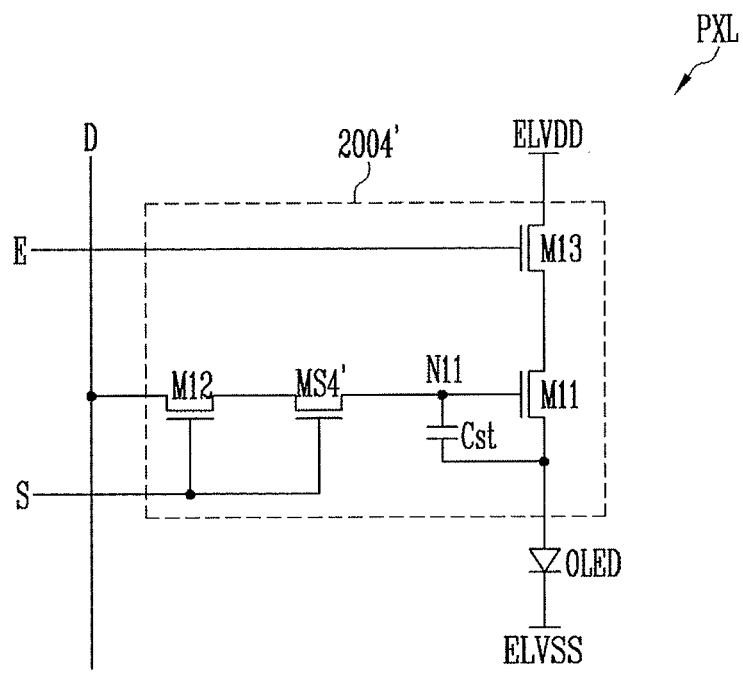
FIGS. 14A and 14B illustrate additional embodiments of a pixel.
Figure 14B:
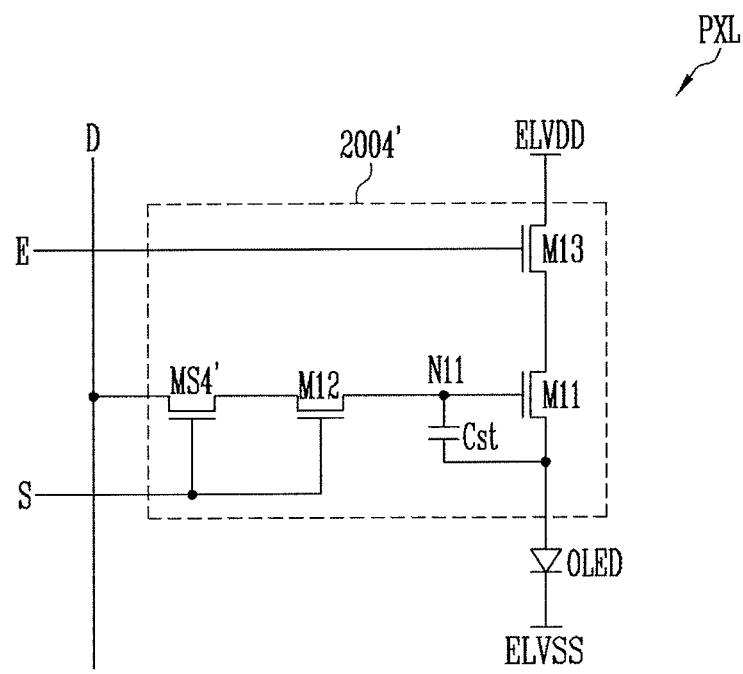

FIGS. 14A and 14B illustrate additional embodiments of a pixel PXL which includes a pixel circuit 2004' and an organic light emitting diode OLED. An anode electrode of the organic light emitting diode OLED is coupled to the pixel circuit 2004', and a cathode electrode of the organic light emitting diode OLED is coupled to the second driving power source ELVSS. The organic light emitting diode OLED generates light with a predetermined luminance corresponding to the current supplied from the pixel circuit 2004'.

The pixel circuit 2004' controls the amount of current flowing from the first driving power source ELVDD to the second driving power source ELVSS, via the organic light emitting diode OLED, based on the data signal.

The pixel circuit 2004' includes a fourth stabilizing transistor MS4' located on a current path between the data line D and the eleventh node N11. For example, the fourth stabilizing transistor MS4' may be located between the twelfth transistor M12 and the eleventh node N11 or between the data line D and the twelfth transistor M12.

A gate electrode of the fourth stabilizing transistor MS4' is coupled to the scan line S. The fourth stabilizing transistor MS4' is turned on when the scan signal is supplied to the scan line S and turned off when the scan signal is not supplied. That is, the fourth stabilizing transistor MS4' is turned on or turned off simultaneously with the twelfth transistor M12.

An operating process of the pixel PXL will be described with reference to FIGS. 13, 14A, and 14B. First, the light emitting control signal is supplied to the light emitting control line E such that the thirteenth transistor M13 is turned off. If the thirteenth transistor M13 is turned off, the pixel PXL is set to the non-light emitting state.

After that, the scan signal is supplied to the scan line S such that the twelfth transistor M12 and the fourth stabilizing transistor MS4' are turned on. If the twelfth transistor m12 and the fourth stabilizing transistor MS4' are turned on, the data line D and the eleventh node N11 are electrically coupled to each other. Then, the data signal from the data line D is supplied to the eleventh node N11. Accordingly, a voltage corresponding to the data signal is stored in the storage capacitor Cst.

The supply of the light emitting control signal to the light emitting control line E is stopped after the voltage corresponding to the data signal is stored in the storage capacitor Cst. If the supply of the light emitting control signal to the light emitting control line E is stopped, the thirteenth transistor M13 is turned on. If the thirteenth transistor M13 is turned on, the first driving power source ELVDD and the eleventh transistor M11 are electrically coupled to each other.

At this time, the eleventh transistor M11 controls the amount of current flowing from the first driving power source ELVDD to the second driving power source ELVSS, via the organic light emitting diode OLED, corresponding to a voltage of the eleventh node N11.

Meanwhile, the fourth stabilizing transistor MS4' maintains the turn-off state during a period in which the pixel PXL emits light. If the fourth stabilizing transistor MS4' is turned off, leakage current between the data line D and the eleventh node N11 can be reduced or minimized during the period in which the pixel PXL emits light. Accordingly, light with a desired luminance can be generated from the pixel PXL.

Figure 15A:
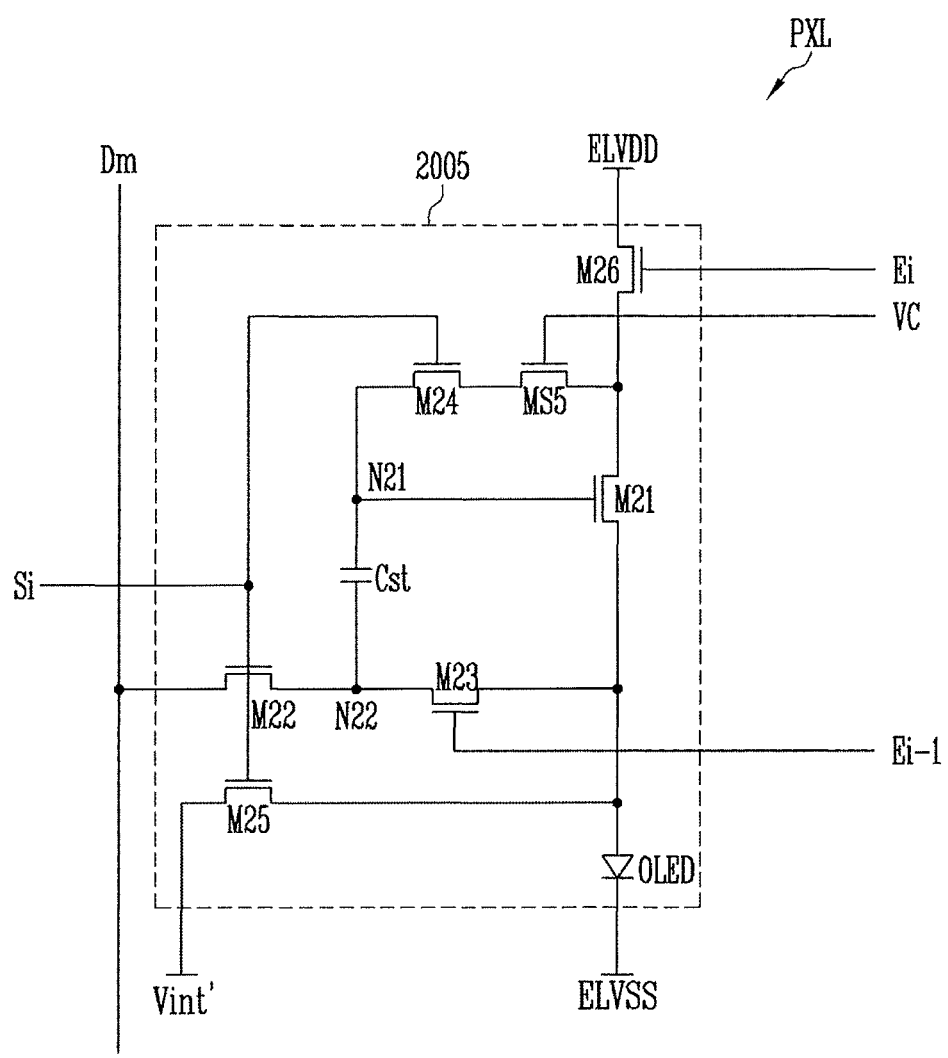
FIGS. 15A and 15B illustrate additional embodiments of a pixel.
Figure 15B:
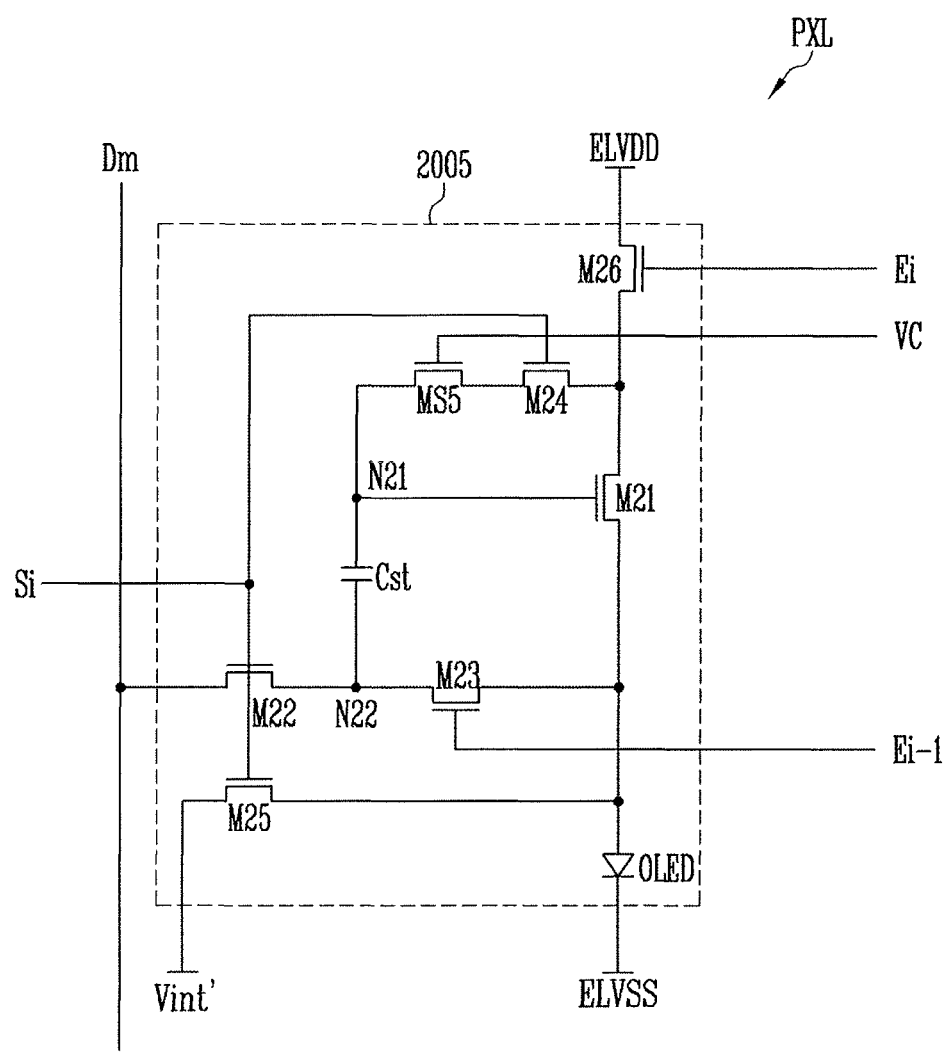

FIGS. 15A and 15B illustrates additional embodiments of a pixel PXL located on an ith horizontal line and coupled to an mth data line Dm. Referring to FIGS. 15A and 15B, the pixel PXL includes an organic light emitting diode OLED and a pixel circuit 2005 for controlling the amount of current supplied to the organic light emitting diode OLED. An anode electrode of the organic light emitting diode OLED. Is coupled to the pixel circuit 2005, and a cathode electrode of the organic light emitting diode OLED is coupled to the second driving power source ELVSS. The organic light emitting diode OLED generates light with a predetermined luminance corresponding to the amount of current supplied from the pixel circuit 2005.

The pixel circuit 2005 controls the amount of current flowing from the first driving power source ELVDD to the second driving power source ELVSS via the organic light emitting diode OLED, corresponding to a data signal. To this end, the pixel circuit 2005 includes twenty-first to twenty-sixth transistors M21 to M26, a fifth stabilizing transistor MS5, and a storage capacitor Cst.

A first electrode of the twenty-first transistor (driving transistor) M21 is coupled to the first driving power source ELVDD via the twenty-sixth transistor M26, and a second electrode of the twenty-first transistor M21 is coupled to the anode electrode of the organic light emitting diode OLED. In addition, a gate electrode of the twenty-first transistor M21 is coupled to a twenty-first node N21. The twenty-first transistor M21 controls the amount of current flowing from the first driving power source ELVDD to the second driving power source ELVSS via the organic light emitting diode OLED, corresponding to a voltage of the twenty-first node N21.

The twenty-second transistor M22 is coupled between a data line Dm and a twenty-second node N22. In addition, a gate electrode of the twenty-second transistor M22 is coupled to an ith scan line Si. The twenty-second transistor M22 is turned on when a scan signal is supplied to the ith scan line Si.

The twenty-third transistor M23 is coupled between the twenty-second node N22 and the anode electrode of the organic light emitting diode OLED. In addition, a gate electrode of the twenty-third transistor M23 is coupled to an (i−1)th light emitting control line Ei−1. The twenty-third transistor M23 is turned off when a light emitting control signal is supplied to the (i−1)th light emitting control line Ei−1, and turned on when the light emitting control signal is not supplied.

The twenty-fourth transistor M24 is coupled between the twenty-first node N21 and the first electrode of the twenty-first transistor M21. In addition, a gate electrode of the twenty-fourth transistor M24 is coupled to the ith scan line Si. The twenty-fourth transistor M24 is turned on when the scan signal is supplied to the ith scan line Si.

The fifth stabilizing transistor MS5 is located on a current path between the twenty-first node N21 and the first electrode of the twenty-first transistor M21. For example, the fifth stabilizing transistor MS5 may be located between the twenty-fourth transistor M24 and the first electrode of the twenty-first transistor M21 or between the twenty-first node N21 and the twenty-fourth transistor M24.

The fifth stabilizing transistor MS5 is formed as an oxide semiconductor transistor. Thus, if the fifth stabilizing transistor MS5 is turned off, leakage current between the twenty-first node N21 and the first electrode of the twenty-first transistor M21 is reduced or minimized. Accordingly, an image with a desired luminance can be implemented in the pixel PXL.

The twenty-fifth transistor M25 is coupled between a first power source Vint' and the anode electrode of the organic light emitting diode OLED. In addition, a gate electrode of the twenty-fifth transistor M25 is turned on when the scan signal is supplied to the ith scan line Si. In addition, a voltage of the first power source Vint' is set such that the organic light emitting diode OLED is turned off.

The twenty-sixth transistor M26 is coupled between the first driving power source ELVDD and the first electrode of the twenty-first transistor M21. In addition, a gate electrode of the twenty-sixth transistor M26 is coupled to an ith light emitting control line Ei. The twenty-sixth transistor M26 is turned off when the light emitting control signal is supplied to the ith light emitting control line Ei, and turned on when the light emitting control signal is not supplied.

The storage capacitor Cst is coupled between the twenty-first node N21 and the twenty-second node N22 that is a common node between the twenty-second transistor M22 and the twenty-third transistor M23. The storage capacitor Cst stores a voltage corresponding to the data signal and a threshold voltage of twenty-first transistor M21.

Meanwhile, in the pixel PXL of the present embodiment, the twenty-first to twenty-sixth transistors M21 to M26 are N-type poly-silicon semiconductor transistors. As described above, if the twenty-first to twenty-sixth transistors M21 to M26 are N-type poly-silicon semiconductor transistors, fast driving characteristics can be ensured.

Figure 16:
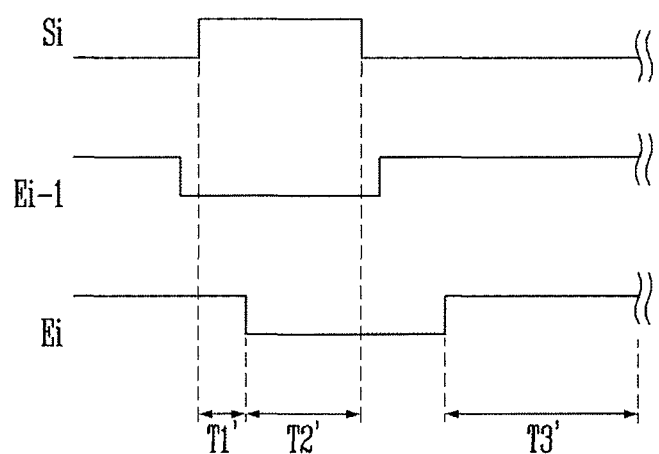
FIG. 16 illustrates another embodiment of a method for driving a pixel.

FIG. 16 illustrates another embodiment of a method for driving a pixel, for example, as shown in FIGS. 15A and 15B. Referring to FIG. 16, during a first period T1', the light emitting control signal is supplied to the (i−1)th light emitting control line Ei−1, and the scan signal is supplied to the ith scan line S1.

If the light emitting control signal is supplied to the (i−1)th light emitting control line Ei−1, the twenty-third transistor M23 is turned off. If the twenty-third transistor M23 is turned off, the twenty-second node N22 and the anode electrode of the organic light emitting diode OLED are electrically interrupted.

If the scan signal is supplied to the ith scan line Si, the twenty-second transistor M22, the twenty-fourth transistor M24, and the twenty-fifth transistor M25 are turned on. If the twenty-second transistor M22 is turned on, the data line Dm and the twenty-second node N22 are electrically coupled to each other. Then, the data signal from the data line Dm is supplied to the twenty-second node N22.

If the twenty-fourth transistor M24 is turned on, the twenty-first node N21 and the first electrode of the twenty-first transistor M21 are electrically coupled to each other. At this time, the twenty-first node N21 is initialized to the voltage of the first driving power source ELVDD. In addition, if the twenty-fourth transistor M24 is turned on, the twenty-first transistor M21 is diode-coupled.

If the twenty-fifth transistor M25 is turned on, the voltage of the first power source Vint' is supplied to the anode electrode of the organic light emitting diode OLED. Accordingly, the anode electrode of the organic light emitting diode OLED is initialized to the voltage of the first power source Vint'. At this time, the organic light emitting diode OLED is set to the non-light emitting state.

During a second period T2', the light emitting control signal is supplied to the ith light emitting control line Ei, and accordingly, the twenty-sixth transistor M26 is turned off. If the twenty-sixth transistor M26 is turned off, the first driving power source ELVDD and the first electrode of the twenty-first transistor M21 are electrically interrupted.

At this time, since the second electrode of the twenty-first transistor M21 is set to the voltage of the first power source Vint', the twenty-first node N21 is set to a voltage obtained by adding a threshold voltage of the twenty-first transistor M21 to the voltage of the first power source Vint'. In addition, during the second period T2', the twenty-second node N22 is set to the voltage of the data signal. Thus, during the second period T2', the storage capacitor Cst stores the voltage corresponding to the data signal and the threshold voltage of the twenty-first transistor M21.

During a third period T3', the supply of the light emitting control signal to the (i−1)th light emitting control line Ei−1 and the ith light emitting control line Ei is stopped. If the supply of the light emitting control signal to the (i−1)th light emitting control line Ei−1 is stopped, the twenty-third transistor M23 is turned on. If the twenty-third transistor M23 is turned on, the twenty-second node N22 and the anode electrode of the organic light emitting diode OLED are electrically coupled to each other.

If the supply of the light emitting control signal to the ith light emitting control line Ei is stopped, the twenty-sixth transistor M26 is turned on. If the twenty-sixth transistor M26 is turned on, the first driving power source ELVDD and the first electrode of the twenty-first transistor M21 are electrically coupled to each other.

At this time, the twenty-first transistor M21 controls the amount of current flowing from the first driving power source ELVDD to the second driving power source ELVSS via the organic light emitting diode OLED, corresponding to the voltage of the twenty-first node N21.

As described above, the pixel PXL of the present embodiment generates light with a predetermined luminance while repeating the above-described process during a period in which the organic light emitting display device is driven at the first driving frequency. In addition, during the period in which the organic light emitting display device is driven at the first driving frequency, the fifth stabilizing transistor MS5 maintains the turn-on state, and accordingly, the pixel PXL can be stably driven.

Additionally, during a period in which the organic light emitting display device is driven at the second driving frequency, the voltage corresponding to the data signal is charged in the storage capacitor Cst of each of the pixels, and the control power source VC is then set to the gate-off voltage. Then, the fifth stabilizing transistor MS5 in each of the pixels PXL is turned off. Accordingly, the leakage current between the twenty-first node N21 and the first electrode of the twenty-first transistor M21 can be reduced or minimized. That is, the pixel PXL of the present embodiment can stably generate light with a desired luminance even when the organic light emitting display device is driven at the second driving frequency.

Figure 17A:
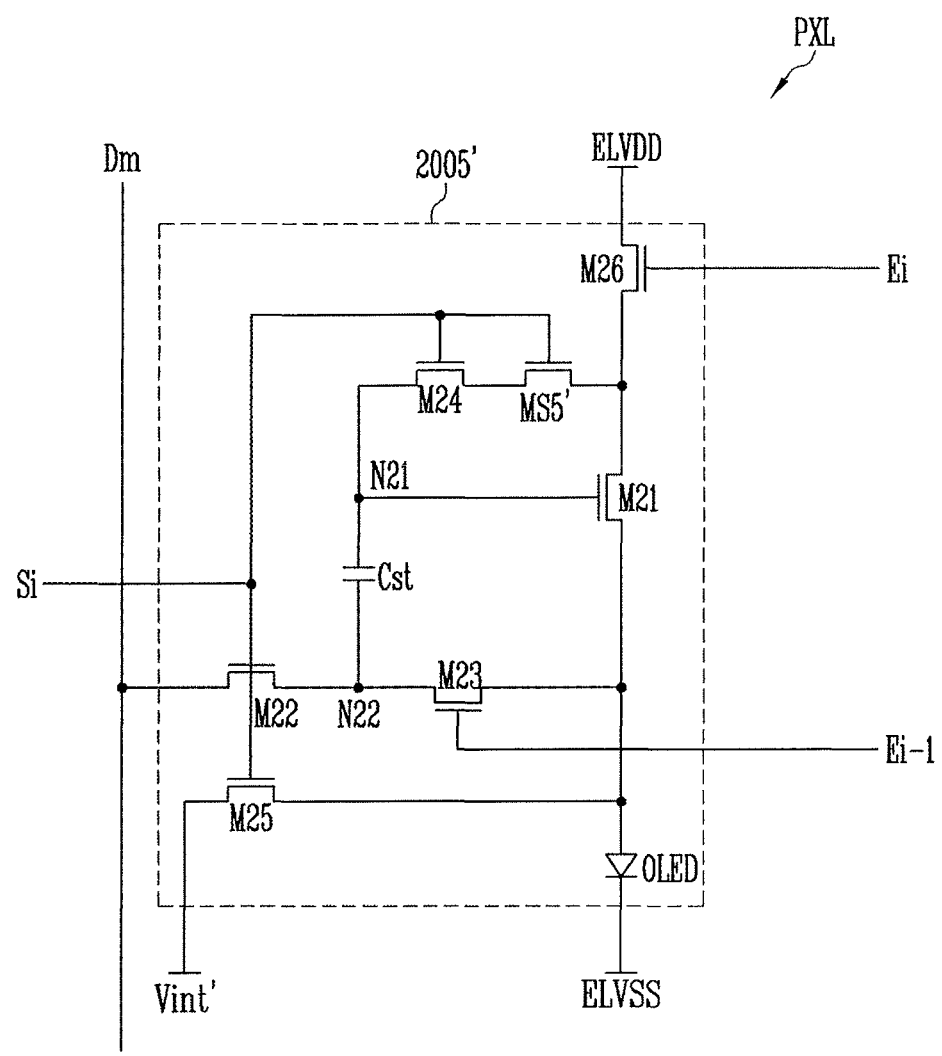
FIGS. 17A and 17B illustrate additional embodiments of a pixel.
Figure 17B:
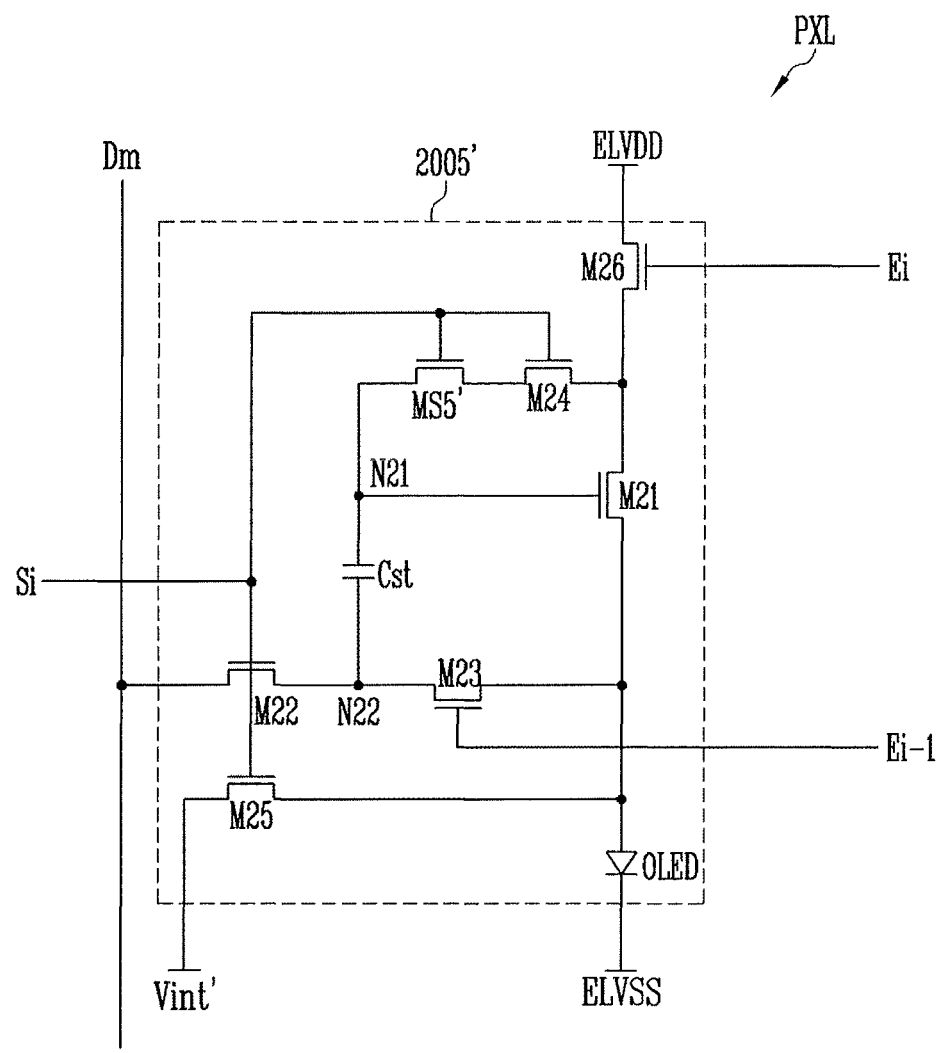

FIGS. 17A and 17B illustrate additional embodiments of a pixel PXL which includes a pixel circuit 2005' and an organic light emitting diode OLED. An anode electrode of the organic light emitting diode OLED is coupled to the pixel circuit 2005', and a cathode electrode of the organic light emitting diode OLED is coupled to the second driving power source ELVSS. The organic light emitting diode OLED generates light with a predetermined luminance corresponding to the amount of current supplied from the pixel circuit 2005'.

The pixel circuit 2005' controls the amount of current flowing from the first driving power source ELVDD to the second driving power source ELVSS, via the organic light emitting diode OLED, corresponding to the data signal.

The pixel circuit 2005' includes a fifth stabilizing transistor MS5' located on a current path between the twenty-first node N21 and the first electrode of the twenty-first transistor M21. For example, the fifth stabilizing transistor MS5' may be between the twenty-fourth transistor M24 and the first electrode of the twenty-first transistor M21 or between the twenty-first node N21 and the twenty-fourth transistor M24.

A gate electrode of the fifth stabilizing transistor MS5' is coupled to the ith scan line Si. The fifth stabilizing transistor MS5' is turned on when the scan signal is supplied to the ith scan line Si, and turned off when the scan signal is not supplied. That is, the fifth stabilizing transistor MS5' is turned on or turned off simultaneously with the twenty-fourth transistor M24.

An operating process of the pixel PXL will be described with reference to FIGS. 16, 17A, and 17B. During the first period T1', the light emitting control signal is supplied to the (i−1)th light emitting control line Ei−1, and the scan signal is supplied to the ith scan line Si.

If the light emitting control signal is supplied to the (i−1)th light emitting control line Ei−1, the twenty-third transistor M23 is turned off, and accordingly, the twenty-second node N22 and the anode electrode of the organic light emitting diode OLED are electrically interrupted.

If the scan signal is supplied to the ith scan line Si, the twenty-second transistor M22, the twenty-fourth transistor M24, the fifth stabilizing transistor MS5', and the twenty-fifth transistor M25 are turned on.

If the twenty-second transistor M22 is turned on, the data line Dm and the twenty-second node N22 are electrically coupled to each other, and accordingly, the data signal from the data line Dm is supplied to the twenty-second node N22.

If the twenty-fifth transistor M25 is turned on, the voltage of the first power source Vint' is supplied to the anode electrode of the organic light emitting diode OLED, and accordingly, the anode electrode of the organic light emitting diode OLED is initialized to the voltage of the first power source Vint'.

If the twenty-fourth transistor M24 and the fifth stabilizing transistor MS5' are turned on, the twenty-first node N21 and the first electrode of the twenty-first transistor M21 are electrically coupled to each other. At this time, the twenty-first node N21 is initialized to the voltage of the first driving power source ELVDD.

During the second period T2', the light emitting control signal is supplied to the ith light emitting control line Ei. Accordingly, the twenty-sixth transistor M26 is turned off. If the twenty-sixth transistor M26 is turned off, the first driving power source ELVDD and the first electrode of twenty-first transistor M21 are electrically interrupted.

At this time, since the second electrode of the twenty-first transistor M21 is set to the voltage of the first power source Vint', the twenty-first node N21 is set to the voltage obtained by adding the threshold voltage of the twenty-first transistor M21 to the voltage of the first power source Vint'. In addition, during the second period T2', the twenty-second node N22 is set to the voltage of the data signal. Thus, during the second period T2', the storage capacitor Cst stores the voltage corresponding to the data signal and the threshold voltage of the twenty-first transistor M21.

During the third period T3', the supply of the light emitting control signal to the (i−1)th light emitting control line Ei−1 and the ith light emitting control line Ei is stopped. If the supply of the light emitting control signal to the (i−1)th light emitting control line Ei−1 is stopped, the twenty-third transistor M23 is turned on. If the twenty-third transistor M23 is turned on, the twenty-second node N22 and the anode electrode of the organic light emitting diode OLED are electrically coupled to each other.

If the supply of the light emitting control signal to the ith light emitting control line Ei is stopped, the twenty-sixth transistor M26 is turned on. If the twenty-sixth transistor M26 is turned on, the first driving power source ELVDD and the first electrode of the twenty-first transistor M21 are electrically coupled to each other.

At this time, the twenty-first transistor M21 controls the amount of current flowing from the first driving power source ELVDD to the second driving power source ELVSS via the organic light emitting diode OLED, corresponding to the voltage of the twenty-first node N21.

Meanwhile, the fifth stabilizing transistor MS5' maintains the turn-off state during a period in which the pixel PXL emits light. If the fifth stabilizing transistor MS5' is turned off, leakage current between the twenty-first node N21 and the first electrode of the twenty-first transistor M21 is reduced or minimized during the period in which the pixel PXL emits light. Accordingly, light with a desired luminance can be generated from the pixel PXL.

Figure 18A:
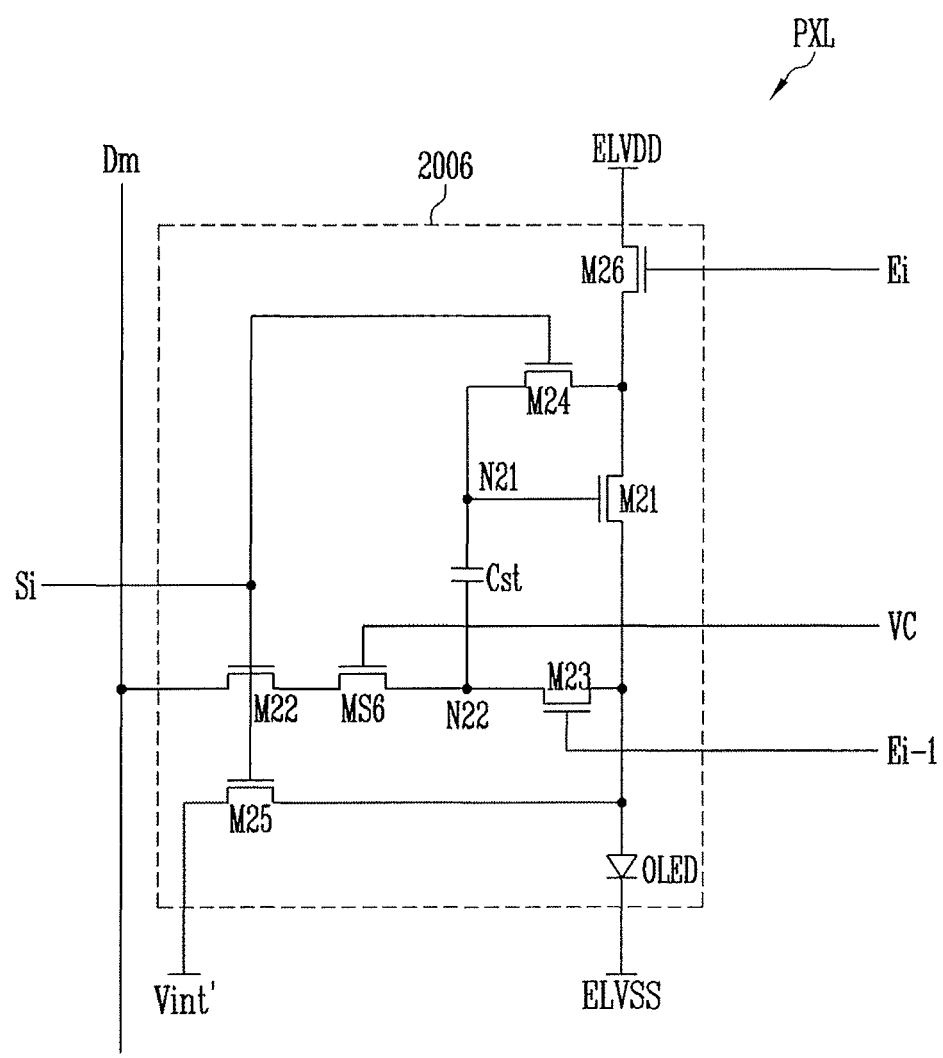
FIGS. 18A and 18B illustrate additional embodiments of a pixel.
Figure 18B:
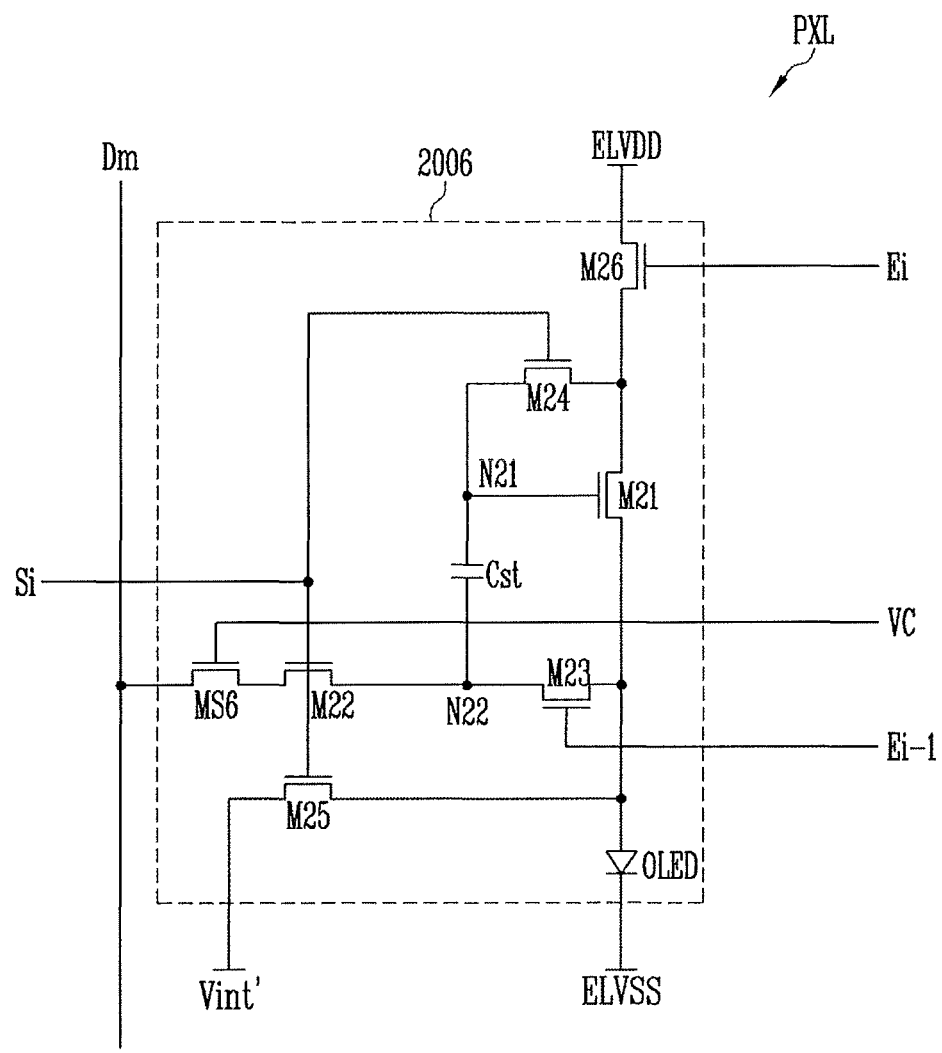

FIGS. 18A and 18B illustrate additional embodiments of a pixel PXL which includes a pixel circuit 2006 and an organic light emitting diode OLED. An anode electrode of the organic light emitting diode OLED is coupled to the pixel circuit 2006, and a cathode electrode of the organic light emitting diode OLED is coupled to the second driving power source ELVSS. The organic light emitting diode OLED generates light with a predetermined luminance corresponding to the amount of current supplied from the pixel circuit 2006.

The pixel circuit 2006 includes a sixth stabilizing transistor MS6 located on a current path between the data line Dm and the twenty-second node N22. For example, the sixth stabilizing transistor MS6 may be located between the twenty-second transistor M22 and the twenty-second node N22 or between the data line Dm and the twenty-second transistor M22.

A gate electrode of the sixth stabilizing transistor MS6 is coupled to the control power source VC. The sixth stabilizing transistor MS6 maintains the turn-on state when the organic light emitting display device is driven at the first driving frequency. At this time, an operating process of the pixel PXL is the same as described with reference to FIGS. 15A to 16.

Meanwhile, the sixth stabilizing transistor MS6 is turned off during a period in which the organic light emitting display device is driven at the second driving frequency, i.e., a period in which the organic light emitting display device is driven at a low frequency. The voltage of the control power source VC is set to the gate-on voltage during a period when the data signal is supplied to each of the pixels PXL. Accordingly, the voltage of the data signal is normally supplied to each of the pixels PXL.

After the data signal is supplied to each of the pixels PXL, the voltage of the control power source VC is set to the gate-off voltage. Accordingly, the sixth stabilizing transistor MS6 is turned off.

If the sixth stabilizing transistor MS6 is turned off, leakage current between the data line Dm and the twenty-second node N22 is reduced or minimized. Accordingly, an image with a desired luminance can be displayed. In an embodiment of the present disclosure, the sixth stabilizing transistor MS6 is formed as an oxide semiconductor transistor, and accordingly, the leakage current can be reduced or minimized.

Figure 20A:
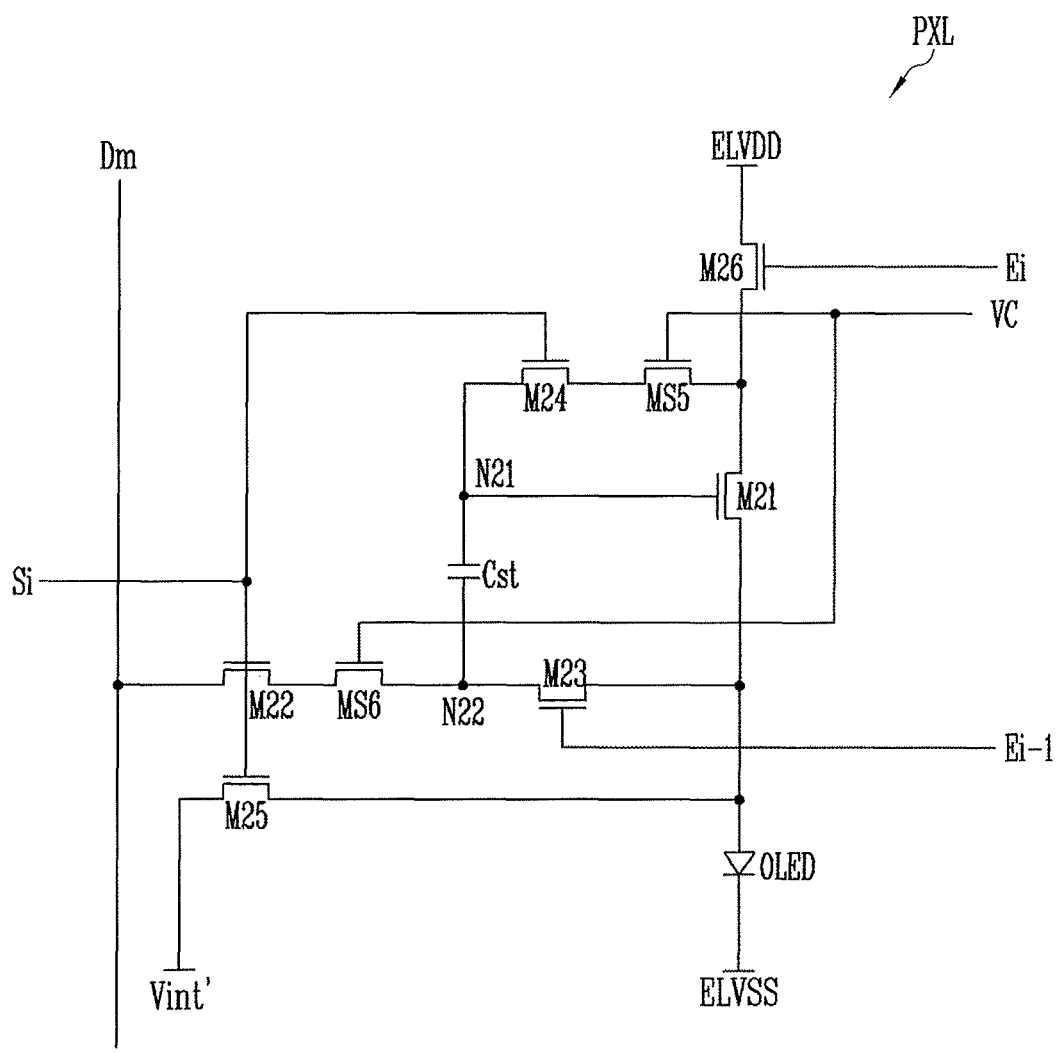
FIGS. 20A to 20D illustrate additional embodiments of a pixel.
Figure 20B:
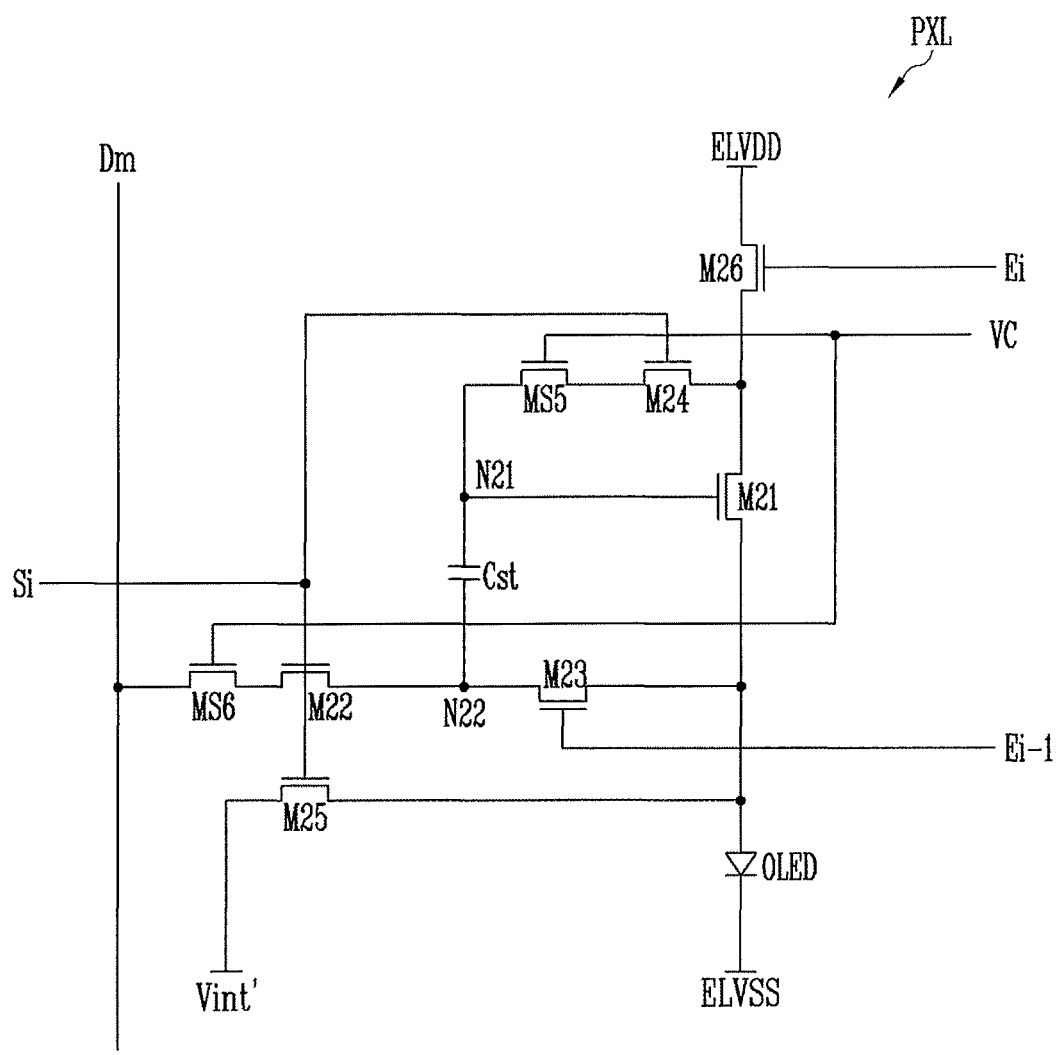

Meanwhile, in FIGS. 18A and 18B, it has been illustrated that the fifth stabilizing transistor MS5 is removed as compared with FIGS. 15A and 15B, but the present disclosure is not limited thereto. For example, as shown in FIGS. 20A and 20B, the fifth stabilizing transistor MS5 and the sixth stabilizing transistor MS6 may be included in the pixel PXL.

Figure 19A:
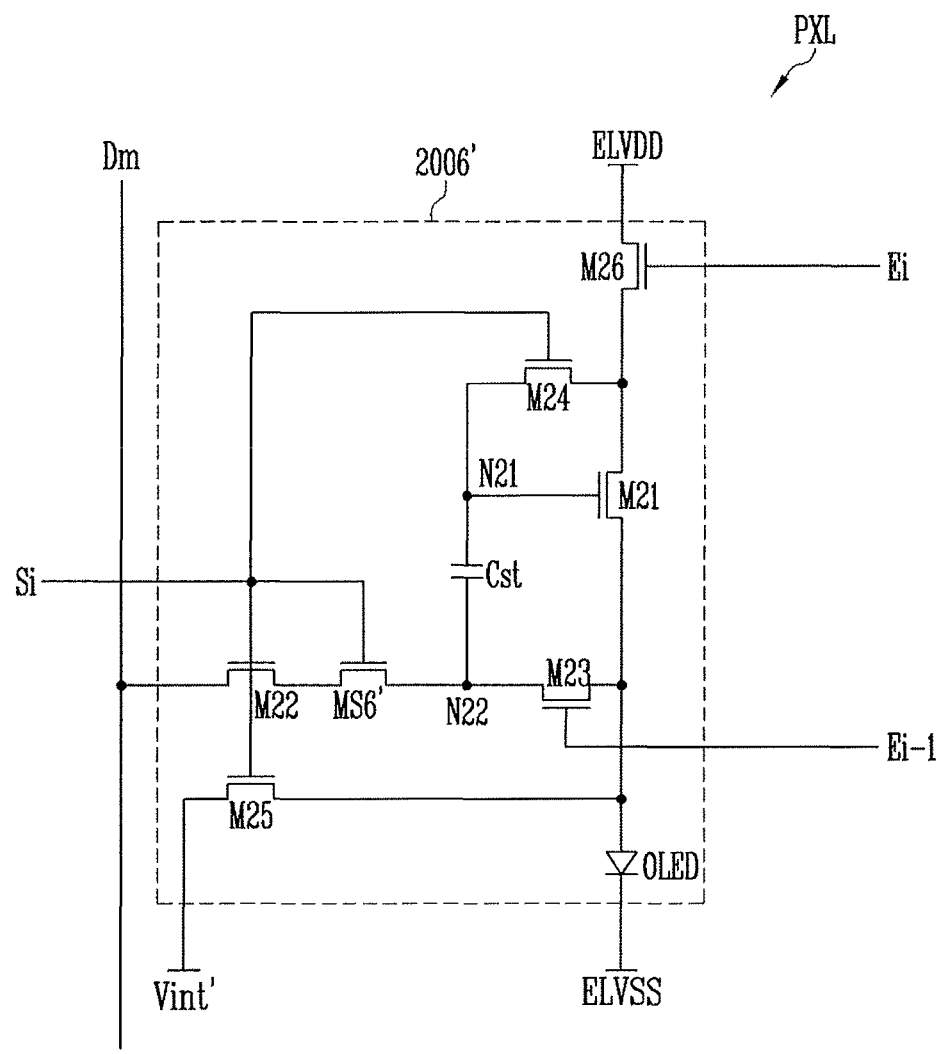
FIGS. 19A and 19B illustrate additional embodiments of a pixel.
Figure 19B:
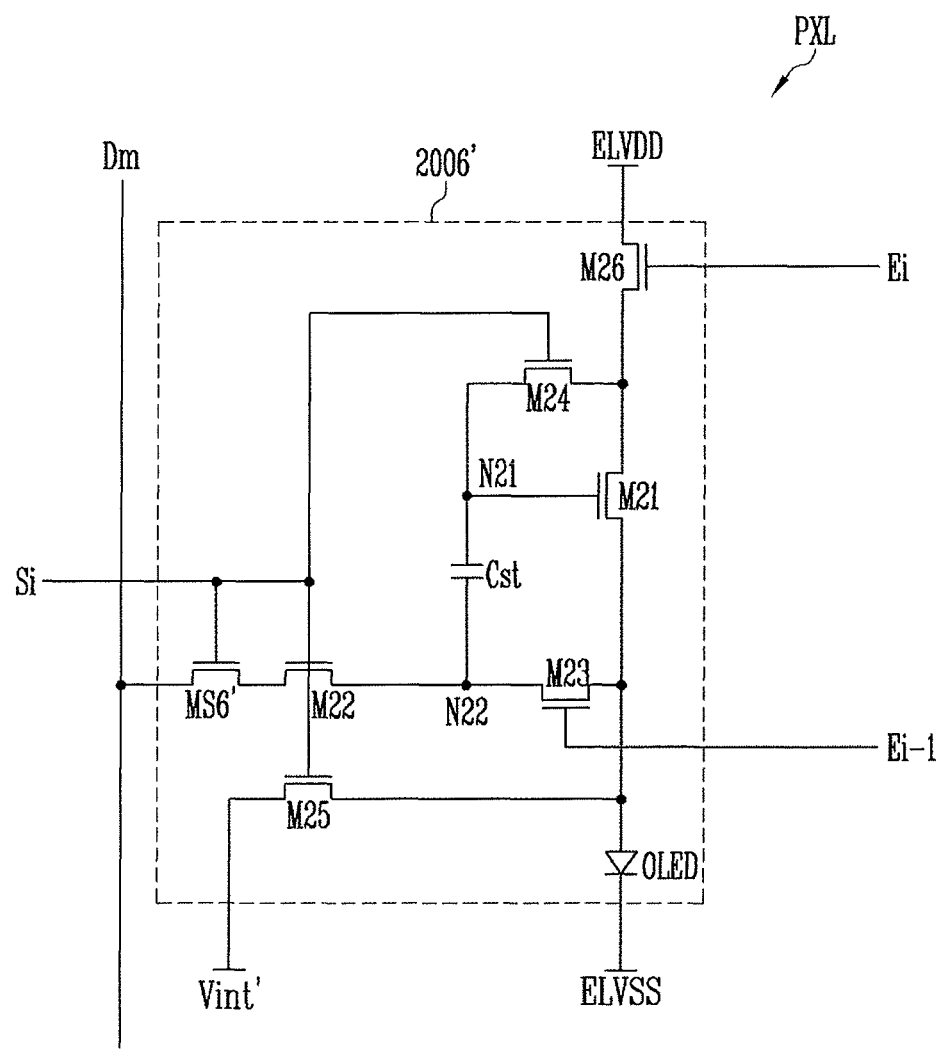

FIGS. 19A and 19B illustrate additional embodiments of a pixel PXL which includes a pixel circuit 2006' and an organic light emitting diode OLED. An anode electrode of the organic light emitting diode OLED is coupled to the pixel circuit 2006', and a cathode electrode of the organic light emitting diode OLED is coupled to the second driving power source ELVSS. The organic light emitting diode OLED generates light with a predetermined luminance corresponding to the amount of current supplied from the pixel circuit 2006'.

The pixel circuit 2006' controls the amount of current flowing from the first driving power source ELVDD to the second driving power source ELVSS, via the organic light emitting diode OLED, corresponding to the data signal.

The pixel circuit 2006' includes a sixth stabilizing transistor MS6' on a current path between the data line Dm and the twenty-second node N22. For example, the sixth stabilizing transistor MS6' may be between the twenty-second transistor M22 and the twenty-second node N22 or between the data line Dm and twenty-second transistor M22.

A gate electrode of the sixth stabilizing transistor MS6' is coupled to the ith scan line Si. The sixth stabilizing transistor MS6' is turned on when the scan signal is supplied to the ith scan line Si, and turned off when the scan signal is not supplied. An operating process of the pixel PXL is the same as described for FIGS. 16, 17A, and 17B.

If the sixth stabilizing transistor MS6' is turned off, leakage current between the data line Dm and the twenty-second node N22 is reduced or minimized. Accordingly, an image with a desired luminance can be displayed. In the present embodiment, the sixth stabilizing transistor MS6' is formed as an oxide semiconductor transistor, and accordingly, the leakage current can be reduced or minimized.

Figure 20C:
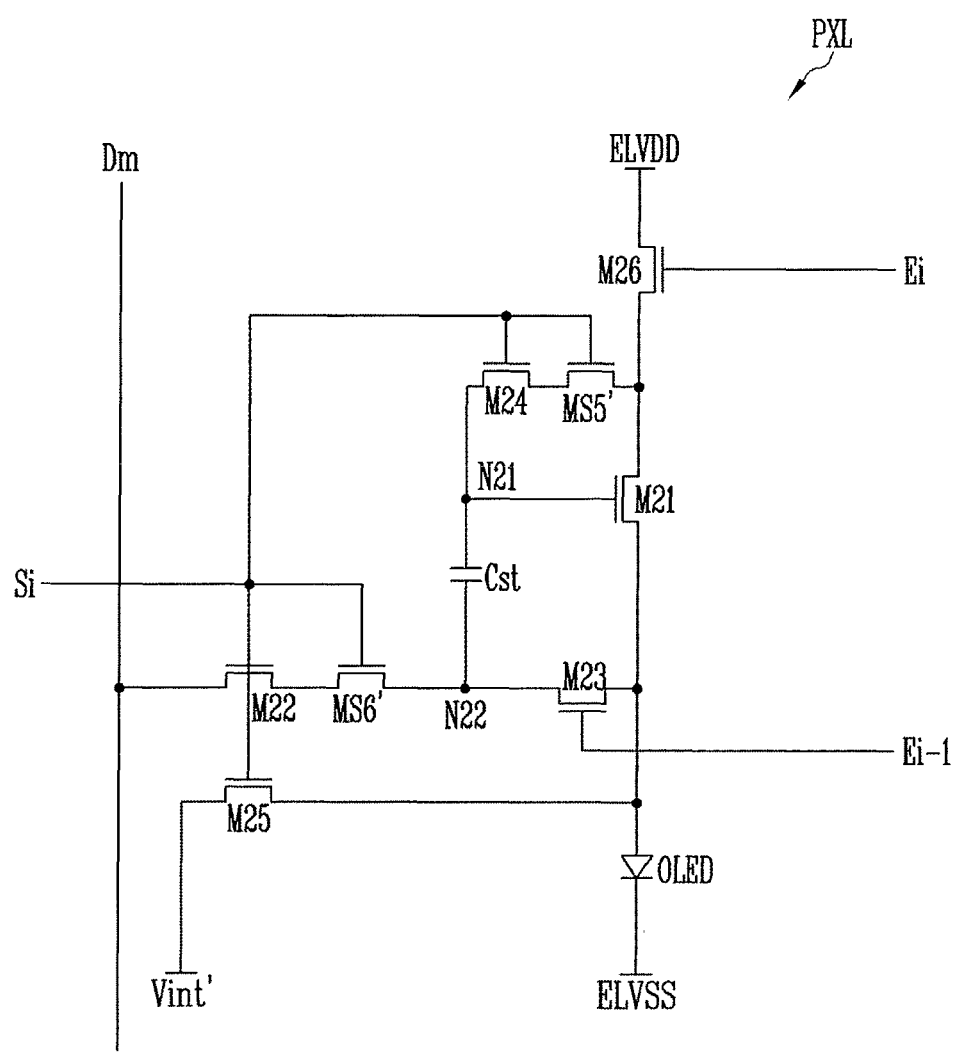
Figure 20D:
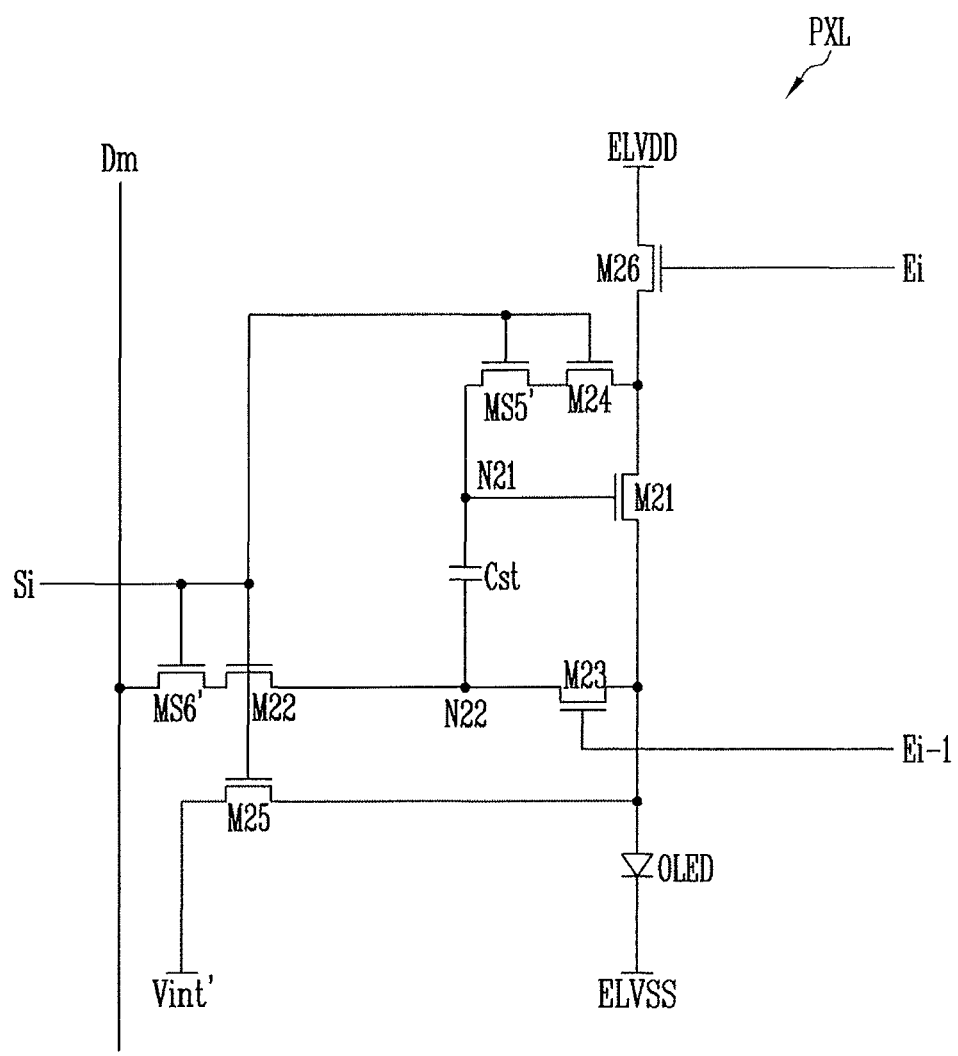

Meanwhile, in FIGS. 19A and 19B, it has been illustrated the fifth stabilizing transistor MS5' is removed as compared with FIGS. 17A and 17B. In one embodiment, as shown in FIGS. 20C and 20D, the fifth stabilizing transistor MS5' and the sixth stabilizing transistor MS6' may be in the pixel PXL.

Figure 21A:
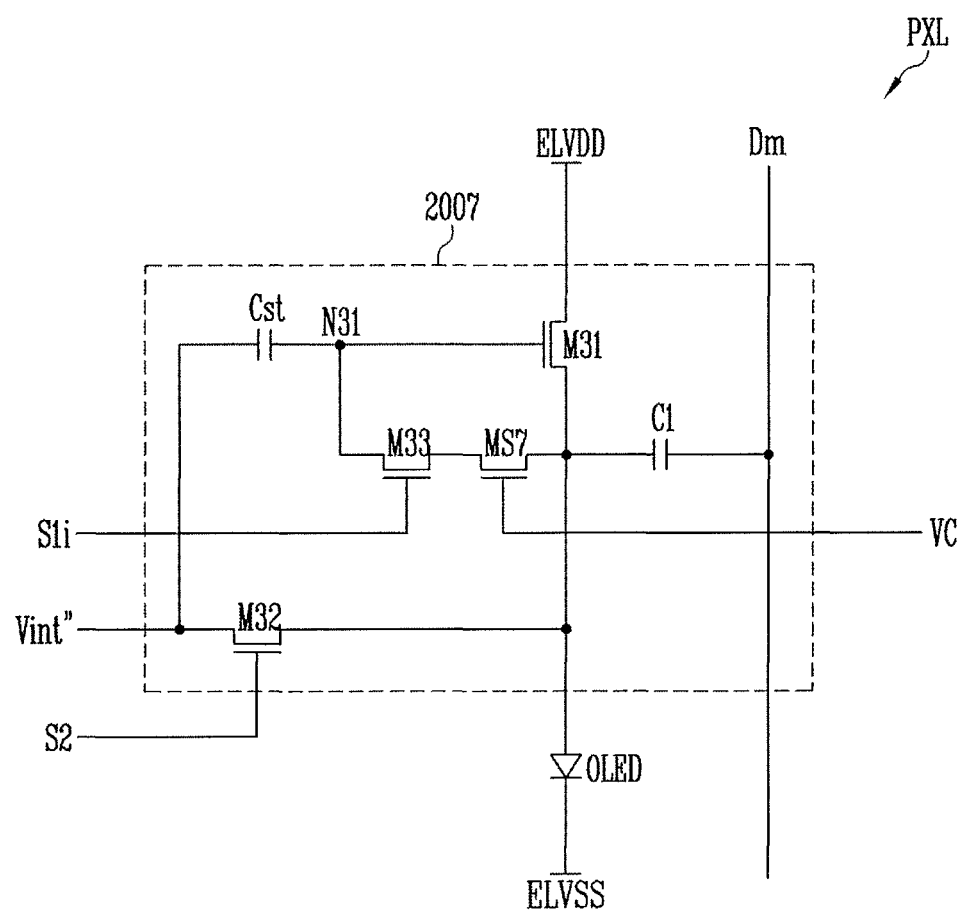
FIGS. 21A and 21B illustrate additional embodiments of a pixel.
Figure 21B:
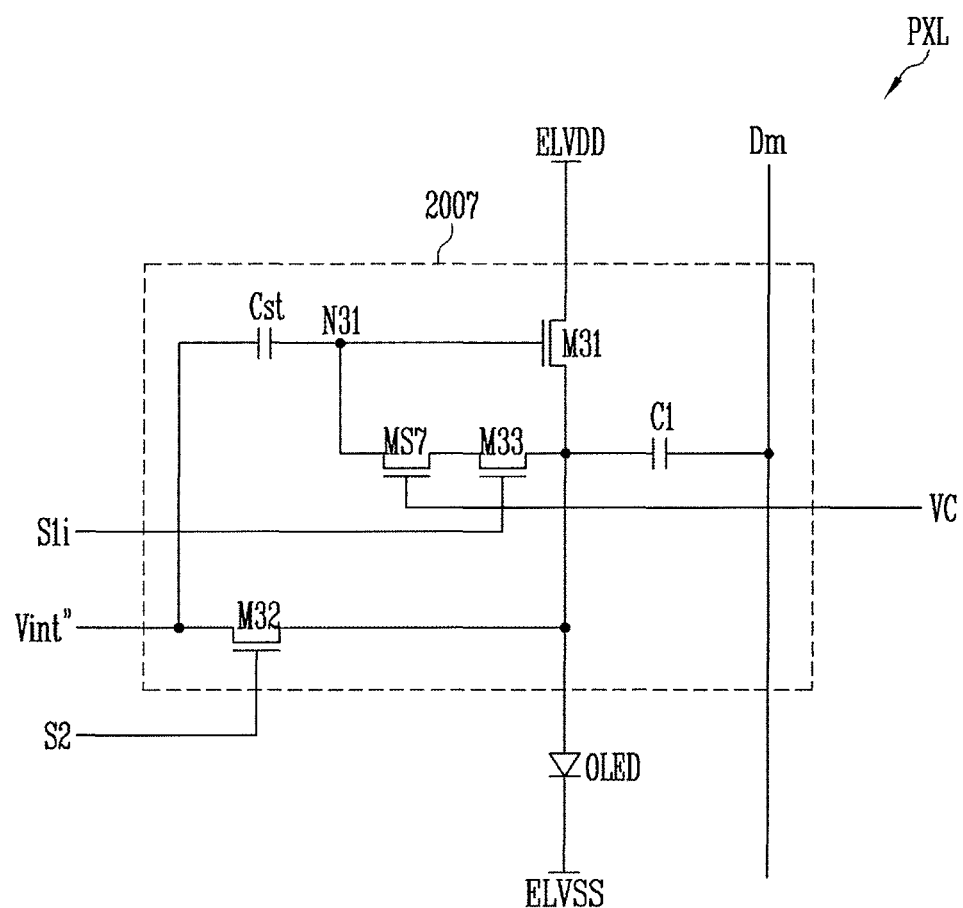

FIGS. 21A and 21B illustrate additional embodiments of a pixel PXL located on an ith horizontal line and coupled to an mth data line Dm. Referring to FIGS. 21A and 21B, the pixel PXL includes an organic light emitting diode OLED and a pixel circuit 2007 for controlling the amount of current supplied to the organic light emitting diode OLED. An anode electrode of the organic light emitting diode OLED is coupled to the pixel circuit 2007, and a cathode electrode of the organic light emitting diode OLED is coupled to the second driving power source ELVSS. The organic light emitting diode OLED generates light with a predetermined luminance corresponding to the amount of current supplied from the pixel circuit 2007.

The pixel circuit 2007 controls the amount of current flowing from the first driving power source ELVDD to the second driving power source ELVSS via the organic light emitting diode OLED, corresponding to a data signal. To this end, the pixels circuit 2007 includes thirty-first to thirty-third transistors M31 to M33, a seventh stabilizing transistor MS7, a storage capacitor Cst, and a first capacitor C1.

A first electrode of the thirty-first transistor (or driving transistor) M31 is coupled to the first driving power source ELVDD, and a second electrode of the thirty-first transistor M31 is coupled to the anode electrode of the organic light emitting diode OLED. In addition, a gate electrode of the thirty-first transistor M31 is coupled to a thirty-first node N31. The thirty-first transistor M31 controls the amount of current flowing from the first driving power source ELVDD to the second driving power source ELVSS via the organic light emitting diode OLED, corresponding to a voltage of the thirty-first node N31.

The thirty-second transistor M32 is coupled between a first power source Vint" and the anode electrode of the organic light emitting diode OLED. In addition, a gate electrode of the thirty-second transistor M32 is coupled to a second scan line S2. The thirty-second transistor M32 is turned on when a second scan signal is supplied to the second scan line S2.

Here, the first power source Vint" repeats a low voltage and a high voltage during one frame period. The low voltage of the first power source Vint" is set to a voltage value such that the organic light emitting diode OLED can be turned off. Also, the low voltage of the first power source Vint" is set to a voltage higher than a low voltage of the first driving power source ELVDD. In addition, the second scan line S2 is commonly coupled to all of the pixels PXL. That is, in one embodiment, the pixel PXL may be driven in a simultaneous light emitting scheme.

The thirty-third transistor M33 is coupled between the thirty-first node N31 and the second electrode of the thirty-first transistor M31. Agate electrode of the thirty-third transistor M33 is coupled to an ith first scan line S1i. The thirty-third transistor M33 is turned on when a first scan signal is supplied to the ith first scan line S1i.

The seventh stabilizing transistor MS7 is located on a current path between the thirty-first node N31 and the second electrode of the thirty-first transistor M31. For example, the seventh stabilizing transistor MS7 may be between the thirty-third transistor M33 and the second electrode of the thirty-first transistor M31 or between the thirty-first node N31 and the thirty-third transistor M33.

A gate electrode of the seventh stabilizing transistor MS7 is coupled to the control power source VC. The seventh stabilizing transistor MS7 is turned on or turned off corresponding to the voltage of the control power source VC.

The seventh stabilizing transistor MS7 is formed as an oxide semiconductor transistor. Thus, if the seventh stabilizing transistor MS7 is turned off, leakage current between the thirty-first node N31 and the second electrode of the thirty-first transistor M31 is reduced or minimized. Accordingly, an image with a desired luminance can be implemented in the pixel PXL.

The storage capacitor Cst is coupled between the first power source Vint" and the thirty-first node N31. The storage capacitor Cst stores a voltage corresponding to the data signal and a threshold voltage of the thirty-first transistor M31.

The first capacitor C1 is coupled between the data line Dm and the second electrode of the thirty-first transistor M31. The first capacitor C1 controls a voltage of the second electrode of the thirty-first transistor M31 based on a voltage of data line Dm.

Meanwhile, in the pixel PXL of the present embodiment, the thirty-first to thirty-third transistors M31 to M33 are N-type poly-silicon semiconductor transistors. As described above, if the thirty-first to thirty-third transistors M31 to M33 are formed as poly-silicon semiconductor transistors, fast driving characteristics can be ensured.

Figure 22:
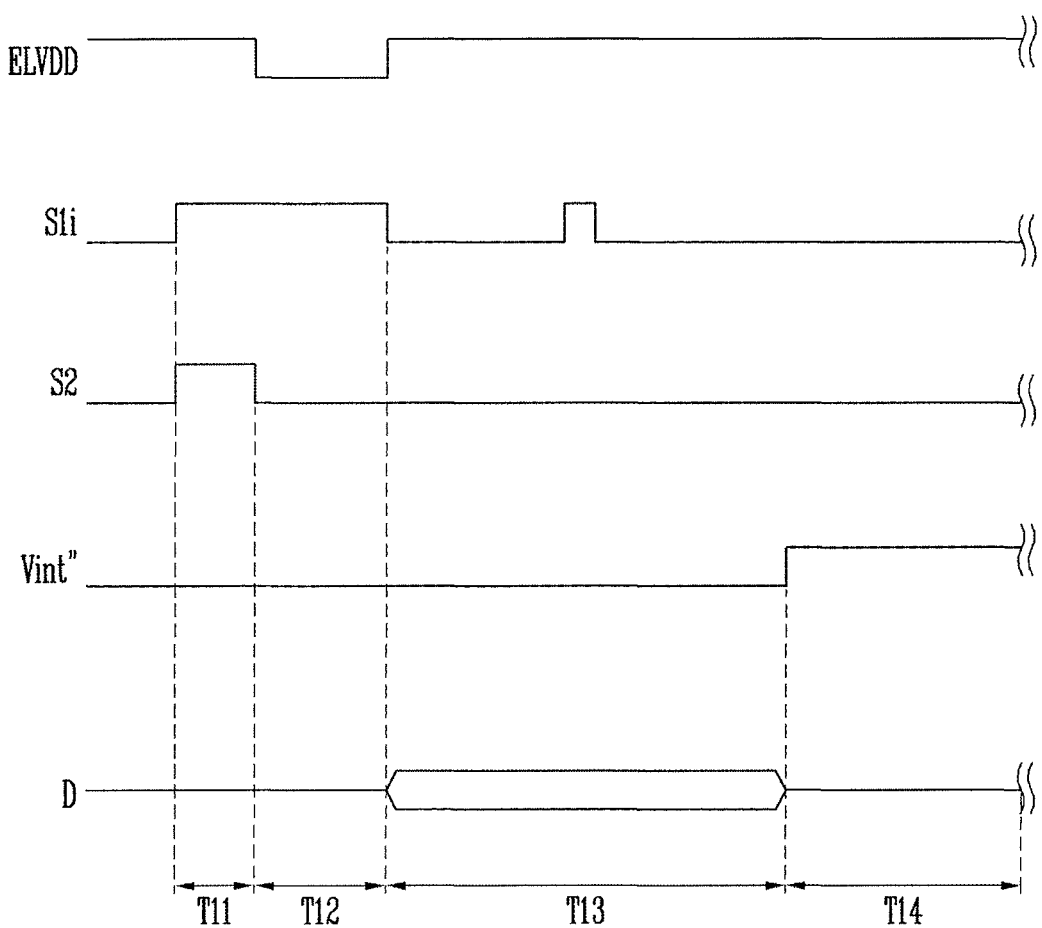
FIG. 22 illustrates another embodiment of a method for driving a pixel.

FIG. 22 illustrate another embodiment of a method for driving the pixel in FIGS. 21A and 21B. Referring to FIG. 22, during an eleventh period T11, the first scan signal is supplied to the ith first scan line S1i, and the second scan signal is supplied to the second scan line S2. If the second scan signal is supplied to the second scan line S2, the thirty-second transistor M32 is turned on. If the thirty-second transistor M32 is turned on, a voltage of the first power source Vint" is supplied to the anode electrode of the organic light emitting diode OLED. At this time, the organic light emitting diode OLED is set to the non-light emitting state.

If the first scan signal is supplied to the ith first scan line S1i, the thirty-third transistor M33 is turned on. If the thirty-third transistor M33 is turned on, the thirty-first node N31 and the second electrode of the thirty-first transistor M31 are electrically coupled to each other. At this time, the thirty-first node N31 is initialized to the voltage of the first power source Vint".

During a twelfth period T12, the first driving power source ELVDD drops to a low voltage, and simultaneously, the supply of the second scan signal to the second scan line S2 is stopped. If the supply of the second scan signal to the second scan line S2 is stopped, the thirty-second transistor M32 is turned off.

If the first driving power source ELVDD drops to the low voltage, current is supplied from the anode electrode of the organic light emitting diode OLED (i.e., the voltage of the first power source Vint") to the first driving power source ELVDD by the diode-coupled thirty-first transistor M31. Thus, the thirty-first node N31 is finally set to a voltage obtained by adding the threshold voltage of the thirty-first transistor M31 to the low voltage of the first driving power source ELVDD. That is, the threshold voltage of the thirty-first transistor M31 is compensated during the twelfth period T12. The storage capacitor Cst stores a voltage of the thirty-first node N31 during the twelfth period T12.

During a thirteenth period T13, the first driving power source ELVDD is set to a high voltage. In addition, the first scan signal is sequentially supplied to the first scan lines S1 during the thirteenth period T13. If the first scan signal is supplied to the ith first scan line S1i, the thirty-third transistor M33 is turned on. If the thirty-third transistor M33 is turned on, the voltage of the thirty-first node N31 is changed corresponding to a voltage of the data signal supplied to the data line Dm. That is, the voltage of the thirty-first node N31 is changed corresponding to the voltage of the data signal during the thirteenth period T13. In this case, the voltage corresponding to the threshold voltage of the thirty-first transistor M31 and the data signal is stored in the storage capacitor Cst.

During a fourteenth period T14, the first power source Vint" is set to a high voltage. If the first power source Vint" is set to the high voltage, the voltage of the thirty-first node N31 is increased by coupling of the storage capacitor Cst. The thirty-first transistor M31 controls the amount of current flowing from the first driving power source ELVDD to the second driving power source ELVSS via the organic light emitting diode OLED, corresponding to the voltage of the thirty-first node N31.

As described above, the pixel PXL of the present embodiment generates light with a predetermined luminance while repeating the above-described process during a period in which the organic light emitting display device is driven at the first driving frequency. In addition, the seventh stabilizing transistor MS7 maintains the turn-on state during the period in which the organic light emitting display device is driven at the first driving frequency. Accordingly, the pixel PXL can be stably driven.

Additionally, during a period in which the organic light emitting display device is driven at the second driving frequency, the voltage corresponding to the data signal is charged in the storage capacitor Cst of each of the pixels PXL, and the control power source VC is then set to the gate-off voltage. Then, the seventh stabilizing transistor MS7 included in each of the pixels PXL is turned off. Accordingly, the leakage current between the thirty-first node N31 and the second electrode of the thirty-first transistor M31 can be reduced or minimized. That is, the pixel PXL of the present embodiment can stably generate light with a desired luminance even when the organic light emitting display device is driven at the second driving frequency.

Figure 23A:
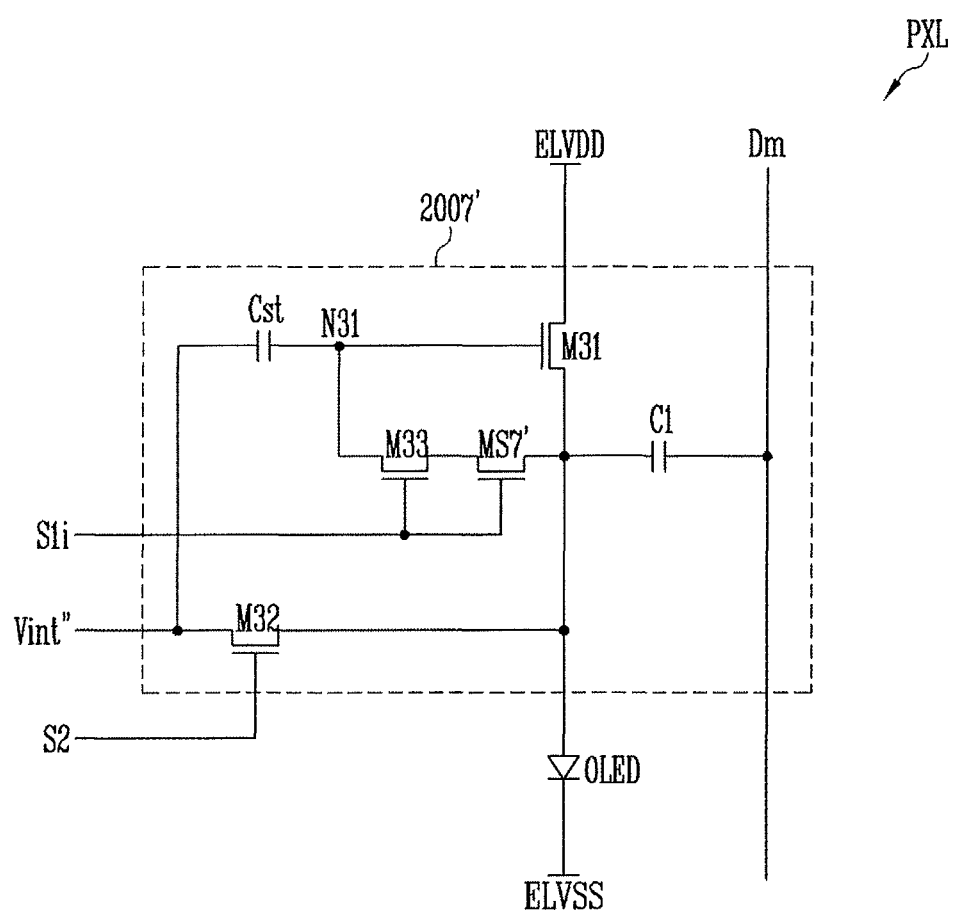
FIGS. 23A and 23B illustrate additional embodiments of a pixel.
Figure 23B:
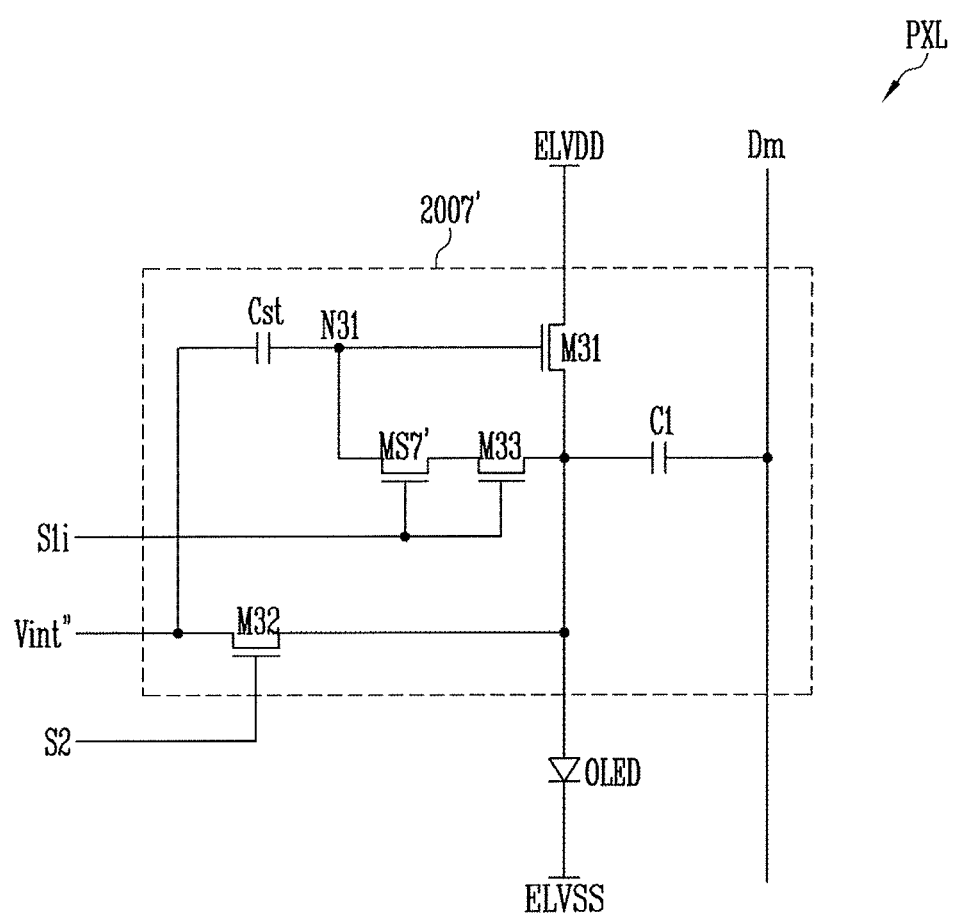

FIGS. 23A and 23B illustrate additional embodiments of a pixel PXL which includes a pixel circuit 2007' and an organic light emitting diode OLED. An anode electrode of the organic light emitting diode OLED is coupled to the pixel circuit 2007', and a cathode electrode of the organic light emitting diode OLED is coupled to the second driving power source ELVSS. The organic light emitting diode OLED generates light with a predetermined luminance corresponding to the amount of current supplied from the pixel circuit 2007'.

The pixel circuit 2007' controls the amount of current flowing from the first driving power source ELVDD to the second driving power source ELVSS via the organic light emitting diode OLED, corresponding to the data signal.

The pixel circuit 2007' includes a seventh stabilizing transistor MS7' located on a current path between the thirty-first node N31 and the second electrode of the thirty-first transistor M31. For example, the seventh stabilizing transistor MS7' may be located between the thirty-third transistor M33 and the second electrode of the thirty-first transistor M31 or between the thirty-first node N31 and the thirty-third transistor M33.

A gate electrode of the seventh stabilizing transistor MS7' is coupled to the ith first scan line S1i. The seventh stabilizing transistor MS7' is turned on when the first scan signal is supplied to the ith first scan line S1i, and turned off when the first scan signal is not supplied. That is, the seventh stabilizing transistor MS7' is turned on or turned off simultaneously with the thirty-third transistor M33.

An operating process of the pixel PXL are described with reference to FIGS. 22, 23A, and 23B. First, during eleventh period T11, the first scan signal is supplied to the ith first scan line S1i, and the second scan signal is supplied to the second scan line S2.

If the second scan signal is supplied to the second scan line S2, the thirty-second transistor M32 is turned on, and accordingly, the voltage of the first power source Vint" is supplied to the anode electrode of the organic light emitting diode OLED.

If the first scan signal is supplied to the ith first scan line S1i, the thirty-third transistor M33 and the seventh stabilizing transistor MS7' are turned on. If the thirty-third transistor M33 and the seventh stabilizing transistor MS7' are turned on, the thirty-first node N31 and the second electrode of the thirty-first transistor M31 are electrically coupled to each other. At this time, the thirty-first node N31 is initialized to the voltage of the first power source Vint".

During the twelfth period T12, the first driving power source ELVDD drops to a low voltage, and simultaneously, the supply of the second scan signal to the second scan line S2 is stopped. If the supply of the second scan signal to the second scan line S2 is stopped, the thirty-second transistor M32 is turned off.

If the first driving power source ELVDD drops to the low voltage, current is supplied from the anode electrode of the organic light emitting diode OLED (i.e., the voltage of the first power source Vint") to the first driving power source ELVDD by the diode-coupled thirty-first transistor M31. Thus, the thirty-first node 31 is finally set to a voltage obtained by adding the threshold voltage of the thirty-first transistor M31 to the low voltage of the first driving power source ELVDD. The storage capacitor Cst stores the voltage of the thirty-first node N31 during the twelfth period T12.

During the thirteenth period T13, the first driving power source ELVDD is set to a high voltage. In addition, the first scan signal is sequentially supplied to the first scan lines S1 during the thirteenth period T13. If the first scan signal is supplied to the ith first scan line S1i, the thirty-third transistor M33 and the seventh stabilizing transistor MS7' are turned on.

If the thirty-third transistor M33 and the seventh stabilizing transistor MS7' are turned on, the voltage of the thirty-first node N31 is changed corresponding to the voltage of the data signal supplied to the data line Dm. That is, the voltage of the thirty-first node N31 is changed corresponding to the voltage of the data signal during the thirteenth period T13. In this case, the voltage corresponding to the threshold voltage of the thirty-first transistor M31 and the data signal is stored in the storage capacitor Cst.

During the fourteenth period T14, the first power source Vint" is set to a high voltage. If the first power source Vint" is set to the high voltage, the voltage of the thirty-first node N31 is increased by coupling of the storage capacitor Cst. At this time, the thirty-first transistor M31 controls the amount of current flowing from the first driving power source ELVDD to the second driving power source ELVSS, via the organic light emitting diode OLED, based on the voltage of the thirty-first node N31.

Meanwhile, the seventh stabilizing transistor MS7' maintains the turn-off state during a period in which the pixel PXL emits light. If the seventh stabilizing transistor MS7' is turned off, leakage current between the thirty-first node N31 and the second electrode of the thirty-first transistor M31 is reduced or minimized during the period in which the pixel PXL emits light. Accordingly, light with a desired luminance can be generated from the pixel PXL.

Figure 24A:
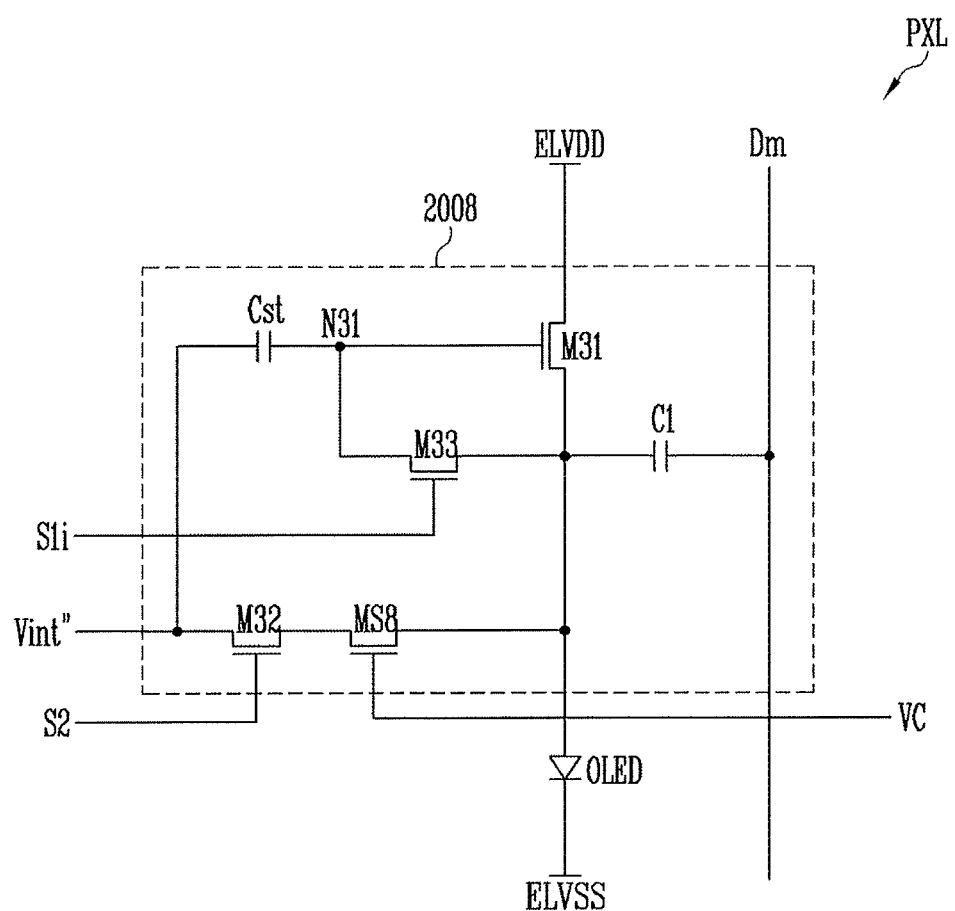
FIGS. 24A and 24B illustrate additional embodiments of a pixel.
Figure 24B:
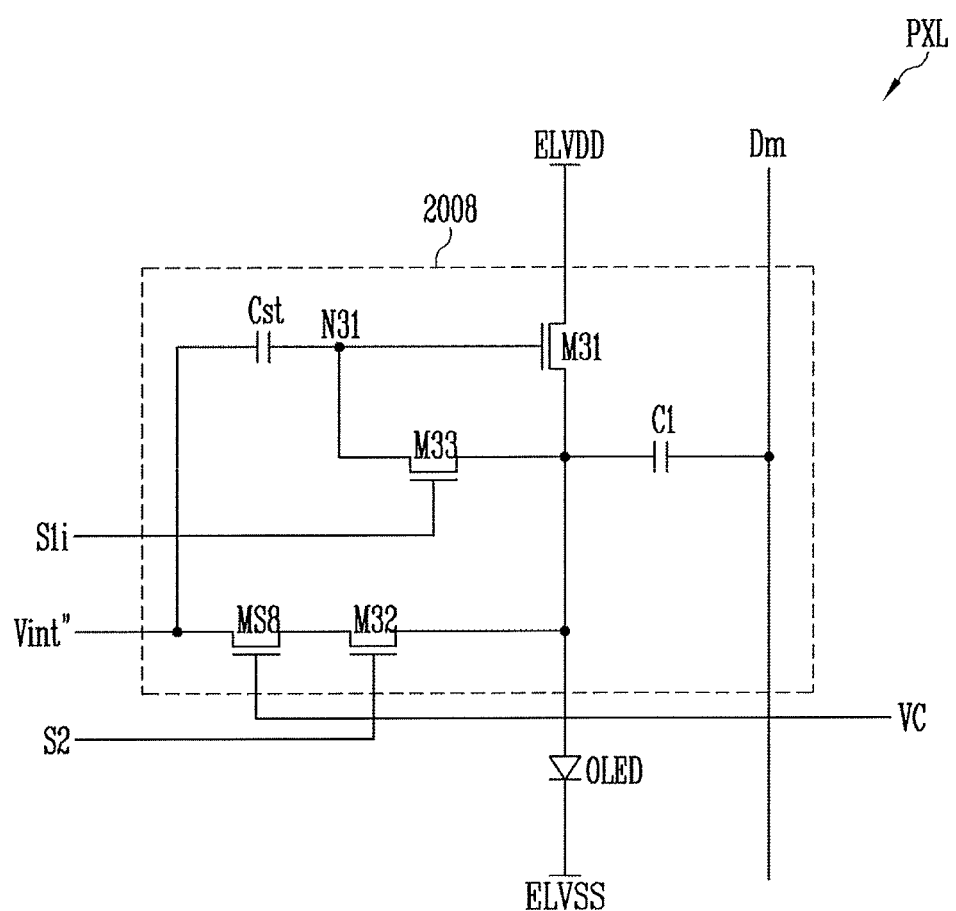

FIGS. 24A and 24B illustrate additional embodiments of a pixel PXL which includes a pixel circuit 2008 and an organic light emitting diode OLED. An anode electrode of the organic light emitting diode OLED is coupled to the pixel circuit 2008, and a cathode electrode of the organic light emitting diode OLED is coupled to the second driving power source ELVSS. The organic light emitting diode OLED generates light with a predetermined luminance corresponding to the amount of current supplied from the pixel circuit 2008.

The pixel circuit 2008 controls the amount of current flowing from the first driving power source ELVDD to the second driving power source ELVSS, via the organic light emitting diode OLED, based on a data signal.

The pixel circuit 2008 includes an eighth stabilizing transistor MS8 on a current path between the first power source Vint" and the anode electrode of the organic light emitting diode OLED. For example, eighth stabilizing transistor MS8 may be between the first power source Vint" and the thirty-second transistor M32 or between the thirty-second transistor M32 and the anode electrode of the organic light emitting diode OLED.

A gate electrode of the eighth stabilizing transistor MS8 is coupled to the control power source VC. The eighth stabilizing transistor MS8 maintains the turn-on state when the organic light emitting display device is driven at the first driving frequency. At this time, an operating process of the pixel PXL is the same as described with reference to FIGS. 21A to 22.

Meanwhile, the eighth stabilizing transistor MS8 is turned off during a period in which the organic light emitting display device is driven at the second driving frequency, i.e., a period in which the organic light emitting display device is driven at a low frequency. At this time, the voltage of the control power source VC is set to the gate-on voltage during a period in which the data signal is supplied to each of the pixels PXL. Thus, the voltage of the data signal is normally supplied to each of the pixels PXL.

After the data signal is supplied to each of the pixels PXL, the voltage of the control power source VC is set to the gate-off voltage. Accordingly, the eighth stabilizing transistor MS8 is turned off. If the eighth stabilizing transistor MS8 is turned off, leakage current between the first power source Vint" and the anode electrode of the organic light emitting diode OLED is reduced or minimized. Thus, an image with a desired luminance can be displayed. In the present embodiment, the eighth stabilizing transistor MS8 is an oxide semiconductor transistor. Thus, leakage current can be reduced or minimized.

Figure 26A:
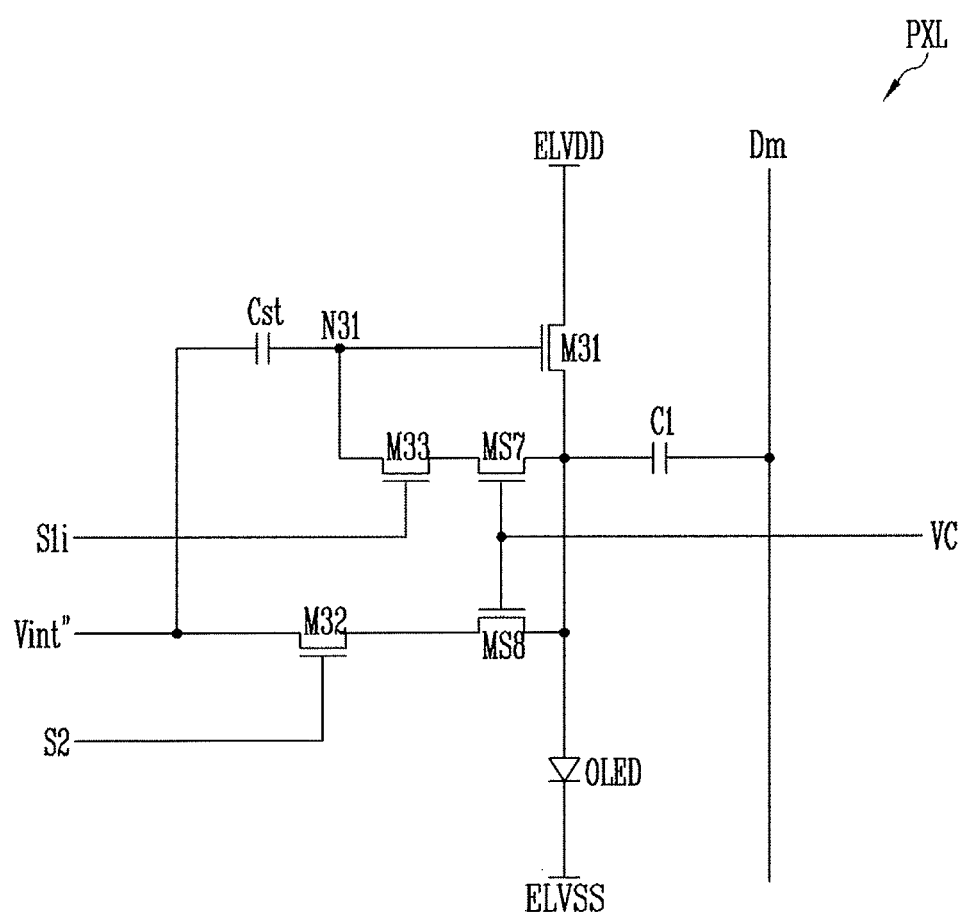
FIGS. 26A to 26D illustrate additional embodiments of a pixel.
Figure 26B:
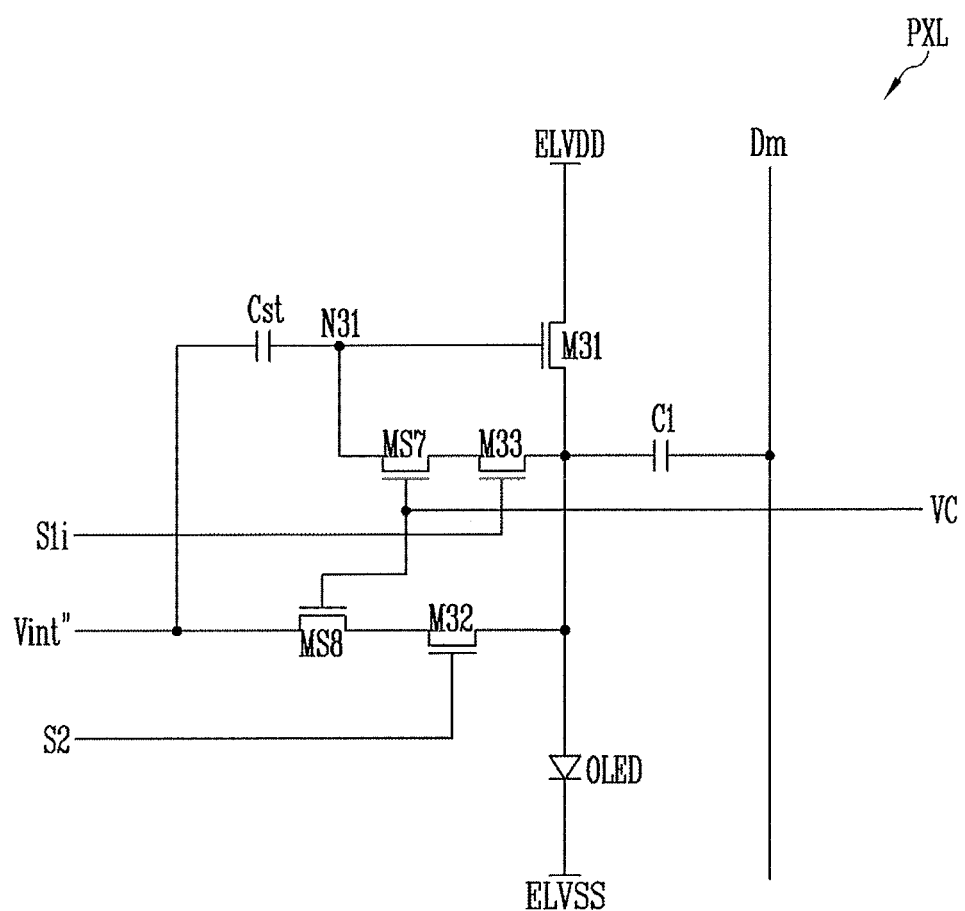

Meanwhile, in FIGS. 24A and 24B, it has been illustrated that the seventh stabilizing transistor SM7 is removed as compared with FIGS. 21A and 21B, but the present disclosure is not limited thereto. For example, as shown in FIGS. 26A and 26B, the seventh stabilizing transistor MS7 and the eighth stabilizing transistor MS8 may be included in the pixel PXL.

Figure 25A:
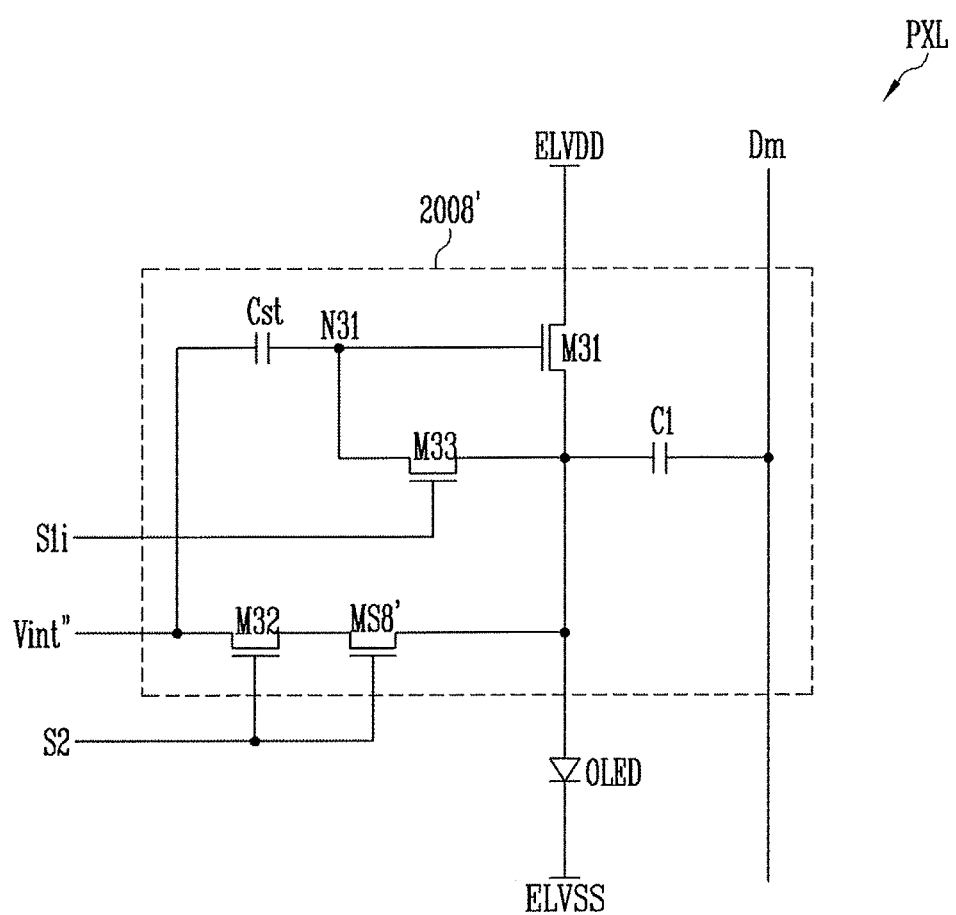
FIGS. 25A and 25B illustrate additional embodiments of a pixel.
Figure 25B:
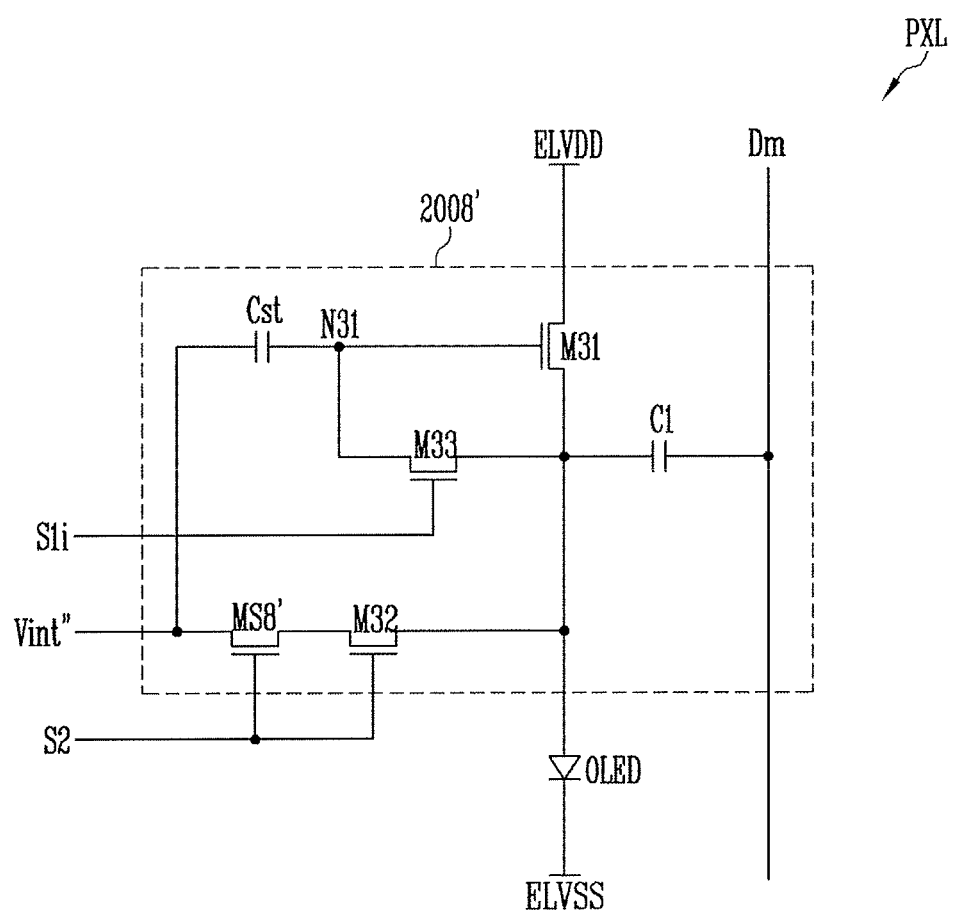

FIGS. 25A and 25B illustrate additional embodiments of a pixel PXL which includes a pixel circuit 2008' and an organic light emitting diode OLED. An anode electrode of the organic light emitting diode OLED is coupled to the pixel circuit 2008', and a cathode electrode of the organic light emitting diode OLED is coupled to the second driving power source ELVSS. The organic light emitting diode OLED generates light with a predetermined luminance corresponding to the amount of current supplied from the pixel circuit 2008'.

The pixel circuit 2008' includes an eighth stabilizing transistor MS8' on a current path between the first power source Vint" and the anode electrode of the organic light emitting diode OLED. For example, the eighth stabilizing transistor MS8' may be located between the first power source Vint" and the thirty-second transistor M32 or between the thirty-second transistor M32 and the anode electrode of the organic light emitting diode OLED.

A gate electrode of the eighth stabilizing transistor MS8' is coupled to the second scan line S2. The eighth stabilizing transistor MS8' is turned on when the second scan signal is supplied to the second scan line S2, and turned off when the second scan signal is not supplied. An operating process of the pixel PXL may be the same as described with reference to FIGS. 22, 23A, and 23B.

If the eighth stabilizing transistor MS8' is turned off, leakage current between the first power source Vint" and the anode electrode of the organic light emitting diode OLED is reduced or minimized. Thus, an image with a desired luminance can be displayed. In the present embodiment, the eighth stabilizing transistor MS8' is an oxide semiconductor transistor. Thus, leakage current can be reduced or minimized.

Figure 26C:
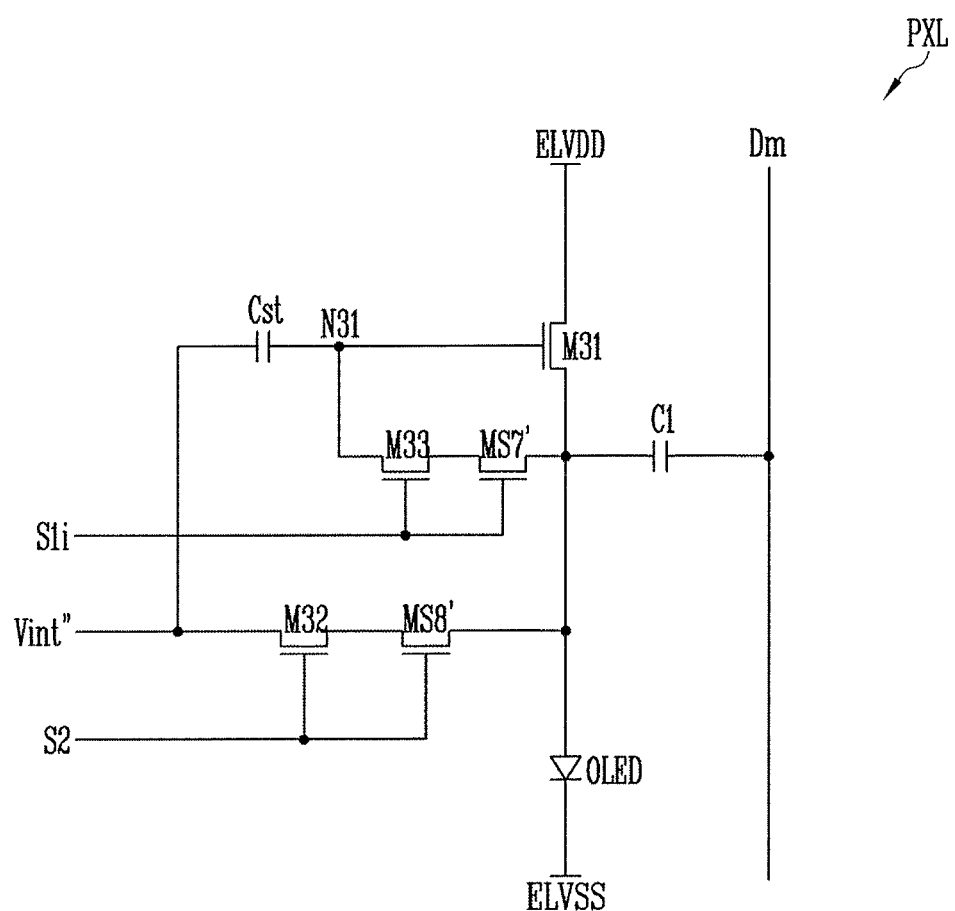
Figure 26D:
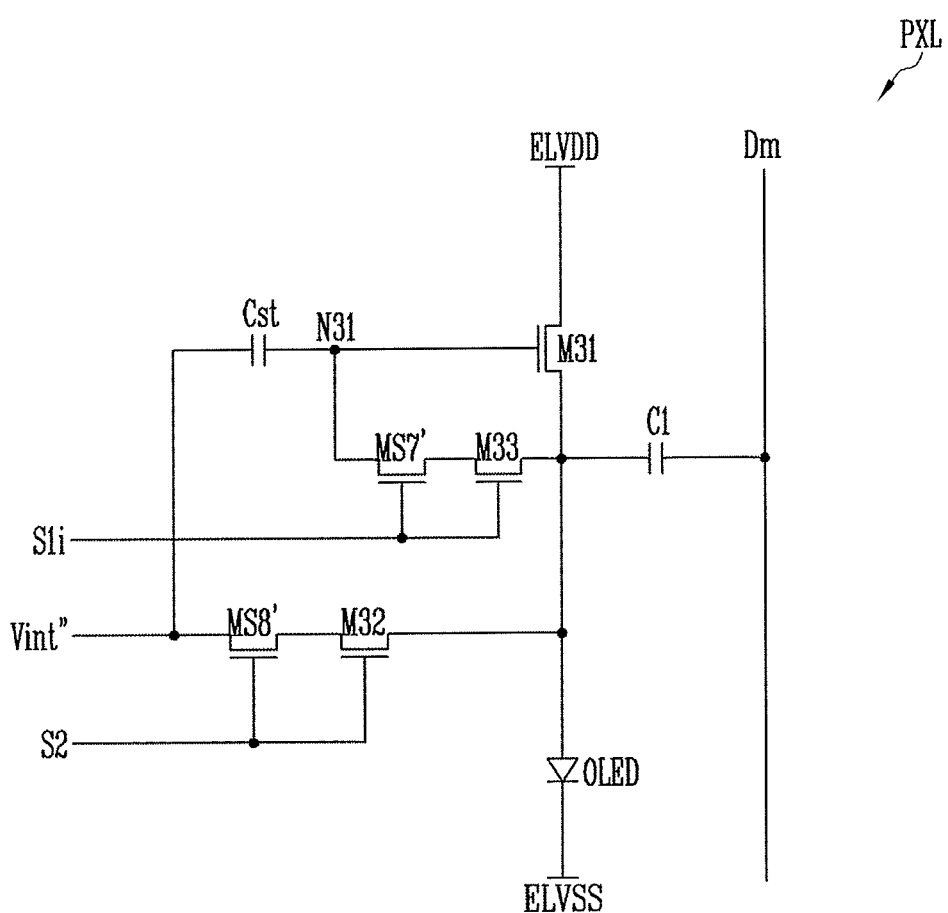

Meanwhile, in FIGS. 25A and 25B, it has been illustrated that the seventh stabilizing transistor MS7' is removed as compared with FIGS. 23A and 23B, but the present disclosure is not limited thereto. For example, as shown in FIGS. 26C and 26D, the seventh stabilizing transistor MS7' and the eighth stabilizing transistor MS8' may be included in the pixel PXL.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, con-troller, or other signal processing device into a special-purpose processor for performing the methods described herein.

The drivers, controllers, processors, and other signal generating and signal processing features of the disclosed embodiments may be implemented in logic which, for example, may include hardware, software, or both. When implemented at least partially in hardware, the drivers, controllers, processors, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the drivers, controllers, processors, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, a pixel and organic light emitting display device is provided where at least one transistor on a leakage current path is an oxide semiconductor transistor. Accordingly, an image with a desired luminance can be displayed by reducing or minimizing leakage current.

In accordance with one or more of the aforementioned embodiments, at least one transistor is provided on a leakage current path, where the at least one transistor is turned off during at least a partial period in low-frequency driving and is maintained in a turn-on state in other cases. Thus, leakage current can be reduced or minimized in the low-frequency driving, and an image with a desired luminance can be displayed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:
1. A pixel, comprising:
    a light emitting diode;
    a first transistor to control an amount of current flowing from a first driving power source to a second driving power source, via the light emitting diode, based on a voltage of a first node;

a first stabilizing transistor coupled between a first electrode of the first transistor and the first node;
a storage capacitor coupled between the first node and an anode of the light emitting diode, the storage capacitor being indirectly coupled to the first driving power source; and
a second transistor coupled between a data line and a second node, wherein
the first transistor and the second transistor are N-type poly-silicon semiconductor transistors,
the first stabilizing transistor is an N-type oxide semiconductor transistor, and
a gate electrode of the first stabilizing transistor and a gate electrode of the second transistor are connected to different lines.

2. The pixel of claim 1, wherein
the first stabilizing transistor is turned on when a control power source is set to a gate-on voltage, and
the second transistor is turned on when a scan signal is supplied to a scan line.

3. The pixel of claim 1, further comprising:
a third transistor coupled between the second node and the anode of the light emitting diode,
wherein the third transistor is turned off when a first light emitting control signal is supplied to a first light emitting control line.

4. The pixel of claim 3, further comprising:
a sixth transistor coupled between the first driving power source and the first electrode of the first transistor,
wherein the sixth transistor is turned off when a second light emitting control signal is supplied to a second light emitting control line.

5. The pixel of claim 4, further comprising:
a fifth transistor coupled between a first power source and the anode of the light emitting diode.

6. The pixel of claim 5, further comprising:
a fourth transistor coupled between the first stabilizing transistor and the first electrode of the first transistor.

7. The pixel of claim 6, wherein
the fourth transistor is turned on when a scan signal is supplied to a scan line, and
the fifth transistor is turned on when the scan signal is supplied to the scan line.

8. The pixel of claim 7, wherein the scan signal is supplied after the first light emitting control signal is supplied.

9. The pixel of claim 8, wherein the second light emitting control signal is supplied after the scan signal is supplied.

10. The pixel of claim 6, further comprising:
a second stabilizing transistor coupled between the data line and the second transistor.

11. The pixel of claim 10, wherein
the third, the fourth, the fifth, and the sixth transistors are N-type poly-silicon semiconductor transistors, and
the second stabilizing transistor is an N-type oxide semiconductor transistor.

12. The pixel of claim 11, wherein the second stabilizing transistor is turned on when a control power source is set to a gate-on voltage.

13. The pixel of claim 1, wherein the storage capacitor is indirectly coupled to the second driving power source.

14. The pixel of claim 1, wherein each electrode of the storage capacitor is a node different from the first driving power source.

15. The pixel of claim 1, wherein the storage capacitor is directly electrically connected to the second node.

16. The pixel of claim 15, wherein the storage capacitor is directly electrically connected to the first node.

17. A pixel, comprising:
a light emitting diode;
a first transistor to control an amount of current flowing from a first driving power source to a second driving power source, via the light emitting diode, based on a voltage of a first node;
a first stabilizing transistor coupled between a first electrode of the first transistor and the first node;
a storage capacitor coupled between the first node and an anode of the light emitting diode;
a second transistor coupled between a data line and a second node;
a third transistor coupled between the second node and the anode of the light emitting diode; and
a sixth transistor coupled between the first driving power source and the first electrode of the first
transistor,
wherein the first transistor and the second transistor are N-type poly-silicon semiconductor transistors
and the first stabilizing transistor is an N-type oxide semiconductor transistor,
wherein the third transistor is turned off when a first light emitting control signal is supplied to a first light emitting control line,
wherein the sixth transistor is turned off when a second light emitting control signal is supplied to a
second light emitting control line, and
wherein the first light emitting control signal and the second light emitting control signal are supplied
during different periods.

18. The pixel of claim 17, wherein the second light emitting control signal is supplied after the first light emitting control signal is supplied.

* * * * *